(12) United States Patent
Yamazaki et al.

(10) Patent No.: US 7,229,862 B2
(45) Date of Patent: Jun. 12, 2007

(54) METHOD FOR MANUFACTURING SEMICONDUCTOR DEVICE

(75) Inventors: Shunpei Yamazaki, Setagaya (JP); Keitaro Imai, Yokohama (JP); Shinji Maekawa, Atsugi (JP); Makoto Furuno, Atsugi (JP); Osamu Nakamura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 231 days.

(21) Appl. No.: 10/885,636

(22) Filed: Jul. 8, 2004

(65) Prior Publication Data

US 2005/0014319 A1 Jan. 20, 2005

(30) Foreign Application Priority Data

Jul. 18, 2003 (JP) ............................. 2003-277144
Oct. 21, 2003 (JP) ............................. 2003-361289

(51) Int. Cl.
*H01L 21/84* (2006.01)
(52) U.S. Cl. ...................................... 438/151; 438/159
(58) Field of Classification Search ................ 438/151, 438/158, 161, 164
See application file for complete search history.

(56) References Cited

U.S. PATENT DOCUMENTS

| | | | |
|---|---|---|---|
| 4,409,134 A | 10/1983 | Yamazaki | |
| 5,262,654 A | 11/1993 | Yamazaki | |
| 5,462,885 A | 10/1995 | Nasu et al. | |
| 5,496,752 A | 3/1996 | Nasu et al. | |
| 5,825,050 A | 10/1998 | Hirakawa | |
| 5,962,896 A | 10/1999 | Yabuta et al. | |

(Continued)

FOREIGN PATENT DOCUMENTS

JP 3065528 5/2000

(Continued)

OTHER PUBLICATIONS

Tetsuya Shimoda, "39.1: Invited Paper: Ink-jet Technology for Fabrication Processes of Flat Panel Displays," SID 03 DIGEST, pp. 1178-1181, 2003.

(Continued)

*Primary Examiner*—Tuan H. Nguyen
(74) *Attorney, Agent, or Firm*—Eric J. Robinson; Robinson Intellectual Property Law Office, P.C.

(57) ABSTRACT

An object of the present invention is to provide a method for manufacturing a semiconductor device of which manufacturing process is simplified by improving usage rate of a material. A method for manufacturing a semiconductor device of the invention comprises the steps of: forming gate electrodes with a droplet discharge method on a substrate having an insulating surface; laminating gate insulating layers, semiconductor layers, and a semiconductor layer containing one-conductivity type impurity over the gate electrodes; forming first conductive layers serving as masks with a droplet discharge method in a position overlapping the gate electrodes, etching the semiconductor layer and the semiconductor layer containing one-conductivity type impurity with the first conductive layers, forming a second conductive layer serving as a source wiring or a drain wiring with a droplet discharge method over the first conductive layers; and etching the first conductive layers and the semiconductor layer containing one-conductivity type impurity, using the second conductive layers as masks.

32 Claims, 31 Drawing Sheets

U.S. PATENT DOCUMENTS

| | | | |
|---|---|---|---|
| 6,013,930 | A | 1/2000 | Yamazaki et al. |
| 6,121,660 | A | 9/2000 | Yamazaki et al. |
| 6,197,624 | B1 | 3/2001 | Yamazaki |
| 6,218,219 | B1 | 4/2001 | Yamazaki et al. |
| 6,355,941 | B1 | 3/2002 | Yamazaki et al. |
| 6,387,737 | B1 | 5/2002 | Yamazaki et al. |
| 6,445,428 | B1 | 9/2002 | Fujikawa et al. |
| 6,518,108 | B2 | 2/2003 | Fukui et al. |
| 6,528,357 | B2 | 3/2003 | Dojo et al. |
| 6,864,133 | B2 * | 3/2005 | Aoki et al. ............... 438/197 |
| 6,894,311 | B2 | 5/2005 | Maeda et al. |
| 6,919,158 | B2 * | 7/2005 | Kawamura et al. ...... 430/270.1 |
| 2002/0079501 | A1 | 6/2002 | Okada et al. |
| 2002/0167026 | A1 | 11/2002 | Azami et al. |
| 2004/0147113 | A1 * | 7/2004 | Yamazaki et al. ......... 438/660 |
| 2004/0171200 | A1 | 9/2004 | Maeda et al. |
| 2004/0224433 | A1 | 11/2004 | Yamazaki et al. |
| 2005/0012097 | A1 | 1/2005 | Yamazaki |
| 2005/0014319 | A1 | 1/2005 | Yamazaki et al. |
| 2005/0179036 | A1 | 8/2005 | Yamazaki et al. |

FOREIGN PATENT DOCUMENTS

JP     2002-335153     11/2002

OTHER PUBLICATIONS

S. Kasouit et al., *Microcrystalline Silicon: An Emerging Material for AMLCD*, AM-LCD, Digest of Technical Papers, Jan. 1, 2003, pp. 111-114.

* cited by examiner

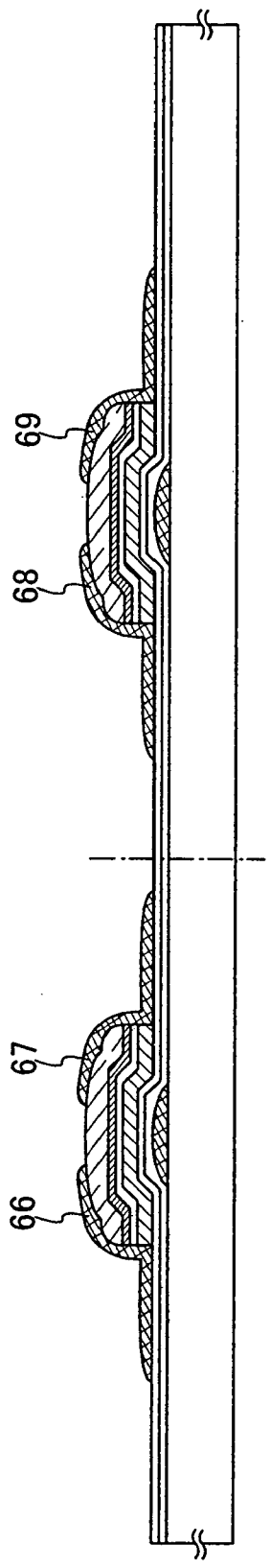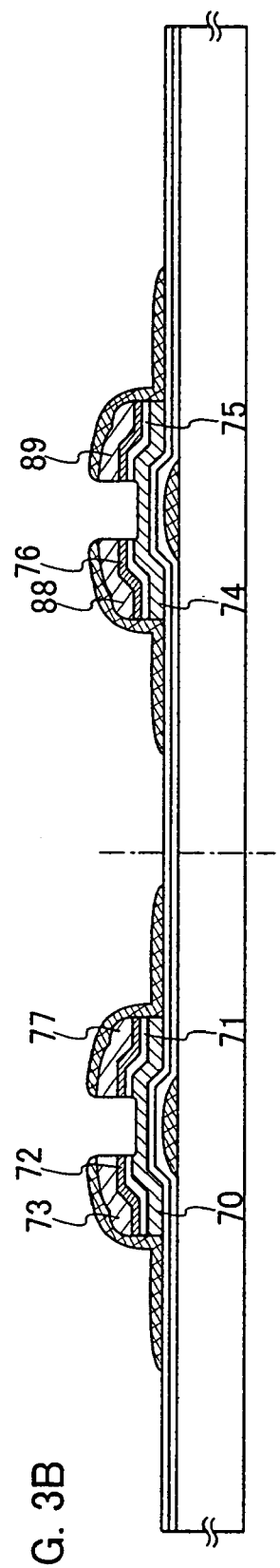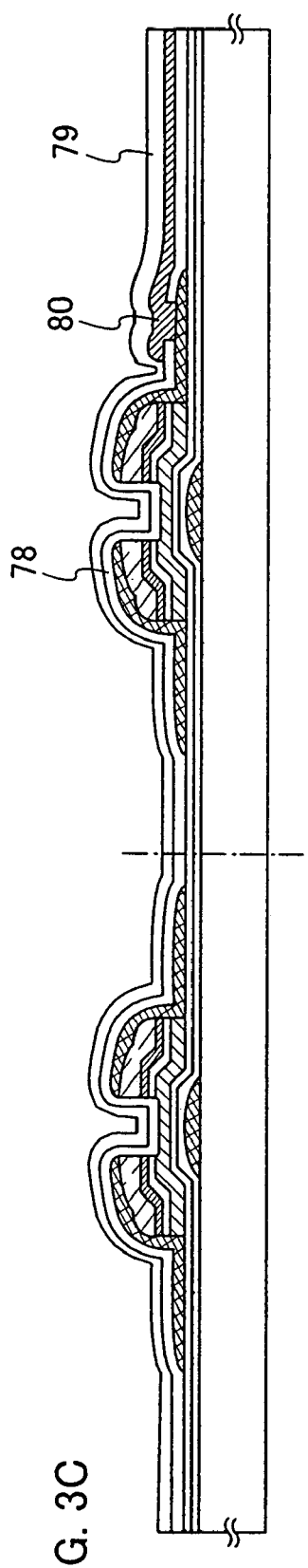

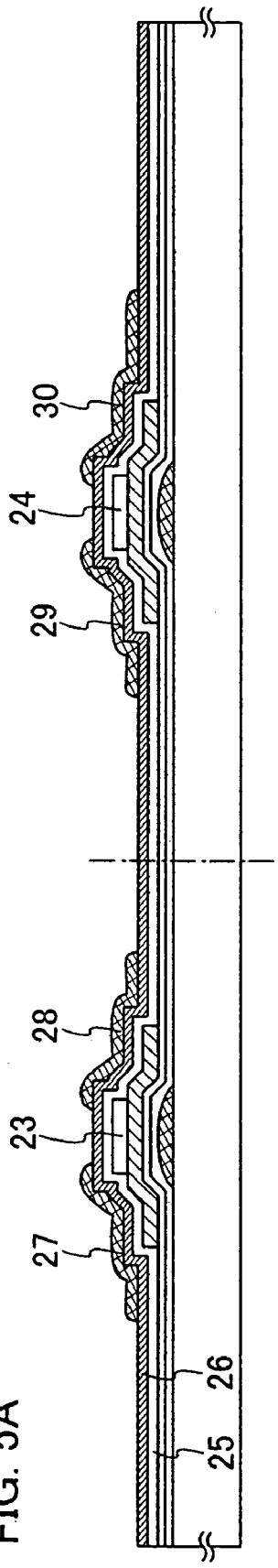
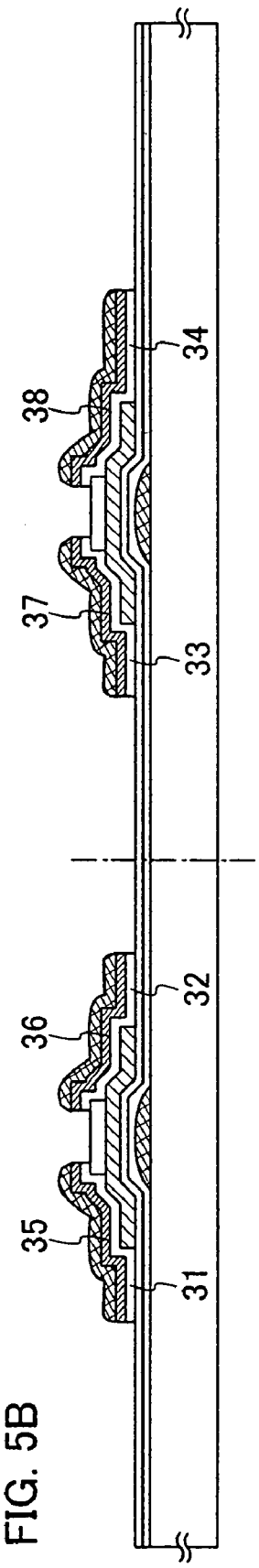
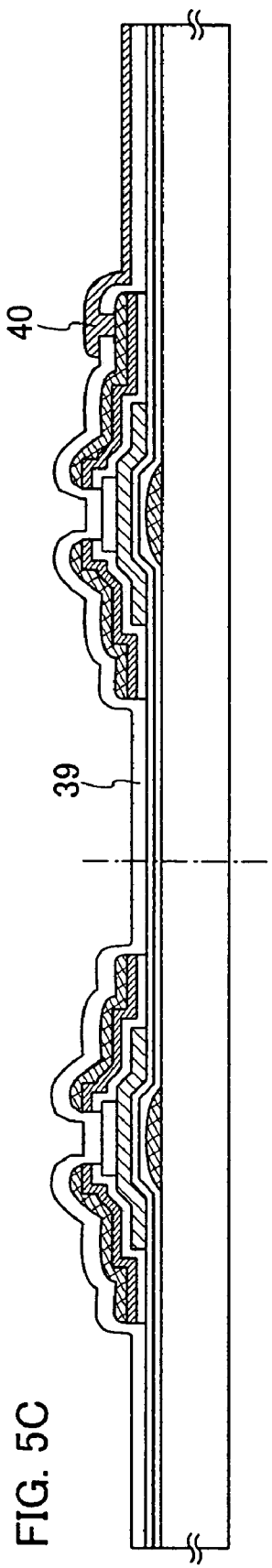

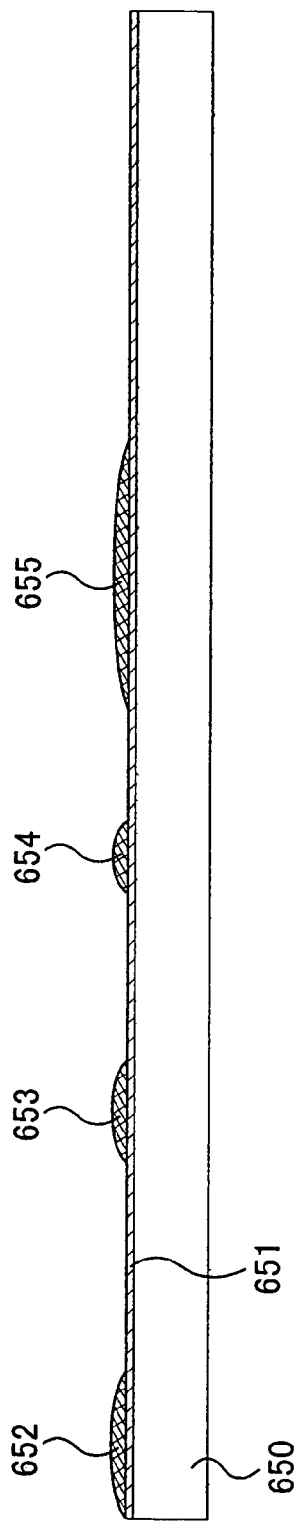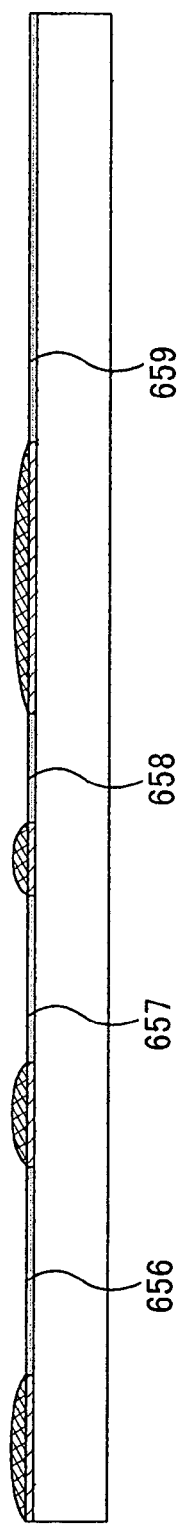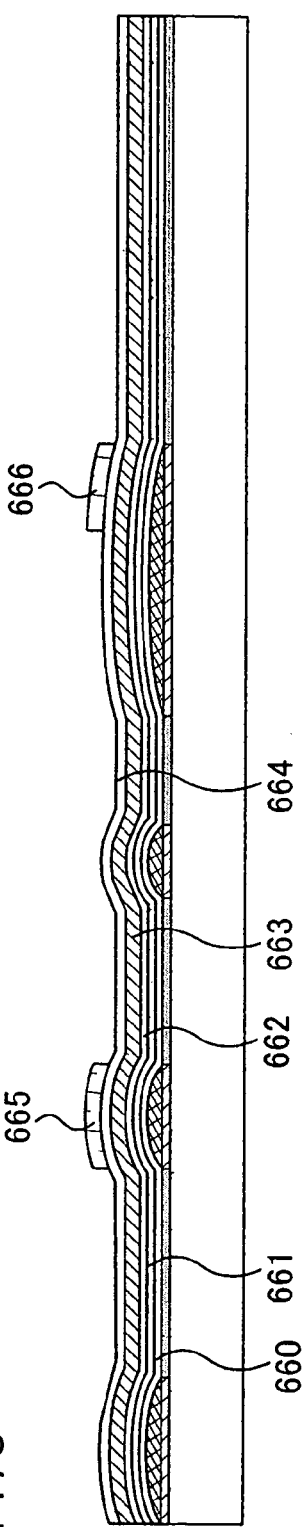

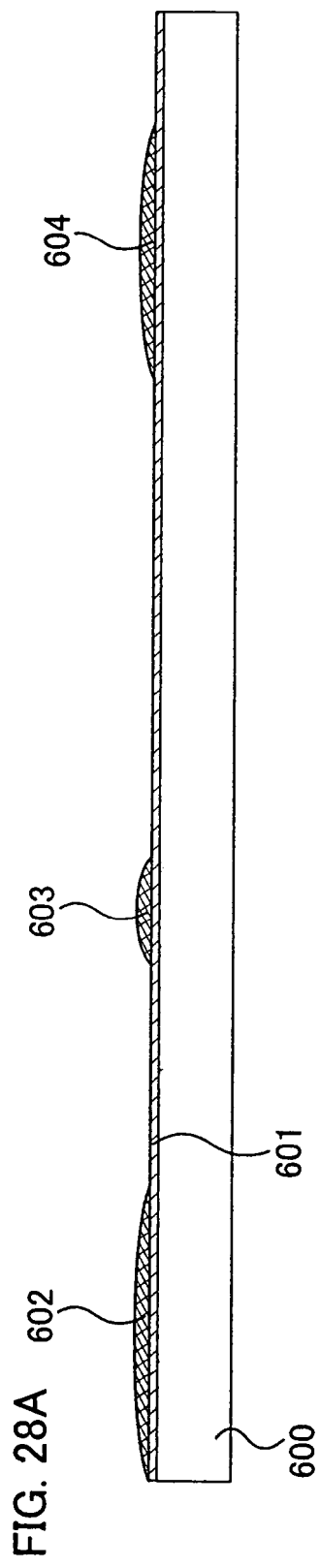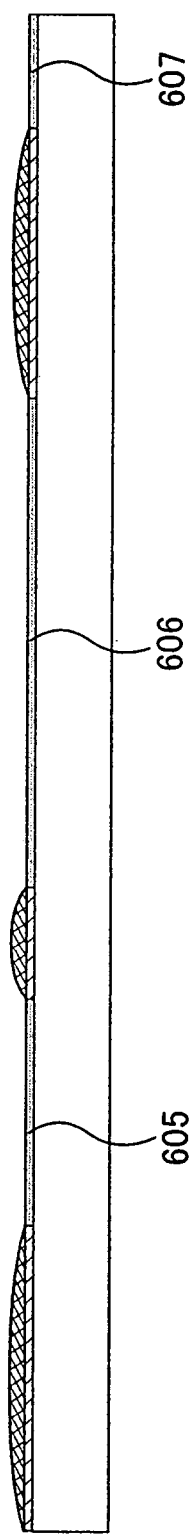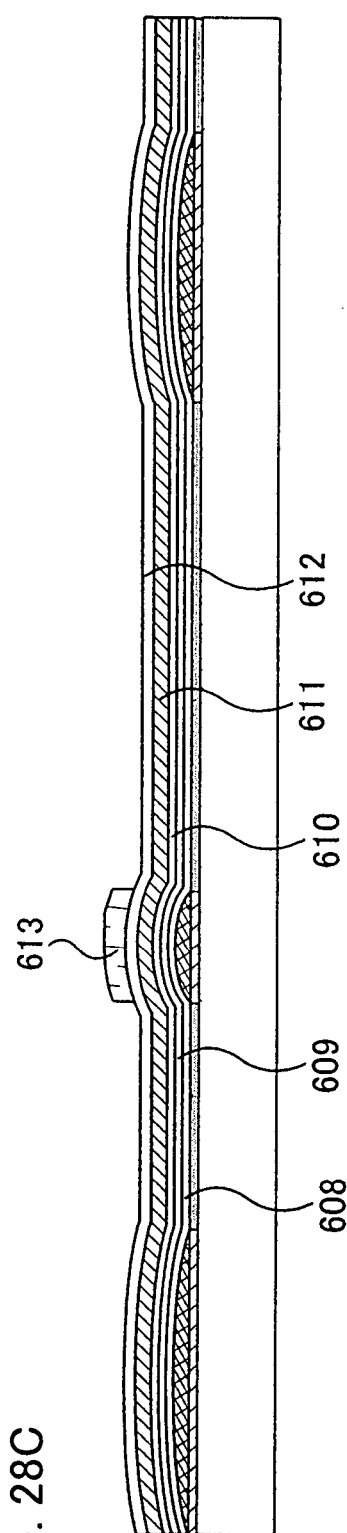

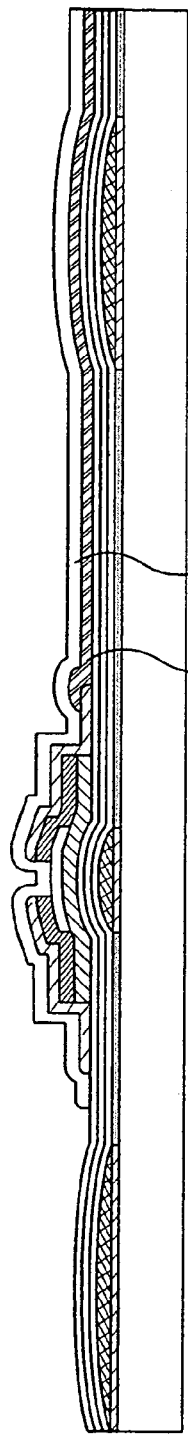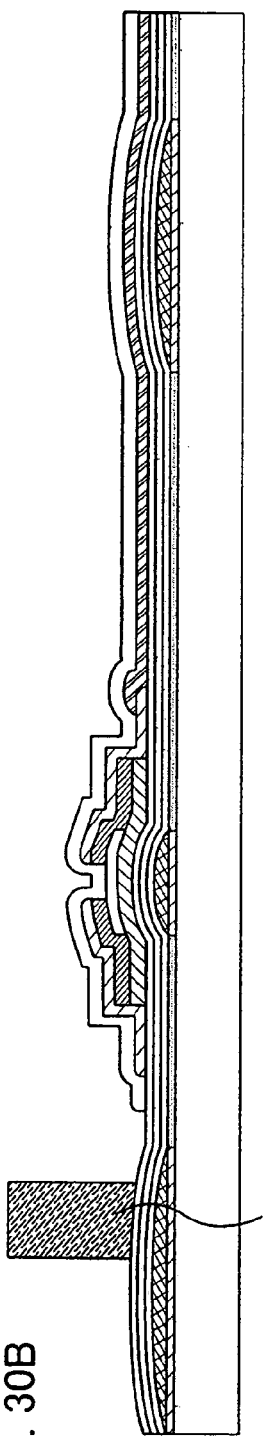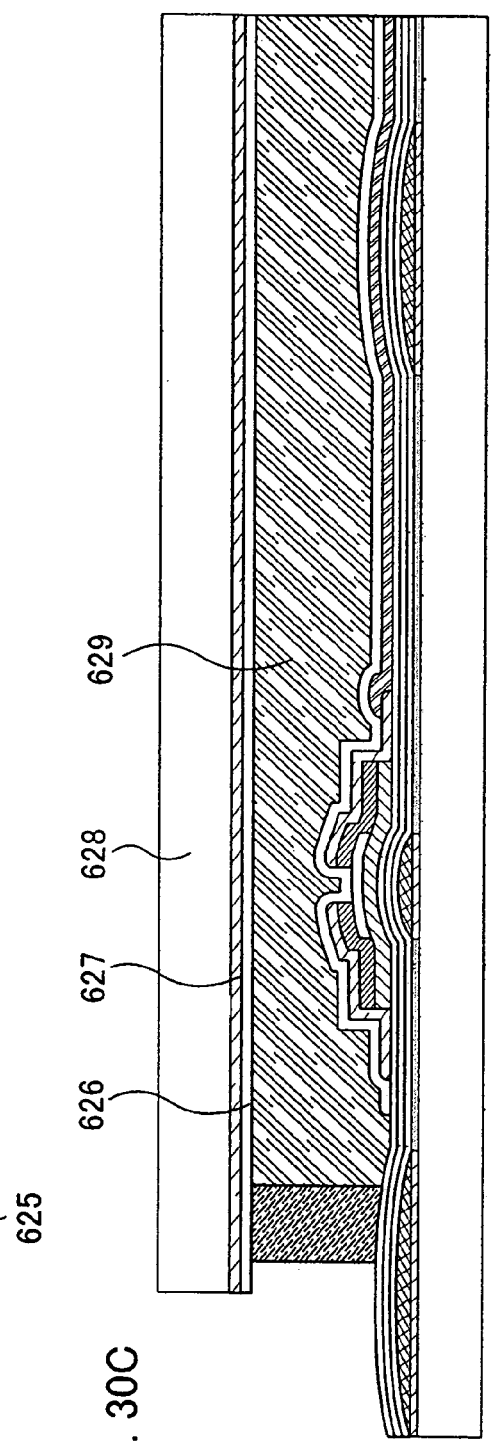
FIG. 30A
FIG. 30B
FIG. 30C

METHOD FOR MANUFACTURING SEMICONDUCTOR DEVICE

BACKGROUND OF THE INVENTION

1. Field of the Invention

The present invention relates to a method for manufacturing a thin film transistor with the use of a droplet discharge method, and to a method for manufacturing a display device equipped with the thin film transistor.

The invention relates to a method for manufacturing a semiconductor device with the use of a droplet discharge method.

2. Description of the Related Art

In recent years, pattern formation by a droplet discharge method (ink-jet printing) is applied to a field of a flat panel display, of which development is actively carried out. The droplet discharge method has a lot of advantages that a mask is unnecessary due to direct drawing, of applicability to a large-scaled substrate, of high a usage rate of materials, and the like; therefore, the droplet discharge method is applied for manufacturing an EL layer or a color filter, an electrode of a plasma display, and the like.

[Non-Patent Document 1]
T. Shimoda, Ink-jet Technology for Fabrication Processes of Flat Panel Displays, SID 03 DIGEST, pp. 1178–1181

In addition, a photolithography step is used in a general semiconductor process; however, when the photolithography step is used, a usage rate of a material is low, and furthermore, the step is complicated.

SUMMARY OF THE INVENTION

In view of the above problem, an object of the present invention is to provide a method for manufacturing a semiconductor device of which manufacturing process is simplified by improving a usage rate of a material, and a method for manufacturing a semiconductor device with which saving of manufacturing time and reduction of a manufacturing cost are realized.

The invention provides a method for manufacturing a thin film transistor using a semi-amorphous semiconductor (hereinafter referred to as SAS) in which a crystal grain exists as dispersed in an amorphous semiconductor. The transistor that used a SAS has electron field-effect mobility of 2 to 10 cm$^2$/V·sec which is 2 to 20 times compared to that of a transistor using an amorphous semiconductor. Therefore, a part or a whole of a driver circuit can be formed integrally over same substarate as a pixel portion. In other words, the invention can provide a method for manufacturing of a display device that realizes a system-on-panel.

A SAS is a semiconductor with an intermediate structure between an amorphous and a crystal structure (including single crystal and polycrystal). This is a semiconductor having a third condition that is stable as a case of a free energy and crystalline semiconductor having a short distance order and lattice distortion, of which grain size is set at 0.5 to 20 nm, and can exist by being dispersed in a non-single crystalline semiconductor. In addition, 1 atomic % or more of hydrogen or halogen is contained as a neutralizer of a dangling bond. Furthermore, a rare gas element such as helium, argon, krypton, and neon is contained to promote further lattice distortion, so that a favorable SAS can be obtained by increasing the stability. Such description regarding a SAS is disclosed in, for example, Patent Publication No. 3065528.

In addition, a SAS shows low electrical conductivity of n-type when an impurity element to control a valence electron is not doped intentionally. This due to an impurity contained in a SAS, and it is typically considered that oxygen imparts n-type conductivity. Oxygen contained in a SAS varies also according to high-frequency power density during film formation. In the invention, it is preferable that an oxygen concentration in a SAS is set at 5×10$^{19}$ atoms/cm$^3$ or less, preferably 1×10$^{19}$ atoms/cm$^2$ or less. Of course, not all of the oxygen serves as a donor; therefore, in order to control a conductivity type, an impurity element of which amount corresponds thereto is to be added.

Here, an impurity element imparting p-type conductivity is doped simultaneously to a SAS in which a channel formation region of a transistor is provided with this formation or after the formation, which enables controlling a threshold value. Boron is typically used as an impurity element imparting p-type conductivity, and an impurity gas such as B$_2$H$_6$ and BF$_3$ may be mixed with silicide gas at the rate of 1 ppm to 1000 ppm. Then, a boron concentration may be set at 1×10$^{14}$ to 6×10$^{16}$ atoms/cm$^3$.

The above SAS differs from a polycrystalline semiconductor, which can be formed directly on a substrate as a SAS. Specifically, the SAS can be formed using plasma CVD by diluting SiH$_4$ with H$_2$ in flow rate of 2 to 1000 times, preferably in flow rate of 10 to 100 times. The SAS that is manufactured using the above method also includes a microcrystal semiconductor containing a crystal grain of 0.5 nm to 20 nm in an amorphous semiconductor. Therefore, there is no necessity to provide a crystallization step after forming a semiconductor, which differs from the case where a polycrystalline semiconductor is used. In addition, although there is a limitation on a length of a major axis of a laser beam in the case of crystallization using laser light, there is no limitation on a size of a substrate in the case of SAS. In other words, it is possible to manufacture easily the SAS over a substrate in which one side of so-called 5 generations is a meter angle. In addition, the number of steps of manufacturing a transistor can be reduced, which alternatively can increase a yield rate of a display device and can control the cost. In the invention, a SAS may be at least used for a channel formation region. In addition, all parts in a direction of the film thickness of a channel formation region does not need to be a semi-amorphous semiconductor, but a semi-amorphous semiconductor may be included at least in a part thereof.

In the invention, a droplet discharge method (for example, ink-jet printing) is used, thereby forming a pattern by selectively discharging a composition in manufacturing a thin film transistor. Then, the droplet discharge method is used, thereby patterning a semiconductor layer or the like is conducted by using a pattern drawn only in a desired region.

A method for manufacturing a semiconductor device comprising: forming a gate electrode with a droplet discharge method on a substrate having an insulating surface; laminating a gate insulating layer, a first semiconductor layer, and a second semiconductor layer containing one-conductivity type impurity over the gate electrode; forming a first conductive layer serving as a mask with the droplet discharge method in a position overlapping the gate electrode; etching the first semiconductor layer and the second semiconductor layer containing one-conductivity type impurity by using the first conductive layer; forming a second conductive layer serving as a source wiring or a drain wiring with the droplet discharge method over the first conductive layer; and etching the first conductive layer and the second semiconductor layer containing one-conductivity type impurity by using the second conductive layer as mask. This method for manufacturing a thin film transistor is described in detail in Embodiment 1.

A method for manufacturing a semiconductor device comprising: forming a gate electrode with a droplet discharge method on a substrate having an insulating surface; laminating a gate insulating layer and a first semiconductor layer over the gate electrode; forming a first mask with the droplet discharge method in a position overlapping the gate electrode; forming a second semiconductor layer by etching the first semiconductor layer by using the first mask; forming an insulating layer over the second semiconductor layer; forming a second mask with the droplet discharge method over the insulating layer; forming a channel protective layer by etching the insulating layer by using the second mask; forming a third semiconductor layer containing one-conductivity type impurity on the second semiconductor layer; forming a conductive layer serving as a source wiring or a drain wiring with the droplet discharge method over the third semiconductor layer containing one-conductivity type impurity; and etching the third semiconductor layer containing one-conductivity type impurity by using the conductive layer as a mask. This method for manufacturing a thin film transistor is described in detail in Embodiment 2.

In the invention, a pattern formed by a droplet discharge method is used without any change for the second pattern that serves as a channel protective film. However, a thin film made of an insulating material is formed over an entire surface, and then the pattern formed by a droplet discharge method is used as a mask to pattern the thin film so that the second pattern may be used as a channel protective film.

According to the invention, a pixel region where a plurality of first semiconductor elements are formed over a first substrate, or the pixel region and a scanning line driver circuit are formed over the first substrate, and a liquid crystal layer or an electroluminescent layer is sandwiched between the first substrate and a second substrate and the first and second substrates are bonded together. Next, a driver circuit where a plurality of second semiconductor elements and a plurality of driver ICs including an input terminal and an output terminal that connect to the driver circuit are formed over a third substrate. Then, the plurality of driver ICs are divided separately, and the driver ICs are bonded in a periphery of the pixel region formed on the first substrate only as a signal line driver circuit, or as a signal line driver circuit and a scanning line driver circuit to manufacture a display device. In the invention, a semi-amorphous semiconductor layer is formed as a channel region of the first semiconductor element, and a conductive layer composing the first semiconductor element is formed by selectively discharging a composition containing a conductive material. This method for manufacturing a thin film transistor is described in detail in Embodiment 3.

It is preferable that these driver ICs mounted on the first substrate are formed of a crystalline semiconductor layer. The crystalline semiconductor layer is preferable to be formed by being irradiated with continuous-wave laser. Therefore, a solid state laser or a gas laser of continuous-wave laser is used as an oscillator in which the laser light is generated. There is few crystal defects when a continuous-wave laser is used, which is as a result that a transistor can be manufactured by using a polycrystalline semiconductor layer with a large grain size. Furthermore, since mobility and a response speed are favorable, a high-speed drive is possible, which makes possible to further improve an operating frequency of an element than conventional, so that high reliability can be obtained since there is few properties variations. In addition, a channel-length direction of a transistor and a scanning direction of laser light may be accorded with each other to further improve a frequency in an operation.

The invention provides a method for manufacturing a semiconductor device using an amorphous semiconductor layer (amorphous silicon, a-Si). An amorphous semiconductor layer is manufactured by a known method such as plasma CVD or sputtering.

A method for manufacturing a semiconductor device comprising: forming a gate electrode with a droplet discharge method on a substrate having an insulating surface; laminating a gate insulating layer, a first semiconductor layer, and a second semiconductor layer containing one-conductivity type impurity over the gate electrode; forming a mask with the droplet discharge method in a position overlapping the gate electrode; forming a third semiconductor layer and a fourth semiconductor layer containing one-conductivity type impurity by etching the first semiconductor layer and the second semiconductor layer containing one-conductivity type impurity by using the mask; forming a conductive layer serving as a source wiring or a drain wiring with the droplet discharge method over the fourth semiconductor layer containing one-conductivity type impurity; and etching the fourth semiconductor layer containing one-conductivity type impurity by using the conductive layer as a mask.

A method for manufacturing a semiconductor device comprising: forming a gate electrode with a droplet discharge method on a substrate having an insulating surface; laminating a gate insulating layer, a first semiconductor layer, and an insulating layer; forming a first mask with the droplet discharge method in a position overlapping with the gate electrode; forming a channel protective layer by etching the insulating layer with the first mask; forming a second semiconductor layer containing one-conductivity type impurity over the first semiconductor layer; forming a second mask with the droplet discharge method in a position overlapping with the channel protective layer; forming a third semiconductor layer containing one-conductivity type impurity by etching the second semiconductor layer containing one-conductivity type impurity by using the second mask; forming a conductive layer serving as a source wiring or a drain wiring with the droplet discharge method over the third semiconductor layer containing one-conductivity type impurity; and etching the third semiconductor layer containing one-conductivity type impurity by using the conductive layer as a mask.

According to the invention, step of laminating a gate insulating layer, the semiconductor layer, and the insulating layer over the gate electrode is carried out continuously without exposing to atmosphere. In the invention, the gate insulating film is sequentially laminated with a first silicon nitride film, a silicon oxide film, and a second silicon nitride film.

The semiconductor device includes a semiconductor layer formed over a substrate, a TFT substrate in which a thin film transistor using the semiconductor layer is formed, a liquid crystal panel substrate or a liquid crystal module substrate in which a thin film transistor and a liquid crystal are formed over a substrate, a substrate for an EL (Electroluminescent) panel or a substrate for an EL module in which a thin film transistor and a light-emitting element are formed over a substrate, a liquid crystal panel in which a thin film transistor and a liquid crystal over a substrate are sealed with a sealant, and an EL panel in which a thin film transistor and a light-emitting element over a substrate are sealed with a sealant, as well as including a module attached with a FPC and the like to such panels, a module connected with a driver IC at the end of a FPC and the like, a module in which a driver IC is mounted on a panel with a COG method and the like.

The invention can provide a method for manufacturing a thin film transistor and a display device having electron field-effect mobility of 2 to 10 cm$^2$/V·sec which is improved than a transistor using an amorphous semiconductor by composing a channel formation region with a semi-amorphous semiconductor. Therefore, it becomes possible to simplify a step of crystallization and to use this transistor as a switching element of a pixel, and further to use not only as a switching element of a pixel but also as an element that forms a scanning line (gate line) driver circuit. Consequently, a display device that realizes a system-on-panel can be manufactured. In addition, in the invention, it becomes possible to form a thin film transistor without using a resist mask at all or just with a few by using a droplet discharge method. Therefore, steps such as applying a resist, baking a resist, light exposure, developing, baking after developing, or peeling of a resist can be eliminated, so that great decrease of cost or increase of reliability due to simplification of the steps can be realized.

The invention having the above structure makes possible to provide a method for manufacturing a thin film transistor and a display device, which simplifies a manufacturing step by improving a usage rate of materials and to provide a method for manufacturing a thin film transistor and a display device that realized saving manufacturing time and reducing a manufacturing cost.

BRIEF DESCRIPTION OF THE DRAWINGS

FIGS. 3A to 3C are views describing a method for manufacturing a thin film transistor of the invention;

FIGS. 5A to 5C are views describing a method for manufacturing a thin film transistor and a method for manufacturing a display device of the invention;

FIGS. 17A to 17C are views describing a method for manufacturing a thin film transistor of the invention;

FIGS. 28A to 28C are views describing a method for manufacturing a thin film transistor of the invention;

FIGS. 30A to 30C are views describing a method for manufacturing a display device of the invention.

DETAILED DESCRIPTION OF THE PREFERRED EMBODIMENTS

Figure 1A:
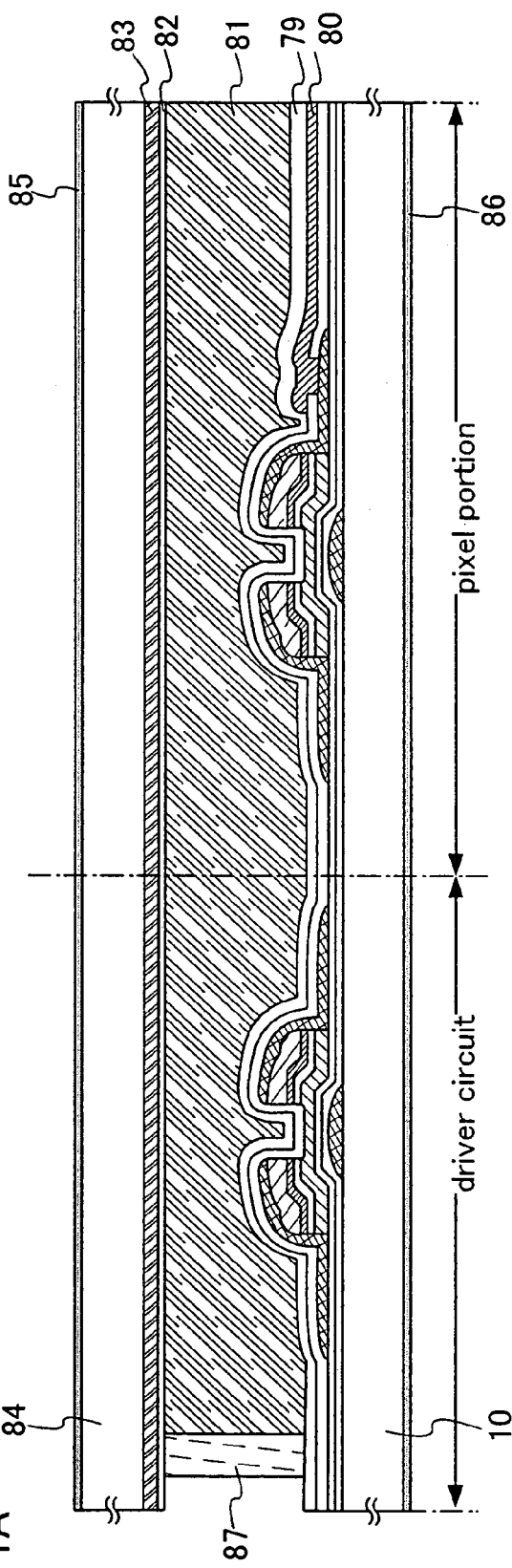
FIGS. 1A and 1B are views describing a method for manufacturing a display device of the present invention.

Embodiments of the present invention will be described in detail with reference to drawings. However, the invention is not limited to the description below. Note that, in all figures for describing the embodiment mode, the same reference numerals denote the same parts or parts having the same function and the explanation will not be repeated.

(Embodiment 1)

Figure 2A:
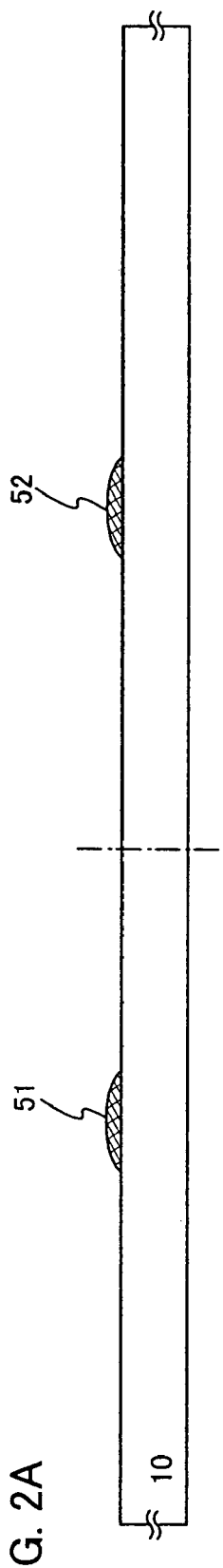
FIGS. 2A to 2C are views describing a method for manufacturing a thin film transistor of the invention.

As embodiments of the present invention, a method for manufacturing a channel etch type transistor with reference to FIGS. 2A to 2C and 3A to 3C is described. Conductive layers 51, 52 for forming a gate electrode and a gate wiring (scanning line) are formed over a substrate 50 in which an insulating film is formed on a metallic material such as a glass, quartz, a plastic material, stainless, and aluminum (FIG. 2A). These conductive layers 51, 52 are formed by drawing a composition containing a conductive material on the substrate 50 with the use of a droplet discharge method, and more specifically, by selectively discharging a composition containing a conductive material. Note that, not shown, a wiring that connects with a gate electrode is simultaneously formed at this time.

A droplet discharge method is used in forming the conductive layers 51, 52, and a diameter of a nozzle with which the droplet discharge method is equipped is set at 0.1 to 50 μm (preferably 0.6 to 26 μm) and a discharging amount of a composition discharged from the nozzle is set at 0.00001 pl to 50 pl (preferably 0.0001 to 10 pl). This discharging amount increases in proportion to a size of a diameter of a nozzle. In addition, a distance between a substrate to be treated and a discharge opening of a nozzle is preferable to make closer as much as possible, which is preferably set at about 0.1 to 2 mm so that the discharged composition is dropped at a desired place.

A conductive material dissolved or dispersed in a solvent is used for a composition discharged from the discharge opening. A conductive material corresponds to metal such as silver (Ag), gold (Au), copper (Cu), nickel (Ni), platinum (Pt), lead (Pd), iridium (Ir), rhodium (Rh), tungsten (W), aluminum (Al), cadmium (Cd), zinc (Zn), iron (Fe), titanium (Ti), zirconium (Zr), and barium (Ba), or alternatively corresponds to indium tin oxide (ITO) used as transparent conductive material. It is preferable that any one of materials of gold, silver, and copper dissolved or dispersed in a solvent is used for a composition discharged from a discharge opening by taking specific resistance value into consideration. More preferably, silver and copper with low resistance may be used. However, in using copper, a barrier film may be provided for an impurity measure. A solvent corresponds to ester such as butyl acetate and ethyl acetate, alcohols such as isopropyl alcohol and ethyl alcohol, an organic solvent and the like such as methyl ethyl ketone and acetone.

Viscosity of a composition is preferably set at 300 cp or lower, which is to discharge a composition smoothly from the discharge opening. Note that viscosity of a composition, a surface tension, and the like may be adjusted appropriately according to a solvent to be used and usage. As an example, viscosity of a composition in which ITO, organic indium, and organotin are dissolved or dispersed in a solvent is adjusted at 5 to 50 mPa·S, viscosity of a composition in which silver is dissolved or dispersed in a solvent is adjusted to 5 to 20 mPa·S, and viscosity of a composition in which gold is dissolved or dispersed in a solvent is adjusted to 10 to 20 mPa·S.

Although a diameter of a grain of a conductive material depends on a diameter of each nozzle and a desired pattern shape, a smaller diameter is preferable to prevent a nozzle from clogging and to manufacture a fine-pitched pattern, preferably a grain size of 0.1 μm or less. A composition is formed with a known method such as an elecetrolyzation, an atomization, or a wet reduction, of which grain size is generally about 0.5 to 10 μm. However, a nano molecule protected with a dispersant is minute of about 7 nm when formed with gas evaporation method, and when a surface of each grain is covered using a coating, the nano molecule becomes to have no aggregation in a solvent and disperses stably at room temperature, which shows almost the same behavior as liquid. Therefore, it is preferable to use a coating.

Figure 2B:
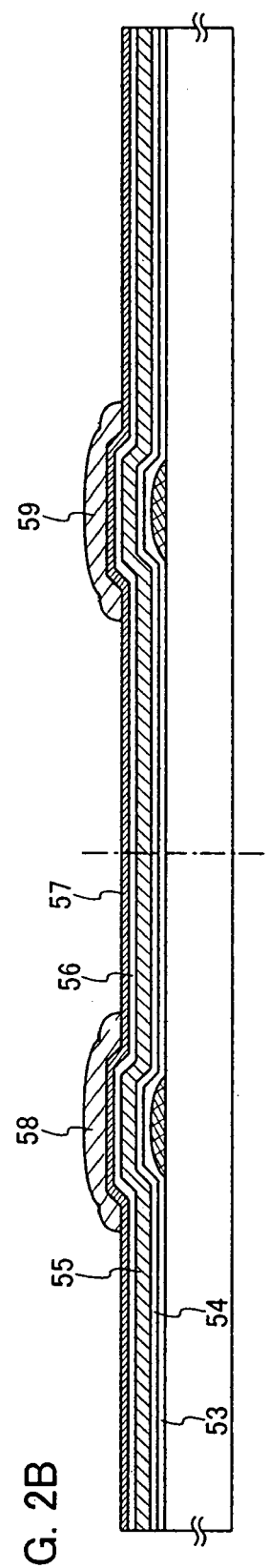

Next, insulating layers 53, 54 are formed on conductive layers 51 and 52 with a known method such as CVD and sputtering (FIG. 2B). The insulating layers 53 and 54 function as a gate insulating film. Preferably a silicon oxide film as the insulating layer 53 may be formed and a silicon nitride film as the insulating layer 54 may be formed. Accordingly, a gate insulating film can be formed thick so that a desired dielectric strength can be obtained, and further a capacitance between a semiconductor and a gate electrode which compose a transistor can be set at an appropriate value. This is due to that a dielectric constant of the silicon oxide film is about 3.5 and a dielectric constant of the silicon nitride film is about 7.5. These insulating layers can be formed with a glow discharge decomposition method and sputtering. Especially, in order to form a few dense insulating films in a gate leak current with a low deposition temperature, a rare gas element such as argon may be contained in a reactive gas and mixed into an insulating film to be formed.

Next, a first semiconductor layer 55 is formed on the insulating layers 53 and 54. The first semiconductor layer 55 is formed of a material including a semiconductor with an intermediate structure between an amorphous and crystal structure (including single crystal and polycrystal). This is a semiconductor having a third condition that is stable as a case of a free energy and crystalline one having short distance order and lattice distortion, of which grain size regarded as 0.5 to 20 nm can exists by being dispersed within a non-single crystalline semiconductor. In addition, hydrogen or halogen is contained for 1 atomic % or more as a neutralizer of a dangling bond. Such semiconductor is referred to as a semi-amorphous semiconductor (hereinafter referred to as SAS) in the invention. Furthermore, a rare gas element such as helium, argon, krypton, and neon is contained to promote further lattice distortion so that a good SAS can be obtained by increasing the stability.

A SAS can be obtained by carrying out grow discharge decomposition to a silicide gas. There is $SiH_4$ as a typical silicide gas, and besides, $Si_2H_6$, $SiH_2Cl_2$, $SiHCl_3$, $SiCl_4$, $SiF_4$, and the like can be used. These silicide gases are diluted and used with one or more kinds of a rare gas element selected from the group consisting hydrogen, hydrogen and helium, argon, krypton, and neon so that a SAS can be formed easily. It is preferable that a silicide gas is diluted with a range of 10 to 1000 times of a dilution ratio. Of course, reaction generation of a film to be formed by the glow discharge decomposition is carried out in a vacuum, and a pressure may be carried out with a range of about 0.1 Pa to 133 Pa. A power supply frequency for forming a glow discharge is set at 1 MHz to 120 MHz, preferably 13 MHz to 60 MHz. A high-frequency power may be set appropriately. It is preferable that a temperature for heating a substrate is 300° C. or less, which a temperature for heating a substrate of 100 to 200° C. is recommended. In addition, a carbide gas such as $CH_4$ and $C_2H_6$ and a germanium gas such as $GeH_4$ and $GeF_4$ are mixed into a silicide gas, and an energy band may be adjusted at 1.5 to 2.4 eV, or 0.9 to 1.1 eV. In addition, a SAS shows low electrical conductivity of n-type when an impurity element to control a valence electron is not doped intentionally. This due to an impurity contained in a SAS, and it is typically considered that oxygen imparts n-type conductivity. Oxygen contained in a is SAS varies also according to high-frequency power density during film formation.

In the invention, it is preferable that an oxygen concentration in the first semiconductor layer 55 is $5 \times 10^{19}$ atoms/$cm^3$ or less, preferably $1 \times 10^{19}$ atoms/$cm^3$ or less. Of course, not all of the oxygen operates as a donor; therefore, in order to control a conductivity type, the amount of an impurity element corresponding thereto is to be added. This results from that oxygen is an impurity imparting n-type conductivity, and in the case of a semi-amorphous semiconductor, it is formed with high power than an amorphous semiconductor; therefore, oxygen is easily intruded during film formation and there is a tendency to intensify n-type conductivity. Accordingly, channel doping of boron is important, which can be formed into an I-type semiconductor when doped with boron.

Here, an impurity element imparting p-type conductivity is doped to the first semiconductor layer 55 having a channel formation region simultaneously with this formation or after the formation, which enables controlling a threshold value. Boron is typically used as an impurity element imparting p-type conductivity, and an impurity gas such as $B_2H_6$ and $BF_3$ may be mixed with silicide gas at the rate of 1 ppm to 1000 ppm. Then, a boron concentration may be set at $1\times10^{14}$ to $6\times10^{16}$ atoms/cm$^3$.

Next, a second semiconductor layer 56 is formed over the first semiconductor layer 55. The second semiconductor layer 56 is formed without doping intentionally an impurity element to control a valence electron, and it is preferable to form with a SAS as well as the first semiconductor layer 55. The second semiconductor layer 56 is formed between a third semiconductor layer 57 having one-conductivity type that forms a source and a drain and the first semiconductor layer 55, thereby having a function as a buffer layer. Therefore, the second semiconductor layer 56 is not always necessary in the case of forming the third semiconductor layer 57 having one-conductivity type with the same conductivity type to the first semiconductor layer 55 having low electrical conductivity of n-type. In the object for controlling a threshold value, in the case of doping an impurity element imparting p-type conductivity to the first semiconductor layer 55, the second semiconductor layer 56 has an advantageous effect to change an impurity concentration step by step, which becomes a preferable embodiment in improving junction formation. In other words, it becomes possible to give an operation as a low concentration impurity region (LDD region) that is formed between a channel formation region and a source or a drain region to a transistor to be formed.

Next, the third semiconductor layer 57 is formed over the second semiconductor layer 56. The third semiconductor layer 57 having one-conductivity type may dope phosphorus as an impurity element, and an impurity gas such as $PH_3$ may be doped to a silicide gas in forming a n-type transistor. The third semiconductor layer 57 having one-conductivity type is formed of a semiconductor, an amorphous semiconductor, or a microcrystal semiconductor such as a SAS, excluding that a valence electron is controlled. The transistor thus formed is not formed by sandwiching a channel formation region between a source and a drain, and between LDD regions, and have a structure in which electric field concentration and current concentration can be relieved.

As mentioned above, it is possible to form continuously from the insulating layer 53 to the third semiconductor layer 57 having one-conductivity type without exposing to an atmosphere. That is, each laminated interface can be formed without being polluted by an atmospheric constituent and a polluted impurity element that are floated in an atmosphere; therefore, variation in properties of a transistor can be reduced.

Figure 2C:
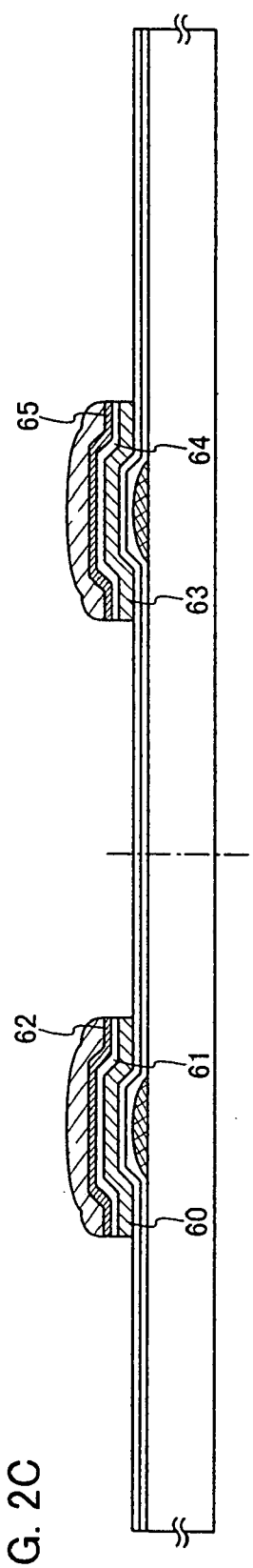

Next, a composition containing a conductive material is selectively discharged using a droplet discharge method again, thereby forming conductive layers 58, 59 over the third semiconductor layer 57 in the position overlapping the conductive layers 51, 52 that function as gate electrodes. Then, the first to the third semiconductor layers 55 to 57 are simultaneously patterned to isolate and form in an island shape by using the formed conductive layers 58 and 59 as masks (FIG. 2C). Thus, first semiconductor layers 60 and 63, second semiconductor layers 61 and 64, and third semiconductor layers 62 and 65 that are isolated in an island shape are formed.

Next, a composition containing a conductive material is selectively discharged using droplet discharge method, thereby forming conductive layers 66 to 69 (FIG. 3A). Subsequently, the second semiconductor layers 61, 64, the third semiconductor layers 62 and 65, and the conductive layers 58 and 59 are patterned by using the conductive layers 66 to 69 as masks. At this time, the first semiconductor layers 60 and 63 are etched a little, and first semiconductor layers 70 and 74, second semiconductor layers 71 and 75, third semiconductor layers 72 and 76, and conductive layers 73, 77, 88, and 89 are formed. In these conductive layers 73 and 77, and the conductive layers 88 and 89, one corresponds to a source wiring and the other corresponds to a drain wiring. Through the above steps, a channel etch type transistor is formed. This transistor can obtain electron field-effect mobility of 2 to 10 cm$^2$/V·sec by composing a channel formation region with a SAS. Therefore, it is possible to use this TFT as a switching element of pixels, and further, to use not only as a switching element of pixels but also as an element that forms a scanning line (gate line) driver circuit. Consequently, a display device that realizes a system-on-panel can be manufactured. In addition, as a notable point, this step does not uses a resist mask. This is possible since a droplet discharge method is used, and more specifically, the first to the third semiconductor layers 55 to 57 is patterned by using the conductive layers 58 and 59, or the conductive layers 66 to 69. Therefore, steps such as applying a resist, baking a resist, light exposure, developing, baking after developing, or peeling of a resist can be eliminated, so that great decrease of cost and increase of reliability due to simplification of the steps can be realized.

Next, a method for manufacturing a display device with the use of a channel etch type transistor formed through the above steps is described with reference to FIGS. 1A and 3C. Note that although a method for manufacturing a liquid crystal display device is shown hereinafter, the invention is not limited thereto, and can be applied to, for example, manufacturing a display device that used a light-emitting element.

First, an insulating layer 78 designed for protecting a channel formation region is formed (FIG. 3C), and preferably formed with a silicon nitride film. This thin film can be formed with sputtering or a glow discharge decomposition method, which is to prevent penetration of an airborne polluted impurity such as organic substance, metal, or vapor which is floated in atmosphere, and which is required to be a dense film. In this object, using silicon as a target, a silicon nitride film is sputtered in a high frequency with a sputtering gas in which a rare gas element such as nitrogen and argon is mixed, densification is promoted by containing the rare gas element. In addition, also in a glow discharge decomposition method, a silicon nitride film which is formed by diluting a silicide gas by 100 to 500 times with a silicide gas such as argon is dense, which is preferable, even when the film is formed at a low temperature such as less or equal 100° C. Furthermore, the silicon nitride film may be formed by laminating an insulating film, if necessary.

In addition, a silicon nitride film may be formed using plasma CVD. In that case, gas of silane, nitrogen, and rare gases are provided in film formation chamber during film formation, which is preferable to be carried out under a condition in which reaction pressure is at least 0.01 Torr to at most 0.1 Torr. In addition, it is preferable that a flow ratio of the silane gas to a sum of gases of the nitrogen gas and rare gases [silane/(nitrogen+rare gases)] is not less than 0.002 and less than 0.006. Furthermore, it is preferable that rare gases are one kind of the group consisting helium, neon, argon, krypton and xenon. Thus, the silicon nitride film can be manufactured at a low temperature of which reaction temperature is not less than 60° C. and less than 85° C. The thin film manufactured by the above conditions has properties in which a rare gas is 0.3 atomic % or more, and an etching rate at room temperature in Buffered Hydrogen Fluoride containing HF for 4.7% and NH$_4$F for 36.3% is 30.0 nm/min or lower; properties in which a rare gas is 0.3 atomic % or more and hydrogen is under 25 atomic %, and an etching rate at room temperature in Buffered Hydrogen Fluoride containing HF for 4.7% and NH$_4$F for 36.3% is 30.0 nm/min or lower; properties in which a rare gas is 0.3 atomic % or more and oxygen is 4.0 atomic % or more, and an etching rate at room temperature in Buffered Hydrogen Fluoride containing HF for 4.7% and NH$_4$F for 36.3% is 30.0 nm/min or lower; and properties in which a rare gas is 0.3 atomic % or more, oxygen is 4.0 atomic % or more and hydrogen is under 25 atomic %, and an etching rate at room temperature in Buffered Hydrogen Fluoride containing HF for 4.7% and NH$_4$F for 36.3% is 30.0 nm/min or lower. Thus, it can be understood that, although manufactured at a low temperature of 80° C. or less, the silicon nitride film having the above etching rate is a qualitative and dense film with high barrier properties.

An organic material may be used as a material of the insulating layer 78 to flatten. However, in that case, a barrier film may be formed by using a silicide film such as titanium, titanium nitride, titanium silicide (TiSix) and molybdenum silicide (MoSix), a poly-silicon film, or a material such as niobium (Nb), titanium oxynitride (TiON), tungsten (W), tungsten nitride (WN), titanium tungsten nitride (TiWN), or tantalum (Ta) in order to prevent degassing and the like. The barrier film may be either a single layer or a laminated structure. This barrier film results in increase in adhesion and the conductive layer 80 provided over the barrier film is implanted thereover, and furthermore decrease and stability in contact resistance can be realized.

Next, an opening is formed at a predetermined place of the insulating layer 78. This opening has an electrical connection with the conductive layer 69, which may be formed by irradiating with a laser or by discharging etching solution only at the predetermined place with a droplet discharge method. In using a droplet discharge method, wet etchant is discharged from a nozzle. However, a step of appropriately washing with a solvent such as water may be added to control an aspect ratio of the opening. Of course, in this washing step, a drop discharged from a nozzle is replaced with water by using a droplet discharge method, or a head filled with solution is replaced, so that it becomes possible to carry out continuous treatment with one apparatus, which is preferable in terms of processing time. When an opening is formed with any one of the above methods, the conductive layer 69 is in an exposed state.

Subsequently, the conductive layer 80 filled with an opening is formed by selectively discharging a composition containing a conductive material. FIG. 3C shows an example in which the conductive layer 80 is formed of a transparent conductive material and a transmissive type liquid crystal display device is manufactured; however, the invention is not limited thereto and a reflective type liquid crystal display device may be manufactured by using a conductive material in which reflectance of light is high.

Then, an alignment film 79 is formed to cover an entire surface, and rubbing treatment is carried out (FIG. 1A). Subsequently, a sealant 87 for sealing a liquid crystal is formed. In addition, a second substrate (a counter substrate) over which a counter electrode 83 made of a transparent conductive film and an alignment film 82 on which rubbing treatment is carried out are formed is prepared. Then, a liquid crystal 81 is dropped at a region surrounded with the sealant 87, and the second substrate 84 that is prepared separately is attached with the sealant 87 so that the counter electrode 83 and the conductive layer 80 operating as a pixel electrode face each other.

The above method for implanting a liquid crystal is not limited particularly, and a dispenser system (drop system) and a system for implanting a liquid crystal with the use of a capillary phenomenon after attaching the second substrate. A filler may be mixed into the sealant 87, and a color filter, a shielding film (black matrix) for preventing disclination, or the like may be formed over the second substrate 84. In addition, polarizing plates 85 and 86 are attached to the substrates 10 and 84, respectively.

In the above description, a pattern processing refers to processing into a desired shape by etching a thin film with some masks.

(Embodiment 2)

A method for manufacturing a channel protective type transistor is described as an embodiment of the present invention with reference to FIGS. 4A to 4C and 5A to 5C.

Figure 4A:
FIGS. 4A to 4C are views describing a method for manufacturing a display device of the invention.

Conductive layers 11 and 12 for forming a gate electrode and a gate wiring (scanning line) are formed on a substrate 10 such as glass or quartz (FIG. 4A). These conductive layers 11 and 12 are formed by drawing a composition containing a conductive material on the substrate 10 with a droplet discharge method. Next, insulating layers 13, 14 serving as gate insulating films are formed at an upper layer of the conductive layers 11 and 12 (FIG. 4B).

Subsequently, a first semiconductor layer 15 is formed over the insulating layers 13 and 14. A first semiconductor layer 15 is formed of a film including a semiconductor with an intermediate structure between an amorphous and crystal structure (including single crystal and polycrystal) (SAS). Moreover, a rare gas element such as helium, argon, krypton, or neon is included in this film to promote lattice distortion, thereby increasing stability; therefore, a SAS in good quality can be obtained. In the invention, it is preferable that an oxygen concentration in the first semiconductor layer 15 is $5\times10^{19}$ atoms/cm$^3$ or less, preferably $1\times10^{19}$ atoms/cm$^3$ or less. In addition, an impurity element imparting p-type conductivity is doped to the first semiconductor layer 15 in which a channel formation region is provided simultaneously with this formation or after the formation, which enables controlling a threshold value. Boron is typically used as an impurity element imparting p-type conductivity, and an impurity element such as B$_2$H$_6$ and BF$_3$ may be mixed with a silicide gas at the rate of 1 ppm to 1000 ppm. Then, a boron concentration may be set at $1\times10^{14}$ to $6\times10^{16}$ atoms/cm$^3$.

Figure 4B:
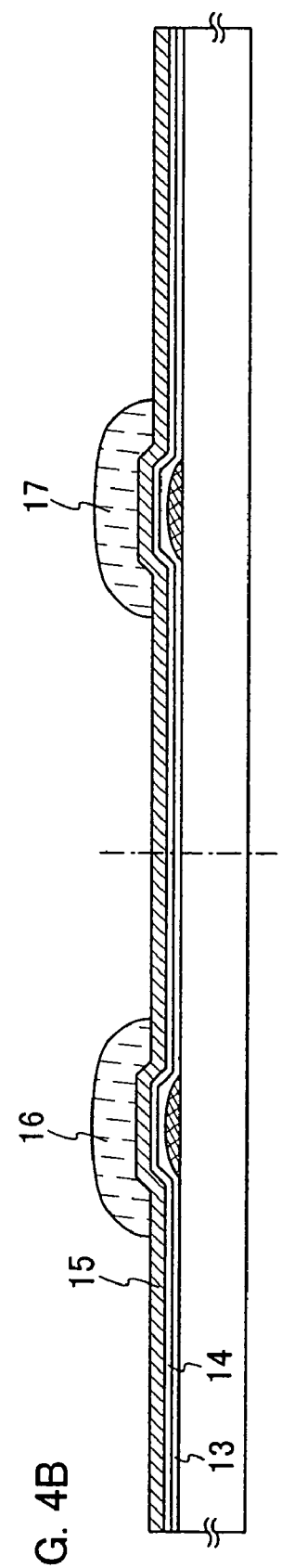

Next, a composition containing a photoresist reacting to ultraviolet radiation is selectively discharged with a droplet discharge method and mask patterns 16 and 17 may be formed in the position overlapping the conductive layers 11 and 12 that function as gate electrodes (FIG. 4B). A composition containing a photosensitizer may be used for these mask patterns 16 and 17. For example, a typical positive type resist which includes a novolac resin and naphthoquinonedi azide compound that is a photosensitizer, or a negative type resist which includes a base resin, diphenylsilanediol and an acid generation agent, dissolved or dispersed in a known solvent is used. In addition, an organic material such as acrylics, benzocyclobutene, parylene, flare, polyimide having transmissivity, or siloxane polymer may be used instead of a resist material.

Figure 4C:
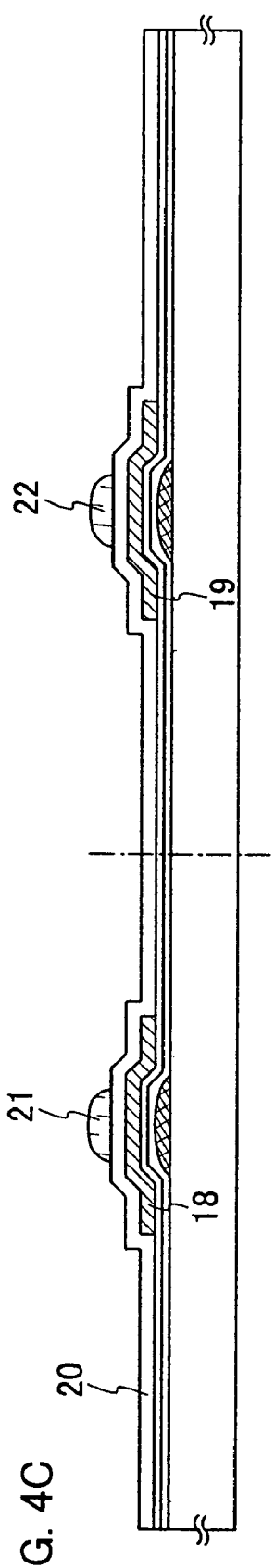

Then, using the mask patterns 16 and 17 as masks, the first semiconductor layer 15 is patterned and first semiconductor layers 18 and 19 are formed (FIG. 4C). Subsequently, an insulating layer 20 that serves as a channel protective film is formed over an entire surface.

Next, mask patterns 21 and 22 that serve as masks are formed again with a droplet discharge method. Then, the insulating layer 20 is patterned by using the mask patterns 21 and 22 to form insulating layers 23, 24 (FIG. 5A). These insulating layers 23 and 24 function as channel protective films.

The thin films formed by patterning the insulating layer 20 are used for channel protective films in this embodiment; however, the invention is not limited thereto. The mask patterns 21 and 22 may be used as the channel protective films. Thus, there is no need to carry out an etching step or to eliminate the mask patterns 21 and 22 that are used as the masks; therefore, the steps are simplified, which is preferable. In addition, the conductive layers 11 and 12 may be used to expose the backside to light without forming the mask patterns 21 and 22, thereby forming a channel protective film.

Subsequently, a second semiconductor layer 25 is formed over an entire surface. The second semiconductor layer 25 is formed without intentionally doping an impurity element to control a valence electron, which is preferable to be formed of a SAS like the first semiconductor layer 15. The second semiconductor layer 25 has a function as a buffer layer by being formed between a third semiconductor layer 26 having one-conductivity type that forms a source and a drain and the first semiconductor layer 15.

Then, the third semiconductor layer 26 is formed on the second semiconductor layer 25. In forming an n-type transistor, the third semiconductor layer 26 having one-conductivity type may be doped with phosphorus as a typical impurity element and an impurity gas such as $PH_3$ may be mixed with a silicide gas. The third semiconductor layer 26 having one-conductivity type is formed of a semiconductor, an amorphous semiconductor, or a microcrystal semiconductor such as a SAS, except that a valence electron is controlled. The transistor thus formed has a structure in which a channel formation region is not formed by being sandwiched between a source and a drain, and between LDD regions, and electric field concentration and current concentration can be relieved.

Next, conductive layers 27 to 30 are formed on the third semiconductor layer 26 by selectively discharging a composition containing a conductive material with a droplet discharge method. Then, using the conductive layers 27 to 30 as masks, the second and the third semiconductor layers 25 and 26 are simultaneously patterned to isolate and form into an island shape (FIG. 5B). Accordingly, second semiconductor layers 31 to 34 and third semiconductor layers 35 to 38 that are isolated into an island shape are formed.

The conductive layers 27 to 30 function as a source wiring or a drain wiring.

Through the above steps, the channel protective type transistor is formed. This transistor can obtain electron field-effect mobility of 2 to 10 $cm^2/V \cdot sec$ by composing a channel formation region with a SAS. Therefore, this TFT can be used as a switching element of pixels. Furthermore, the TFT can be used not only as a switching element of pixels but also as an element forming a scanning line (gate line) driver circuit. Consequently, a display device that realizes a system-on-panel can be manufactured. In addition, as a notable point, resist masks are formed with a droplet discharge method in this step. More specifically, the first semiconductor layer 15 is patterned with the use of the mask patterns 16 and 17 formed with a droplet discharge method, the insulating layer 20 is patterned with the use of the mask patterns 21 and 22, and the second and third semiconductor layers 25 and 26 is patterned with the use of the conductive layer 27 to 30. Therefore, steps such as applying a resist, baking a resist, light exposure, developing, or baking after developing can be eliminated, so that great decrease of cost and increase of reliability due to simplification of the steps can be realized.

Figure 1B:
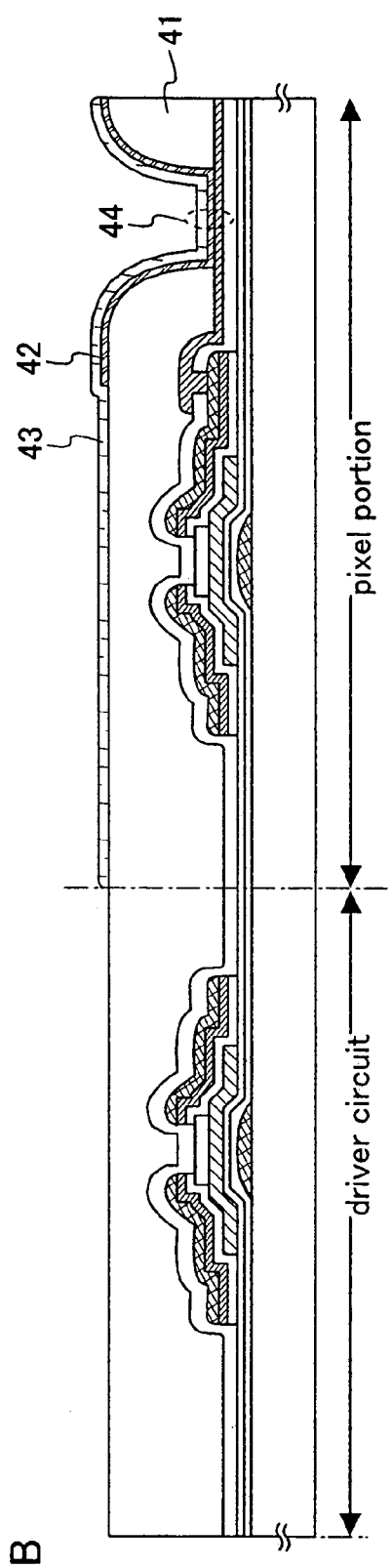

Subsequently, a method for manufacturing a display device with the use of a channel protective type transistor formed through the above steps is described with reference to FIGS. 1B and 5C. Hereinafter, a method for manufacturing a display device with the use of a light-emitting element is shown; however, the invention is not limited thereto, which can be applied to, for example, a manufacturing a liquid crystal display device.

First, an insulating layer 39 is formed over an entire surface with a known method (FIG. 5C). Then, an opening is formed at a predetermined place of the insulating layer 39 so that the conductive layer 30 is exposed. This is carried out by using either method with usual photolithography or by selectively using a pattern that serves as a mask with a droplet discharge method.

Next, a conductive layer 40 corresponding to a pixel electrode is formed by selectively discharging a composition so that an opening is filled. An insulating layer 41 is formed over an entire surface, and then an opening is provided at a predetermined place so that the conductive layer 40 is exposed (FIG. 1B). Afterwards, an electroluminescent layer 42 is formed with a droplet discharge method, vapor deposition, or the like. The electroluminescent layer 42 is formed of at least one material selected from various organic materials, inorganic materials, and the like, which may be preferably formed either of a single layer or a lamination of a plurality of layers. Then, a conductive layer 43 that serves as a counter electrode is formed on the electroluminescent layer 42 with a droplet discharge method. A lamination body of the conductive layer 40, the electroluminescent layer 42, and the conductive layer 43 corresponds to a light-emitting element 44.

In forming this light-emitting element 44, a plurality of thin films of the electroluminescent layer 42 and the conductive layer 43 can be manufactured continuously by changing a composition discharged from a nozzle or by changing a head filled with a composition. Accordingly, throughput is improved, which is preferable for improving the productivity.

This embodiment can be arbitrarily combined with the above embodiments.

(Embodiment 3)

Figure 6A:
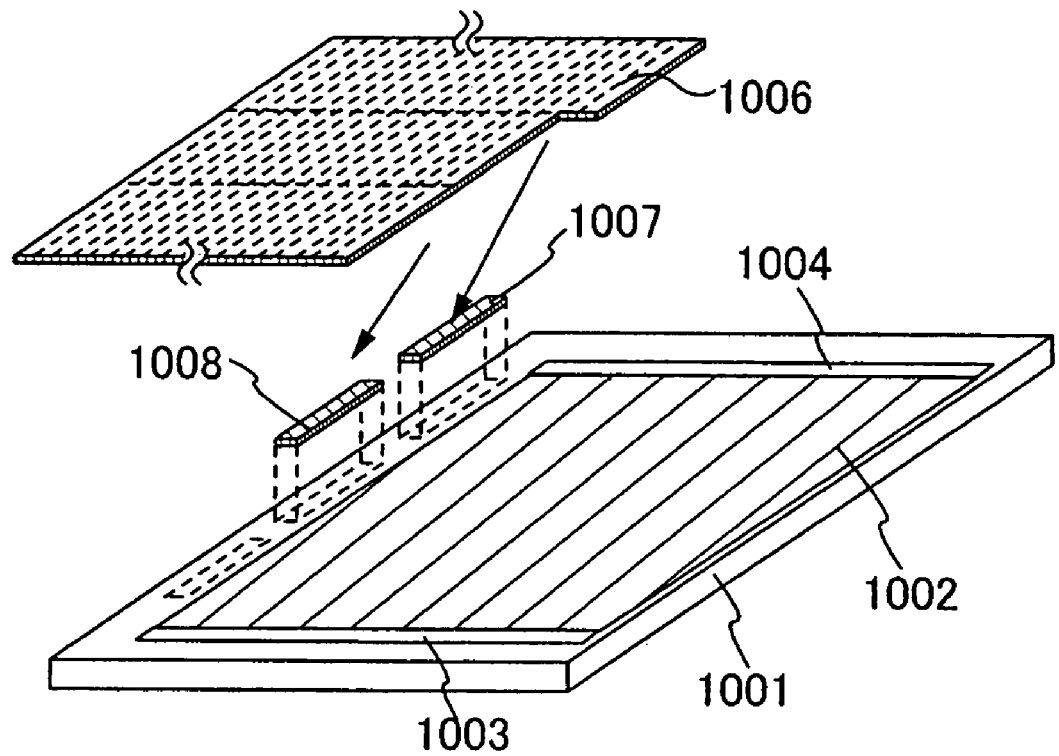
FIGS. 6A and 6B are views describing a mounted system (COG system) of a driver IC provided to a display device of the invention.

A method for manufacturing a display device of the present invention is described with reference to FIGS. 6A, 6B, 7A, and 7B. First, a display device adopting a COG system is described with reference to FIGS. 6A and 6B. In the display device, a pixel region 1002 that display information such as characters and images, driver circuits 1003, 1004, and driver ICs 1007 and 1008 are provided over a first substrate 1001. A plurality of driver circuits is provided on a third substrate 1006, which is separated into a shape of a strip of paper or rectangular shape. This separated driver circuit (hereinafter, referred to as a driver IC) is attached to the first substrate 1001. FIG. 6A shows a structure in which the driver IC 1007 and 1008 corresponding to signal line driver circuits are mounted with a COG system, and FIG. 6B shows a structure in which a driver IC 1009 is mounted with a COG system.

Figure 7A:
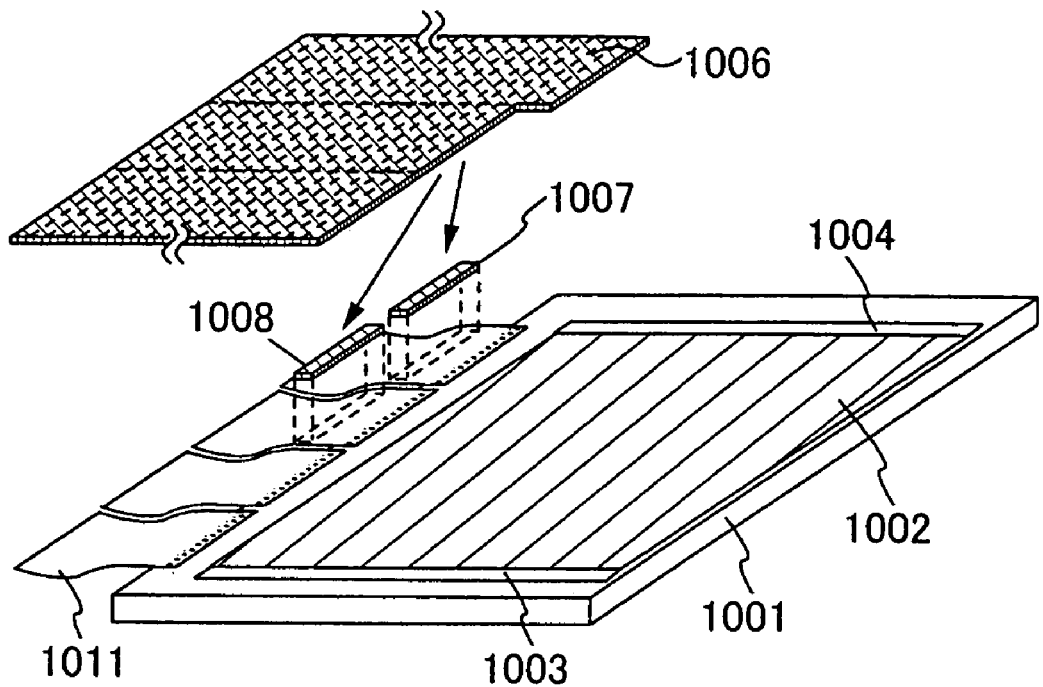
FIGS. 7A and 7B are views describing a mounted system (TAB system) of a driver IC provided to a display device of the invention.
Figure 7B:
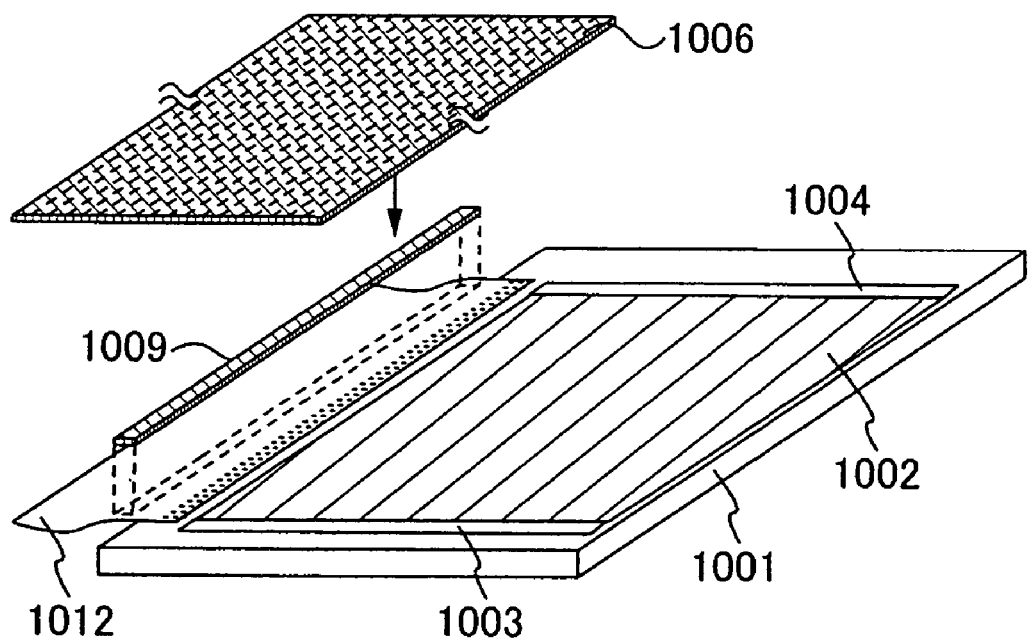

Next, a display device adopting a TAB system is described with reference to FIGS. 7A and 7B. In a TAB system, a wiring electrically connected to a pixel region 1002 and driver circuits 1003 and 1004 is exposed. The exposed wiring is connected to a FPC 1011 and driver ICs are attached to the FPC. FIG. 7A shows a case in which a plurality of the FPCs 1011 is disposed and driver ICs are attached to the FPCs 1011. FIG. 7B shows a case in which one driver IC 1009 is disposed on one FPC 1012, which uses a driver IC formed with a length corresponding to a major axis of a pixel region 1002. In the case of employing the latter, metal pieces that fix the driver IC 1009 may be provided together in respect of intensity.

The driver ICs mounted on these display devices can be formed in large quantities when a plurality of driver ICs are incorporated over the third substrate 1006 of a rectangular shape, which is preferable in terms of improving productivity. Therefore, a large-sized substrate is preferably used for the third substrate 1006, for example, it is preferable to use a substrate having a side of 300 mm to 1000 mm or more. In this driver ICs, a plurality of circuit patterns in which a driver circuit portion and an input-output terminal are assumed to be one unit is formed. This is completed after taking out by dividing at last, of which minor axis is assumed to be 1 to 6 mm and the major axis is assumed as 10 to 60 mm.

Figure 6B:
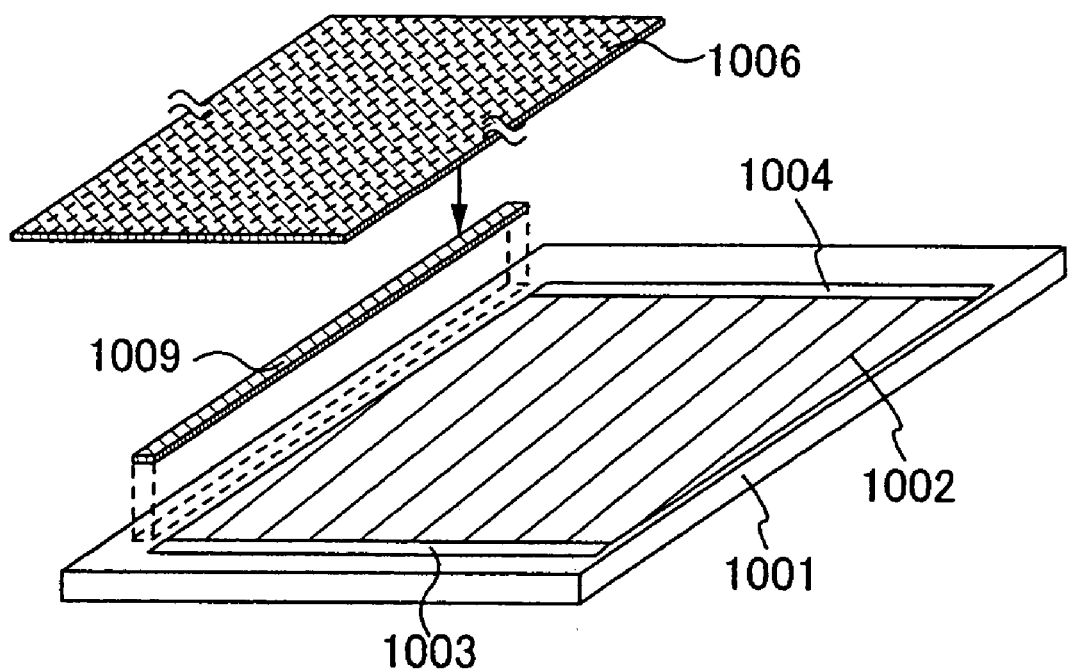

Although depending on resolution and a size of a pixel region to be used, a driver IC may be formed in accordance with a length of a side of a pixel region shown in FIGS. 6B and 7B, or a plurality of driver ICs may be formed by forming a driver IC of a shape a stripe or a rectangular shape having a major axis of 15 to 80 mm and a minor axis is 1 to 6 mm. However, when a size of a pixel region, namely a screen size is enlarged, a side length of a screen is 443 mm in 20-inch. It is possible to form a driver IC corresponding to this length; however, it is necessary to contrive so that intensity of a substrate can be ensured.

Advantage of an external dimension over an IC chip of a driver IC is a length of this major axis. Thus, when a driver IC formed with a major axis of 15 to 80 mm is used, the number necessary for mounting corresponding to a pixel region is less than that of using an IC chip; therefore, an yield rate of manufacturing can be improved. In addition, when a driver IC is formed on a glass substrate, productivity is not damaged since the driver IC is not limited to a shape of a substrate used as a mother body. This is big advantage as compared to the case where an IC chip is taken out from a circular silicon wafer.

In FIGS. 6A, 6B, 7A, and 7B, the driver IC 1007, 1008, or 1009 in which a driver circuit is formed is mounted at an outside region of the pixel region 1002. These driver ICs 1007 to 1009 are signal line driver circuits. In order to form a pixel region corresponding to a RGB full color, 3072 signal lines in a XGA class and 4800 signal lines in a UXGA class are necessary. The signal line formed in such number forms a leading out line by dividing every several blocks at an edge of the pixel region 1002, which is gathered in accordance with a pitch of an output terminal of the driver ICs 1007 to 1009.

An IC provided on a silicon substrate may be used as these driver ICs; however, it is preferable to be formed of a crystalline semiconductor layer, and the crystalline semiconductor layer is preferable to be formed by being irradiated with a continuous-wave laser. Therefore, a continuous-wave solid state laser or a gas laser is used as an oscillator in which the laser light is generated. There is few crystal defects when a continuous-wave laser is used, which due to that a transistor can be manufactured by using a polycrystalline semiconductor layer with a large grain size. Furthermore, since mobility and a response speed are favorable, a high-speed drive is possible, which makes possible to further improve an operating frequency of an element than conventional, so that high reliability can be obtained since there is few properties variations. In addition, a channel-length direction of a transistor and a scanning direction of laser light may be accorded with each other to further improve a frequency in an operation. This due to that the highest mobility can be obtained when a channel length direction of a transistor and a scanning direction of laser light with respect to a substrate are almost parallel (preferably, $-30°$ to $30°$) in a step of laser crystallization by a continuous-wave laser. Note that a channel length direction coincides with a direction of current floating, in other words, a direction in which an electric charge moves. The transistor thus manufactured has an active layer composed of a polycrystalline semiconductor layer in which a crystal grain is extended in a channel direction, which refers to that a crystal grain boundary is formed almost along a channel direction.

In carrying out laser crystallization, it is preferable to narrow down laser light largely, of which beam spot preferably has a width of about 1 to 3 mm which is the same width as that of a minor axis of a driver IC. In order to ensure an enough and effective energy density to a object to be irradiated, an irradiated region of laser light is preferable to be in a linear shape. However, a linear shape here does not refer to a line in a proper sense, but refers to a rectangle or an oblong with a large aspect ratio. For example, it refers to a rectangle or an oblong with an aspect ratio of 2 or more (preferably 10 to 10000). Accordingly, a width of a beam spot of laser light is conformed to that of a minor axis of a driver IC, so that a method for manufacturing a display device in which productivity is improved can be provided.

In FIGS. 6A, 6B, 7A, and 7B, a configuration in which a scanning line driver circuit is integrally formed with a pixel portion, and a driver IC is mounted as a signal line driver circuit is shown. However, the invention is not limited thereto, and a driver IC may be mounted as both of a scanning line driver circuit and a signal line driver circuit. In that case, it is preferable to differentiate a specification of driver IC used on a scanning line and a signal line. For example, a withstand pressure of around 30 V is required for a transistor composing a driver IC on a scanning line; however, a drive frequency is 100 kHz or less and a high speed operation is comparatively not required. Therefore, it is preferable to set a sufficiently long channel-length (L) of a transistor composing a scanning line driver. On the other hand, a withstand pressure of around 12 V is enough for a transistor of a signal line driver IC; however, a drive frequency is around 65 MHz at 3 V and a high speed operation is required. Therefore, it is preferable to set a channel-length of a transistor composing a driver with a micron rule.

In the pixel region 1002, a signal line and a scanning line are intersected to form matrix and a transistor is arranged in accordance with each intersection. A semi-amorphous TFT is used as a transistor arranged in the pixel region 1002 in the invention. It is possible to form a semi-amorphous semiconductor layer at a temperature of 300° C. or less with plasma CVD. A film thickness necessary to form a transistor is formed in a short time even in the case of a non-alkaline glass substrate of, is for example, an external size of 550×650 mm. A property of such manufacturing technique is effective in manufacturing a display device of a large-sized screen. In addition, a semi-amorphous TFT can obtain electron field-effect mobility of 2 to 10 cm$^2$/V·sec by composing a channel formation region with a SAS. Therefore, this TFT can be used as a switching element of pixels, and not only as a switching element of pixels, but can be used also as an element that forms a scanning line (gate line) driver circuit. Consequently, a display device that realizes a system-on-panel can be manufactured. This embodiment can be arbitrarily combined with the above embodiments.

(Embodiment 4)

As an embodiment of the present invention, a method for manufacturing a channel protective type thin film transistor is described with reference to FIGS. 28A to 28C and 29A to 29C, and a method for manufacturing a display device with the use of the above thin film transistor is described with reference to FIGS. 26A to 26E, 27A, 27B, 30A to 30C, 31A, and 31B. As a substrate 600, a glass substrate made of barium borosilicate glass, alumino borosilicate glass, or the like, a quartz substrate, a silicon substrate, a metal substrate, a stainless substrate, a plastic substrate having the heat resistance that can withstand processing temperature of this manufacturing step, or the like is used (FIG. 28A). Next, a conductive layer 601 is formed on the substrate 600. The conductive layer 601 is formed of a refractory metal material such as Ti (titanium), W (tungsten), Cr (chromium), Al (aluminum), Ta (tantalum), Ni (nickel), Zr (zirconium), Hf (hafnium), V (vanadium), Ir (iridium), Nb (niobium), Pd (palladium), Pt (platinum), Mo (molybdenum), Co (cobalt) or Rh (rhodium) with a known method such as sputtering, vapor deposition, or the like. In the case of carrying out a step of natural oxidization later to the conductive layer 601, the conductive layer 601 is formed with a thickness of 0.01 to 10 nm. However, a thickness of 0.01 nm is extremely thin and there is a possibility that mode of thin film does not exist.

Therefore, the conductive layer 601 here also includes those in a state that does not have mode of a thin film.

Conductive layers 602 to 604 are formed over the conductive layer 601 by discharging a composition containing a conductive material. Formation of the conductive layers 602 to 604 is carried out with a droplet discharge method. The conductive layers 603 and 604 function as gate electrodes. A conductive material corresponds to metal such as silver (Ag), gold (Au), copper (Cu), tungsten (W), or aluminum (Al), or alternatively corresponds to indium tin oxide (ITO) having a light-transmitting property. However, it is preferable that any one of materials of gold, silver, and copper dissolved or dispersed in a solvent is used by taking a specific resistance value into consideration for a composition discharged from a discharge opening. More preferably, silver and copper with low resistance may be used. However, in using silver and copper, a barrier film may be provided for an impurity measure. A solvent corresponds to ester such as butyl acetate, alcohols such as isopropyl alcohol, an organic solvent such as acetone, or the like. Surface tension and viscosity are appropriately adjusted by adjusting density of a solvent and adding a surface activator.

A diameter of a nozzle used in a droplet discharge method is set at 0.02 to 100 μm (preferably, 30 μm or less), and a discharging amount of a composition discharged from the nozzle is set at 0.001 pl to 100 pl (preferably, 10 pl or less). There are two types of an on-demand type and a continuous type for a droplet discharge method, both of which may be used. Furthermore, there is a piezoelectric system using properties transformed by applying voltage pressure of a piezoelectric material and a heating system that boils a composition by a heater provided in a nozzle and discharges the composition, both of which may be used for a nozzle to be used in a droplet discharge method. A distance between a substrate to be treated and a nozzle is preferable to be made as closer as possible to be dropped at a desired place, which may be preferably set at 0.1 to 3 mm (preferably, 1 mm or less). While keeping the relative distance, one of a nozzle and a substrate to be treated moves and a desired pattern is drawn. In addition, plasma treatment may be carried out to a surface of a substrate to be treated before discharging a composition. Accordingly, when plasma treatment is carried out, a surface of a substrate to be treated becomes hydrophilic and lyophobic, which is made use of. For example, deionized water becomes hydrophilic and a paste dissolved with alcohol becomes lyophobic.

A step of discharging a composition is preferably carried out under low pressure for volatilizing a solvent of the composition while the composition is discharged and hit at a substrate to be treated and for being able to eliminate or shorten later steps of drying and baking. After discharging a composition, steps of drying and baking or either is carried out with laser irradiation, rapid thermal annealing, heating furnace, or the like under atmospheric pressure or low pressure. Steps of drying and baking are both steps of heat treatment. Drying is carried out, for example, at 100° C. for 3 minutes and baking is carried out at 200 to 350° C. for 15 to 120 minutes, of which object, temperature, and time differ. In order to carry out steps of drying and burning well, a substrate may be heated, of which temperature is set at 100 to 800° C. (preferably, 200 to 350° C.), though depending on a material of a substrate and the like. Through this step, a solvent in a composition is volatilized or dispersant is removed chemically, and a resin around cures and shrink, thereby accelerating fusion and welding. However, this step is preferable to be carried out under an oxygen atmosphere in which a solvent decomposing or dispersing a metal element is easily removed.

A continuous-wave or pulsed gas laser or solid state laser may be used for irradiation of laser light. There are an excimer laser, a YAG laser, and the like as the former gas laser, and there is a laser used a crystal such as YAG and YVO$_4$ doped with Cr, Nd, and the like as the latter solid state laser. It is preferable to use a continuous-wave laser with the relation of an absorption rate of laser light. In addition, a method for irradiating with a laser in which a pulsed oscillation and a continuous-wave are combined, so-called a hybrid laser may be used. However, depending on heat resistance of a substrate, heat treatment by irradiation of laser light may be carried out rapidly within some microseconds to some minutes. Rapid Thermal Annealing (RTA) is carried out by rapidly raising temperature and by rapidly applying heat within some microseconds to some minutes with the use of an infrared lamp, a halogen lamp, or the like that emits ultraviolet light to infrared light under atmosphere of inert gas. Substantially, only a most surface of a thin film can be heated since this treatment is carried out rapidly, which does not have influence on a film of a lower layer. That is, also a substrate with low heat resistance such as a plastic substrate is not affected.

Next, when there is a possibility that an element and a wiring to be formed later is short-circuited, one of the two steps below is carried out if the substrate 600 is still in a condition covered with the conductive layer 601 thereover. One is a step of forming insulating layers 605 to 607 by insulating the conductive layer 601 not overlapping the conductive layers 602 to 604 (FIG. 28B). More specifically, the conductive layer 601 not overlapping the conductive layers 602 to 604 is oxidized and insulated. In the case of thus insulating the conductive layer 601, it is preferable to form the conductive layer 601 with a thickness of 0.01 to 10 nm, which makes an insulating layer by natural oxidation. Note that a method for exposing to an oxygen atmosphere may be used or a method for carrying out heat treatment may be used for a method of oxidization. The other is a step of etching and removing the conductive layer 601 by using the conductive layers 602 to 604 as masks. There is no limitation on a thickness of the conductive layer 601 in using this step.

A conductive layer made of refractory metal may be newly formed over the conductive layers 602 to 604. Accordingly, it is a configuration in which the conductive layers 602 to 604 are interposed between barrier bodies, which prevent invasion of impurity.

Then, an insulating layer serving as a gate insulating film is formed in a single layer or a laminated structure with the use of a known method such as plasma CVD, sputtering, a glow discharge decomposition method, and the like (FIG. 2B). Here, lamination of three layers of an insulating layer 608 made of silicon nitride, an insulating layer 609 comprising silicon oxide, and an insulating layer 610 comprising silicon nitride corresponds to a gate insulating film. According to the above structure, the gate insulating film can be formed thick so that a desired dielectric strength can be obtained, and further a capacitance between a semiconductor layer and a gate electrode which compose a transistor can be set at an appropriate value. This is due to that a dielectric constant of a silicon oxide film is about 3.5 and a dielectric constant of a silicon nitride film is about 7.5. In order to form a few minute insulating films in a gate leak current with a low deposition temperature, a rare gas element such as argon may be contained in a reactive gas and mixed into an insulating film to be formed.

Next, a semiconductor layer 611 is formed on an insulating layer 610. The semiconductor layer 611 has an intermediate structure between an amorphous and crystal structure (including single crystal and polycrystal). An amorphous semiconductor layer (amorphous silicon, a-Si) is formed with a known method such as plasma CVD and sputtering. On the other hand, a semiconductor layer having an intermediate structure between an amorphous and crystal structure is a semiconductor layer having a third condition that is stable as a case of a free energy and crystalline semiconductor having short distance order and lattice distortion, of which grain size regarded as 0.5 to 20 nm can exists by being dispersed within a non-single crystal semiconductor layer. In addition, hydrogen or halogen is contained for 1 atomic % or more as a neutralizer of a dangling bond. Here, such a semiconductor layer is referred to as a semi-amorphous semiconductor layer (hereinafter, referred to as a SAS). A SAS increases the stability by further promoting lattice distortion by making a rare gas element such as helium, argon, krypton, and neon contained.

A SAS can be obtained by carrying out grow discharge decomposition on a silicide gas. $SiH_4$ is a typical silicide gas, and besides, $Si_2H_6$, $SiH_2Cl_2$, $SiHCl_3$, $SiCl_4$, $SiF_4$, and the like can be used. These silicide gases are diluted and used with one or more kinds of a rare gas element consisting hydrogen, hydrogen and helium, argon, krypton, and neon so that a SAS can be formed easily. It is preferable that a silicide gas is diluted with a range of 10 to 1000 times of a dilution ratio. In addition, a thin film comprising Si of which composition ratio is 80% or more can be obtained when it is formed under a condition with a range that a gas flow rate of $Si_2H_6$ and $GeF_4$ is $Si_2H_6$: $GeF_4=20$ to $40:0.9$. Of course, reaction generation of a film to be formed is carried out under reduced pressure, and may be carried out under a pressure with a range of about 0.1 Pa to 133 Pa. A power supply frequency for forming a glow discharge is set at 1 MHz to 120 MHz, preferably 13 MHz to 60 MHz. A power supply frequency may be set appropriately. It is preferable that a temperature for heating a substrate to be 300° C. or less, which a temperature for heating a substrate of 100 to 200° C. is recommended. In addition, a carbide gas such as $CH_4$ and $C_2H_6$ and a germanium gas such as $GeH_4$ and $GeF_4$ are mixed into a silicide gas, and an energy band may be adjusted at 1.5 to 2.4 eV, or 0.9 to 1.1 eV. In addition, a SAS shows low electrical conductivity of n-type when an impurity element to control a valence electron is not doped intentionally. This is due to an impurity contained in a SAS, and it is considered that oxygen typically imparts n-type conductivity. Oxygen contained in a SAS varies also according to high-frequency power density during film formation.

An insulating layer 612 is formed on the semiconductor layer 611 with a known method such as plasma CVD. This insulating layer 612 can be formed with sputtering and a glow discharge decomposition method, which is to prevent penetration of an airborne polluted impurity such as organic substance, metal, or vapor which is floated in atmosphere, and which is required to be a dense film. In this object, using silicon as a target, in a silicon nitride film sputtered in a high frequency with a sputtering gas in which a rare gas element such as nitrogen and argon is mixed, densification is promoted by containing the rare gas element. In addition, also in a glow discharge decomposition method, a silicon nitride film which is formed by diluting a silicide gas by 100 to 500 times with a silicide gas such as argon is dense, which is preferable, even when the film is formed at a low temperature of 100° C. or less. Furthermore, the silicon nitride film may be formed by laminating an insulating film, if necessary. As mentioned above, it is possible to continuously form from the insulating layer 608 to the insulating layer 612 without exposing to an atmosphere. That is, each laminated interface can be formed without being polluted by an atmospheric constituent and an airborne polluted impurity element that are floated in atmosphere; therefore, variation in properties of a transistor can be reduced.

Next, an insulating layer 613 that serves as a mask is formed by selectively discharging a composition on the insulating layer 612 in a place overlapping the conductive layers 603 and 604 that serve as the gate electrodes. A resin material such as an epoxy resin, an acrylic resin, a phenol resin, a novolac resin, an acrylic resin, a melamine resin, or a urethane resin is used for a composition that forms the insulating layer 613. In addition, an organic material such as benzocyclobutene, parylene, flare, and polyimide having transmissivity, a compound material made by polymerization of siloxane-based polymer and the like, a composition material containing soluble homopolymer and soluble copolymer are used. Furthermore, a commercial resist material containing a photosensitizer may be used and, for example, a typical positive type resist which includes a novolac resin and naphthoquinonedi azide compound that is a photosensitizer, or a negative type resist which includes a base resin, diphenylsilanediol and an acid generation agent, dissolved or dispersed in a known solvent may be used. In using any one of materials, surface tension and viscosity are appropriately adjusted by adjusting density of a solvent and adding a surface activator.

Figure 29A:
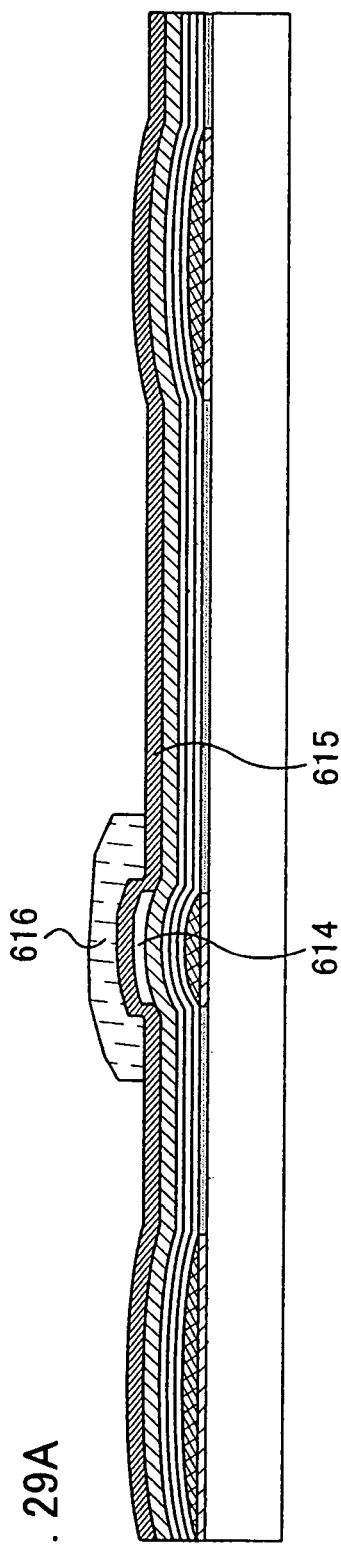
FIGS. 29A to 29C are views describing a method for manufacturing a thin film transistor of the invention.
Figure 29B:
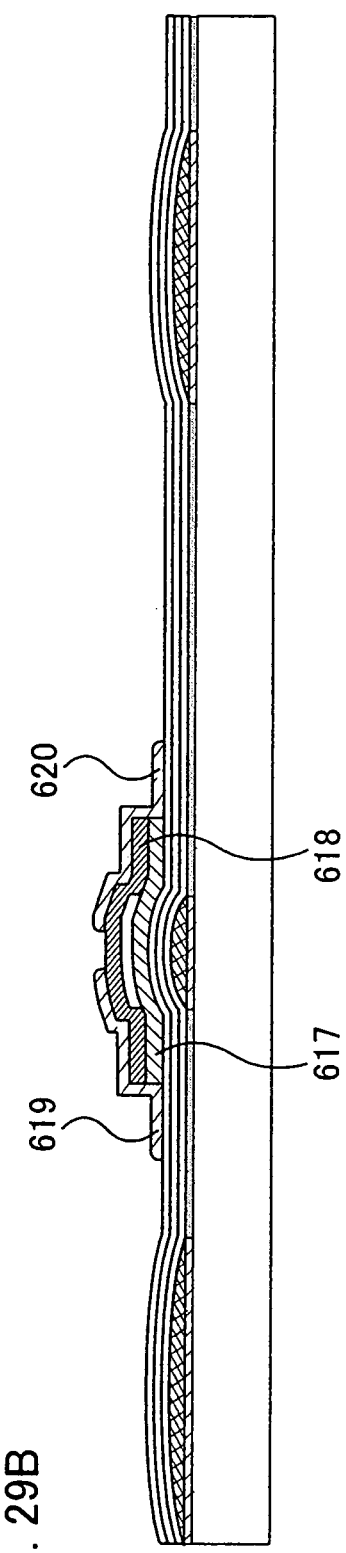

Then, using the insulating layer 613 as a mask, an insulating layer 614 serving as a channel protective layer is formed by etching the insulating layer 612 (FIG. 29A). Subsequently, after removing the insulating layer 613 used for a mask, a semiconductor layer 615 which has one-conductivity type is formed over the semiconductor layer 611 and the insulating layer 614. This semiconductor layer 615 which has one-conductivity type is formed by using a silane gas and a phosphine gas, or by doping impurity with doping after forming a semiconductor layer with CVD. Then, an insulating layer 616 serving as a mask is formed by selectively discharging a composition over the semiconductor layer 615 in a place overlapping the insulating layer 614 serving as a channel protective layer.

Next, using the insulating layer 616 as a mask, a semiconductor layer 617 and a semiconductor layer 618 having one-conductivity type are formed by simultaneously etching the semiconductor layer 611 and the semiconductor layer 615 which has one-conductivity type. Subsequently, after removing the insulating layer 616 used as a mask, conductive layers 619 and 620 that function as a source wiring and a drain wiring are formed by selectively discharging a composition containing a conductive material.

Figure 29C:
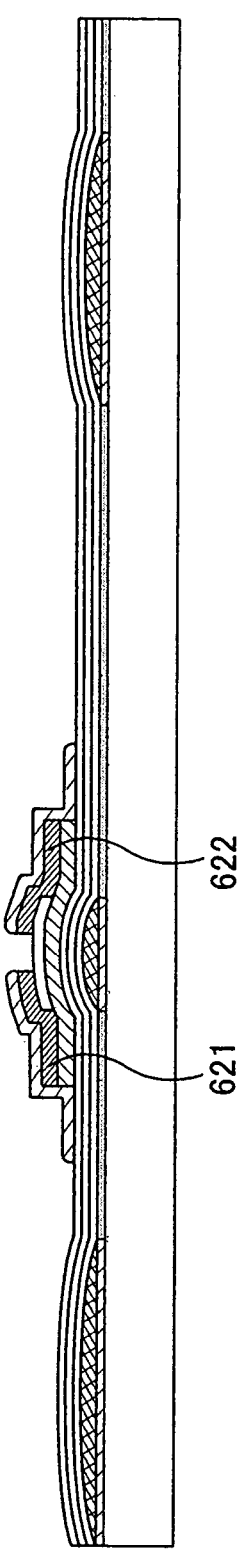

Then, using the conductive layers 619 and 620 as masks, semiconductor layers 621 and 622 are formed by etching the semiconductor layer 618 (FIG. 29C). Subsequently, a conductive layer 623 corresponding to a pixel electrode is formed by selectively discharging a composition containing a conductive material to electrically connect with the conductive layer 620. In FIG. 29C, the conductive layer 623 is formed of a light-transmitting material and an example manufacturing a transmissive liquid crystal display device is shown; however, the invention is not limited thereto. A reflective liquid crystal display device may be manufactured by using a conductive layer with high light reflectance.

Figure 26A:
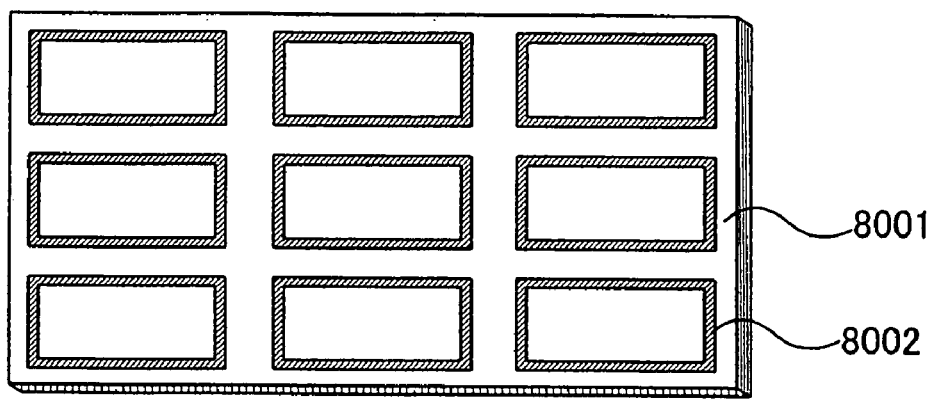
FIGS. 26A to 26E are views describing a dispenser system (droplet discharge system)
Figure 26B:
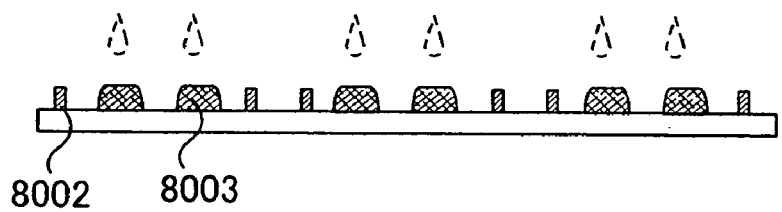
Figure 26C:
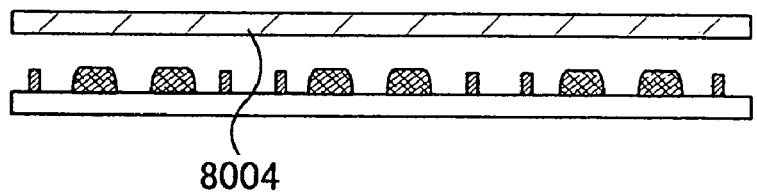
Figure 26D:
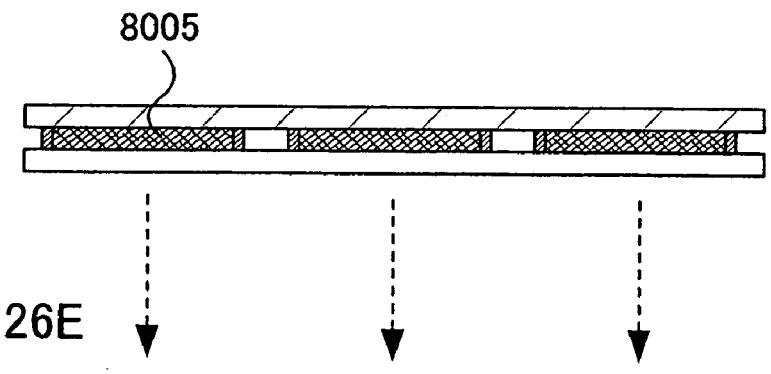
Figure 26E:

Next, an insulating layer 624 serving as an alignment film is formed with a known method such as printing or spin coating to cover the conductive layer 623 (FIG. 30A). The insulating layer 624 can be selectively formed as shown if screen printing is used. Subsequently, a sealant 625 is formed (FIG. 30B). Thereafter, a substrate 628 over which an insulating layer 626 serving as an alignment film and a conductive layer 627 serving as a counter electrode are provided is attached to the substrate 600 with the sealant 625, and then a liquid crystal 629 is injected (FIG. 30C). As a method for laminating liquid crystal, a dispenser system (drop system) may be used. Here, the case of adopting a dispenser system, that is a liquid crystal drop process is described with reference to FIGS. 26A to 26E. When an element such as a TFT is completed over a substrate 8001, a closed loop 8002 serving as a sealant is formed (FIG. 26A). Then, a liquid crystal 8003 is dropped in the closed loop 8002 by a dispenser (FIG. 26B). Subsequently, the substrate 8001 and the substrate 8004 are attached to each other in vacuum (FIG. 26C). Thereafter, when UV curing is carried out, the liquid crystal 8005 is filled between the substrates 8001 and 8004 (FIG. 26D), and then every panel is separated (FIG. 26E).

A filler may be mixed into the sealant 625, and a color filter, a shielding film (black matrix) for preventing disclination, or the like may be formed over the substrate 628. In addition, although not shown, a polarizing plate is attached to each of the substrates 600 and 628, respectively. Furthermore, although not mentioned above, appropriately necessary treatment such as rubbing treatment of an alignment film or dispersion treatment of spacer is carried out at necessary timing.

Figure 21:
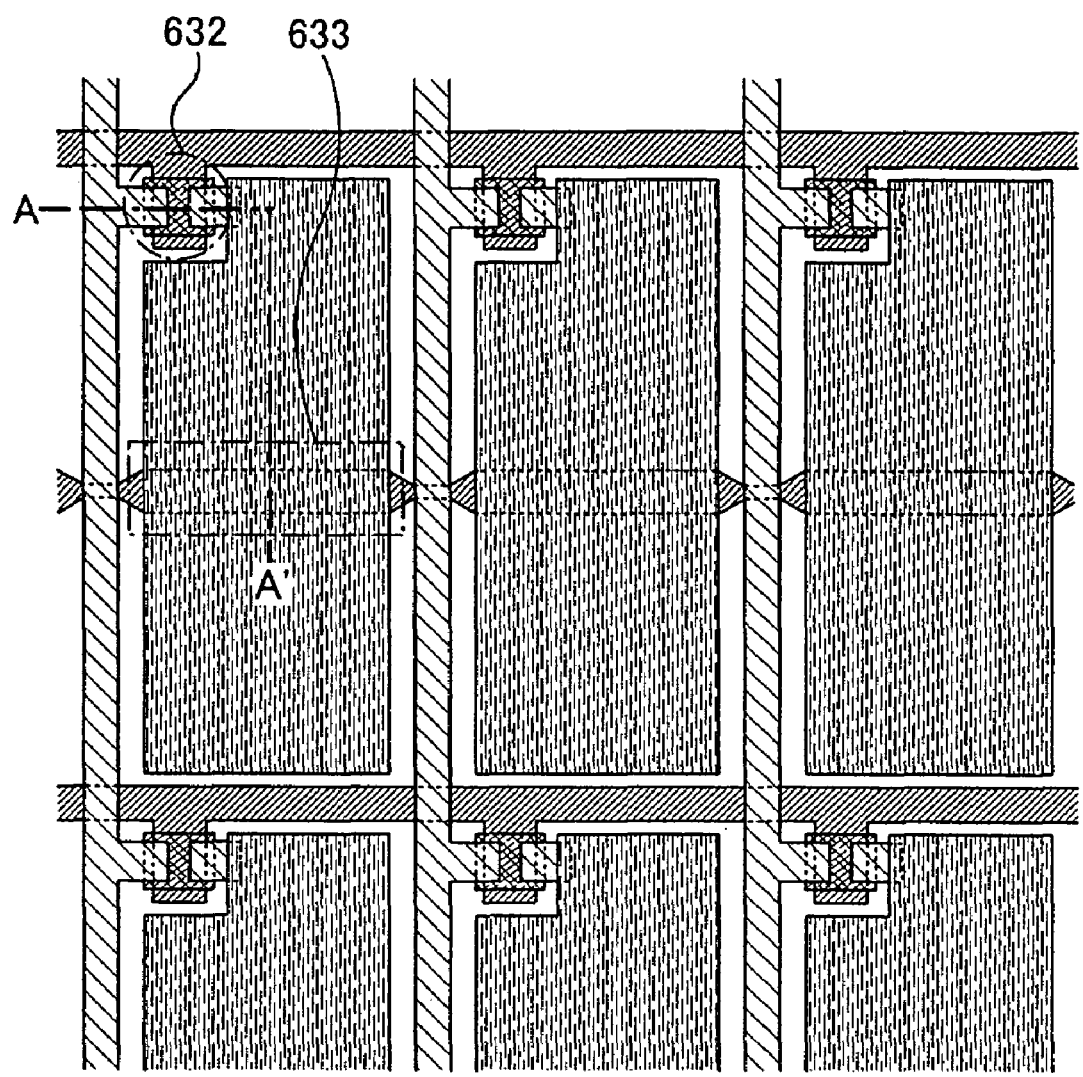
FIG. 21 is a layout view of a pixel circuit.
Figure 27A:
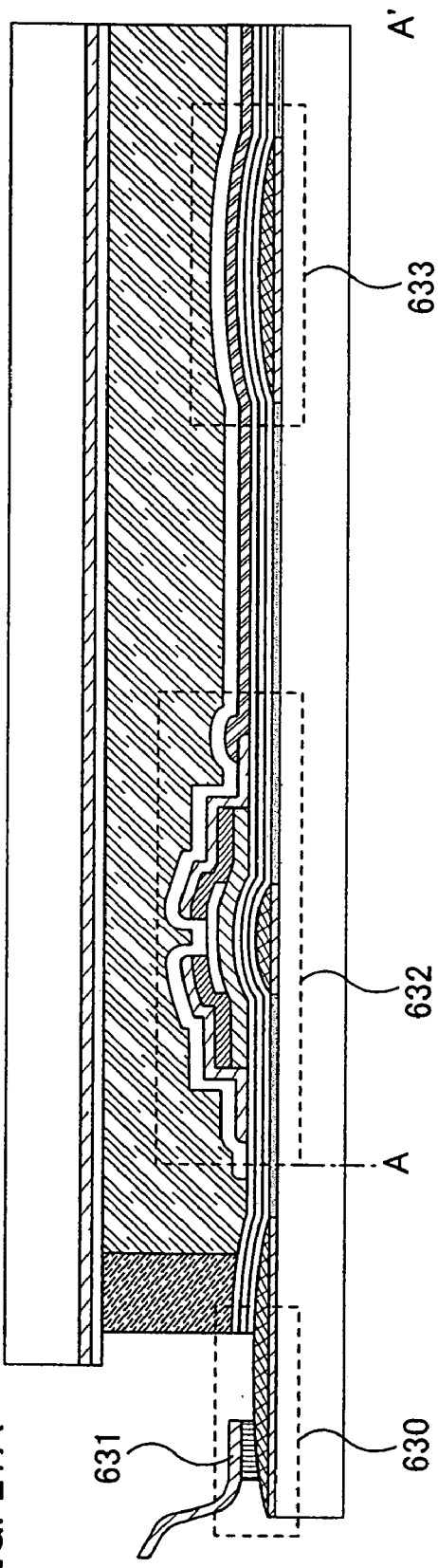
FIGS. 27A and 27B are views describing a method for manufacturing a display device of the invention.

Next, the insulating layers 608 to 610 in a region 630 are removed by carrying out ashing treatment with the use of an oxygen gas under atmospheric pressure or vicinity of an atmospheric pressure (FIG. 27A). This treatment is carried out with the use of an oxygen gas and one or more kinds consisting hydrogen, $CF_4$, $NF_3$, $H_2O$, and $CHF_3$. In this step, ashing treatment is carried out after sealing using a counter substrate to prevent damage or breakdown due to static; however, when there are few effects of static, ashing treatment may be carried out at any timing. Subsequently, an anisotropic conductive film is provided so that the conductive layer 602 and a connection terminal 631 are electrically connected. The connection terminal 631 transmits a signal and potential from outside. Through the above step, a display device including a channel protective type switching TFT 632 and a capacitor element 633 is completed. A top view at this time is as shown in FIG. 21, of which cross-sectional view taken along a line A–A' of FIG. 21 corresponds to a cross-sectional view shown in FIG. 27A.

Figure 27B:
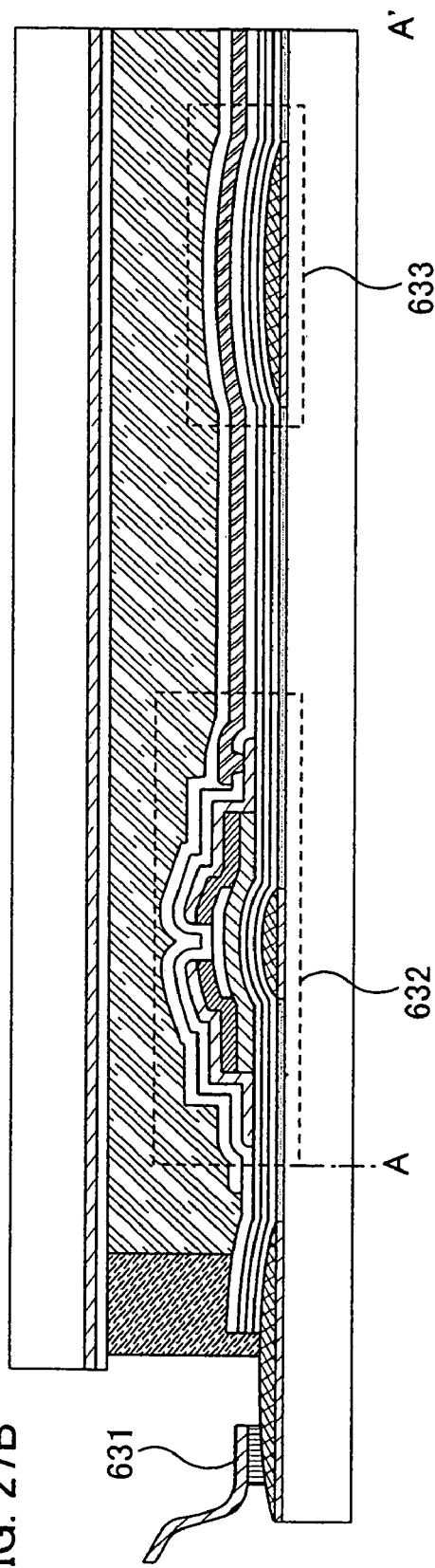
Figure 31A:
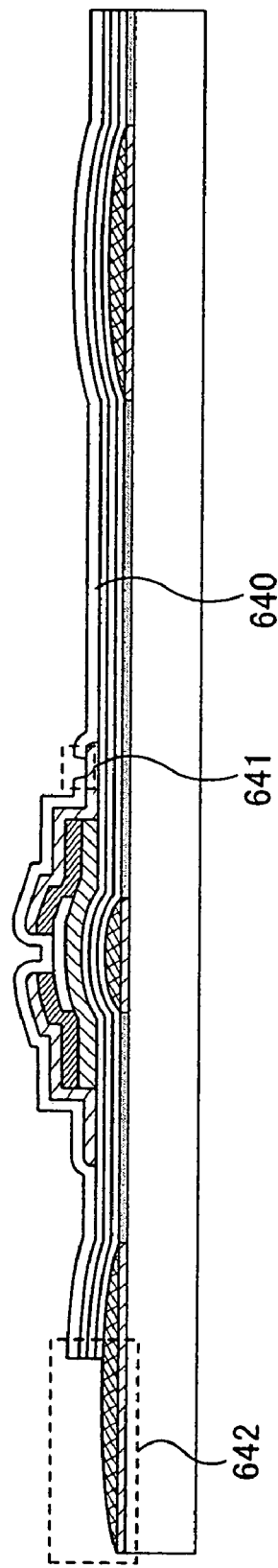
FIGS. 31A and 31B are views describing a method for manufacturing a thin film transistor and a method for manufacturing a display device of the invention.
Figure 31B:
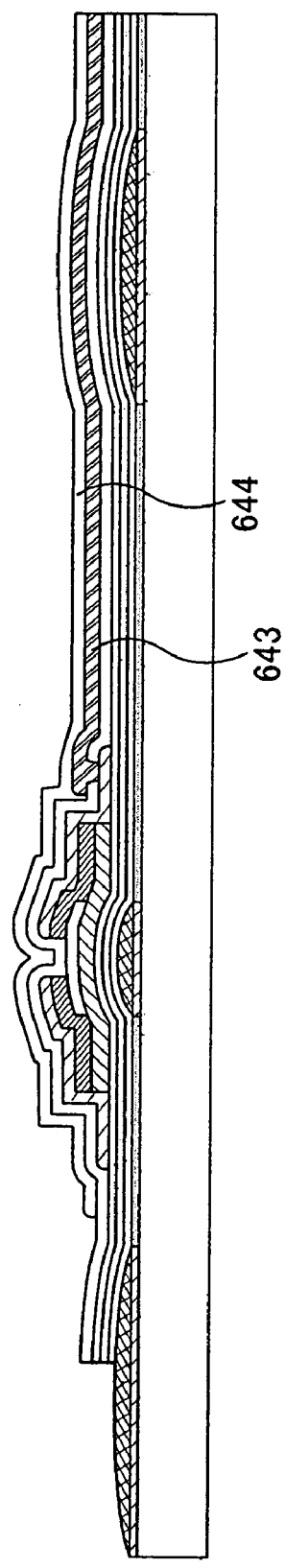

In the above step, the conductive layer 623 connecting to the conductive layer. 620 serving as a source or a drain wiring is directly formed on the insulating layer 610 and the conductive layer 620. However, after etching the semiconductor layer 618 which has one-conductivity type, an insulating layer 640 serving as a protective film may be formed (FIG. 31A). In this case, it is necessary to form an opening 641 in the insulating layer 640, and the conductive layer 620 and a pixel electrode to be formed later is electrically connected through the opening 641. At the time of forming the opening 641, an opening 642 necessary for later attaching a connection terminal may be simultaneously formed. A method for forming the openings 641 and 642 is not especially limited, which may be carried out with a droplet discharge method, photolithography, or the like. In the case of using a droplet discharge method, an opening may be formed by discharging wet etchant from a nozzle. Alternatively, an opening may be formed by forming only an insulating layer serving as a mask with a droplet discharge method and by using the mask. Then, the conductive layer 643 serving as a pixel electrode is formed by selectively discharging a composition containing a conductive material to fill the opening 641. Subsequently, an insulating layer 644 serving as an alignment film is formed (FIG. 31B). Thereafter, as well as the steps shown in FIGS. 30B and 30C, when a liquid crystal is injected by forming a sealant and attaching a counter substrate, a display device having a display function is completed (FIG. 27B). Through the above steps, a display device including the channel protective type switching TFT 632 and the capacitor element 633 having different structure from FIG. 27A is completed. In these steps, a resist mask is not used; therefore, steps such as applying a resist, baking a resist, light exposure, developing, baking after developing, or peeling of a resist can be eliminated. Therefore, saving of manufacturing time and reduction of a manufacturing cost are realized due to simplification of the steps.

(Embodiment 5)

As an embodiment of the present invention, a method for manufacturing a channel protective type thin film transistor is described with reference to FIGS. 17A to 17C, 18A to 18C, and 19A and 19B. Furthermore, a method for manufacturing a display device with the use of the above thin film transistor is described with reference to FIGS. 16, 19C, and 20.

A conductive layer 651 is formed on a substrate 650 such as a glass substrate, or a quartz substrate (FIG. 17A). The conductive layer 651 is formed of a refractory metal material such as Ti or W with a known method such as sputtering, vapor deposition, or the like. Conductive layers 652 to 655 serving as a gate electrode or a connection wire are formed on the conductive layer 651 by discharging a composition containing a conductive material.

When there is a possibility that an element and a wiring to be formed later are short-circuited if the substrate 650 is covered with the conductive layer 651, one of the two steps below is carried out. One is a step of forming insulating layers 656 to 659 by insulating the conductive layer 651 not overlapping the conductive layers 652 to 655 (FIG. 17B). In the case of thus insulating the conductive layer 651, it is preferable to form the conductive layer 651 in a thickness of 0.01 to 10 nm, which makes an insulating layer by natural oxidation. The other is a step of etching and removing the conductive layer 651 by using the conductive layers 652 to 654 as masks.

Then, an insulating layer serving as a gate insulating film is formed in a single layer or a laminated structure with the use of a known method such as plasma CVD, sputtering, or a glow discharge decomposition method (FIG. 17C). Here, lamination of three layers of an insulating layer 660 comprising silicon nitride, an insulating layer 661 comprising silicon oxide, and an insulating layer 662 comprising silicon nitride corresponds to a gate insulating film. Then, a semiconductor layer 663 is formed on the insulating layer 662. The semiconductor layer 663 has an intermediate structure between an amorphous and crystal structure (including single crystal and polycrystal).

Next, an insulating layer 664 is formed on the semiconductor layer 663 with a known method such as plasma CVD or the like. As mentioned above, it is possible to form continuously from an insulating layer 660 to the insulating layer 664 without exposure to an atmosphere. That is, each interface between layers can be formed without being polluted by an atmospheric constituent and polluted impurity elements that are floated in an atmosphere; therefore, variation in properties of a transistor can be reduced. Next, insulating layers 665 and 666 serving as masks are formed in a place overlapping the conductive layers 653 and 655 serving as gate electrodes over the insulating layer 664 by selectively discharging a composition.

Figure 18A:
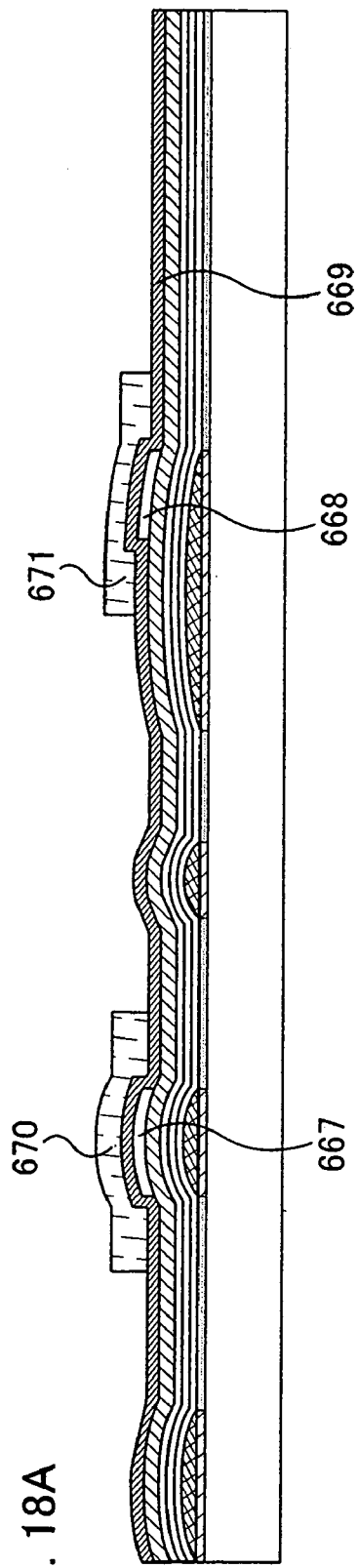
FIGS. 18A to 18C are views describing a method for manufacturing a thin film transistor of the invention.

Then, using the insulating layers 665 and 666 as masks, insulating layers 667 and 668 serving as channel protective layers are formed by etching the insulating layer 664 (FIG. 18A). After removing the insulating layers 665 and 666, a semiconductor layer 669 which has one-conductivity type is formed over the semiconductor layer 663 and the insulating layers 667 and 668. Then, insulating layers 670 and 671 serving as masks are formed in a place overlapping the insulating layers 667 and 668 serving as channel protective layers by selectively discharging a composition over the semiconductor layer 669.

Figure 18B:
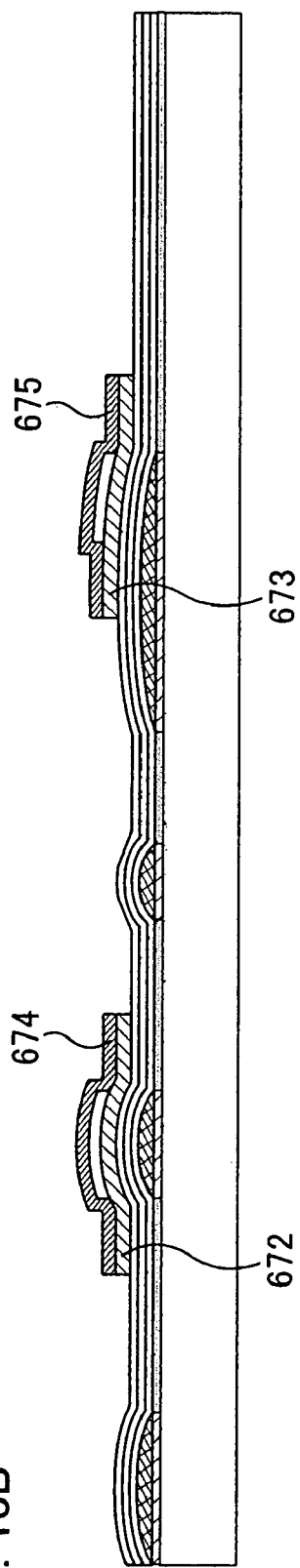
Figure 18C:
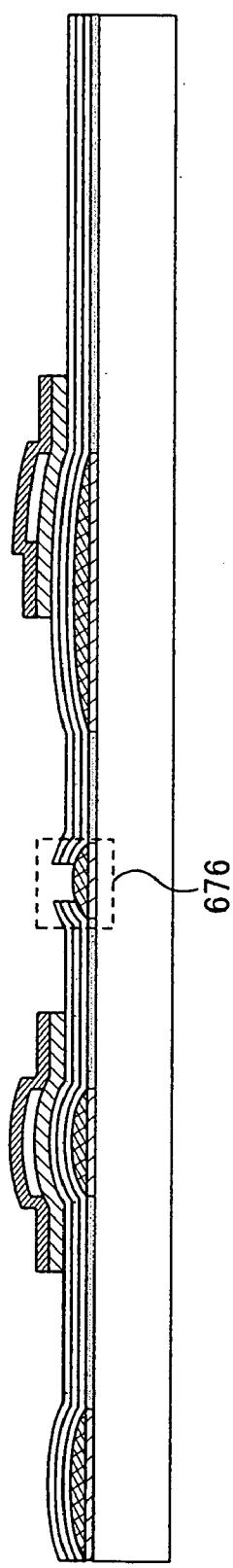

Next, using the insulating layer 670 and 671 as masks, semiconductor layers 672, 673 and semiconductor layers 674 and 675 which have one-conductivity type are formed by simultaneously etching the semiconductor layer 663 and the semiconductor layer 669 which has one-conductivity type (FIG. 18B). Subsequently, an opening 676 is formed by etching the insulating layers 660 to 662 approximately at atmospheric pressure so that the conductive layer 654 is exposed (FIG. 18C). Accordingly, etching treatment is carried out by generating plasma with the use of a source gas such as NF 3, CFx (fluorocarbon), $SF_6$, or Cox, and a mixed gas of one of hydrogen and oxygen with a rare gas.

Figure 19A:
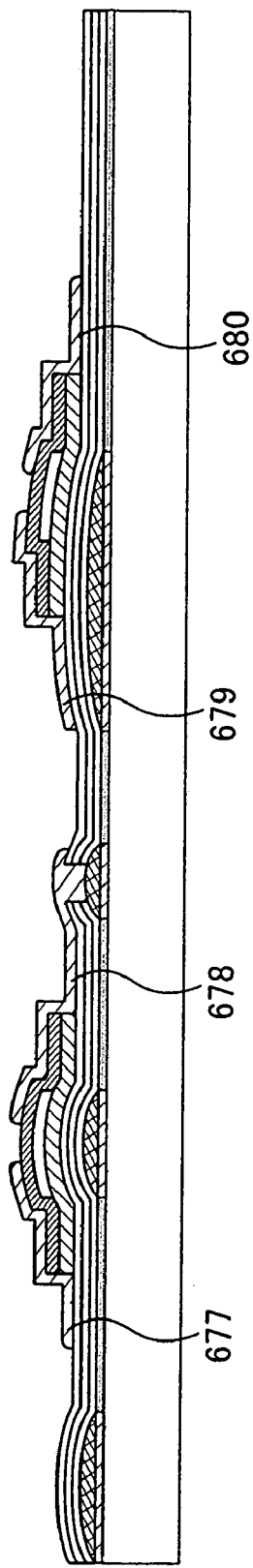
FIGS. 19A to 19C are views describing a method for manufacturing a thin film transistor and a method for manufacturing a display device of the invention.
Figure 19B:
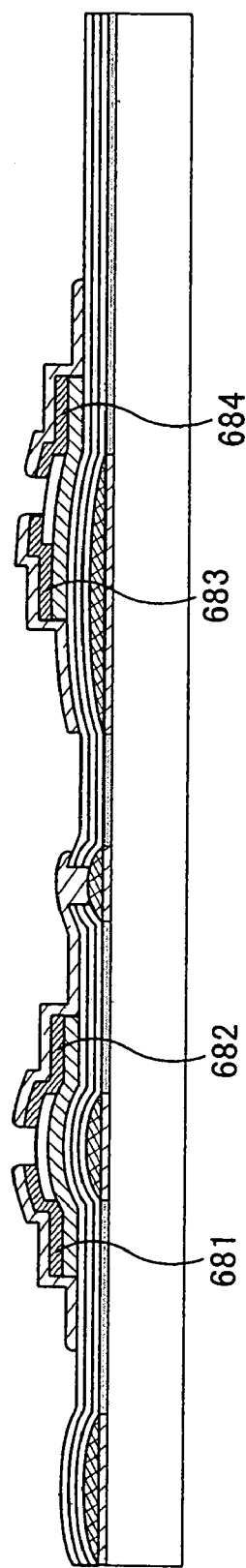

Next, conductive layers 677 to 680 serving as source wirings and drain wirings are formed on the semiconductor layers 674 and 675 which have one-conductivity type by selectively discharging a composition containing a conductive material (FIG. 19A). The conductive layer 678 is formed to fill the opening 676, thereby electrically connecting with the conductive layer 654 serving as a connection wire. Subsequently, using the conductive layers 677 to 680 as masks, the semiconductor layers 681 to 684 are formed by etching the semiconductor layers 674, 675 (FIG. 19B).

Figure 19C:
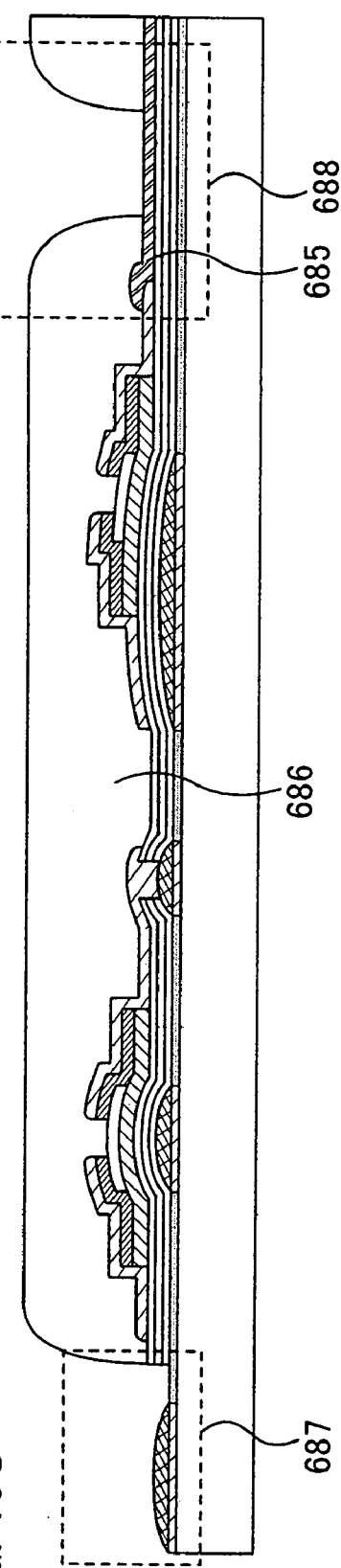

A conductive layer 685 serving as a pixel electrode is formed by selectively discharging a composition containing a conductive material (FIG. 19C). Next, after forming an insulating layer 686 over an entire surface with spin coating, dip method, or the like, openings 687 and 688 are formed with a known method such as photolithography, a droplet discharge method, or the like. The insulating layer 686 functions as a bank and is formed with the use of a material containing silicon, an organic material such as acrylics or a compound material such as siloxane polymer. However, when a photosensitive material such as acrylics, or polyimide, and a non-photosensitive material are used to form the insulating layer 686, a side surface of the insulating layer 686 has curvature radius which changes continuously, thus, a layer over the insulating layer 686 can be formed without a break. When an organic material is used, a metal film such as Ti, a nitride film such as TiN, and a silicide film such as TiSix or MoSix are formed as a barrier film of a single layer or a laminated structure to prevent degassing and the like. This barrier film results in increase in adhesion and the conductive layer 685 provided over the barrier film is implanted thereover, and furthermore decrease and stability in contact resistance can be obtained. Furthermore, formation of the openings may be carried out by discharging wet etchant from a nozzle. Note that a step of appropriately washing with a solvent such as water may be added to control an aspect ratio of the openings. Of course, in this washing step, a drop discharged from a nozzle is replaced with water by using a droplet discharge method, or a head filled with solution is replaced. Therefore, it becomes possible to carry out continuous treatment with one device, which is preferable in terms of processing time. Photolithography may be used for forming the openings; however, a droplet discharge method may be used at least for forming an insulating layer that serves as a mask. Accordingly, a usage rate of a material is remarkably improved compared with spin coating. When the openings 687 and 688 are formed with any one of the above methods, the conductive layers 652 and 685 are in an exposed state.

Figure 16:
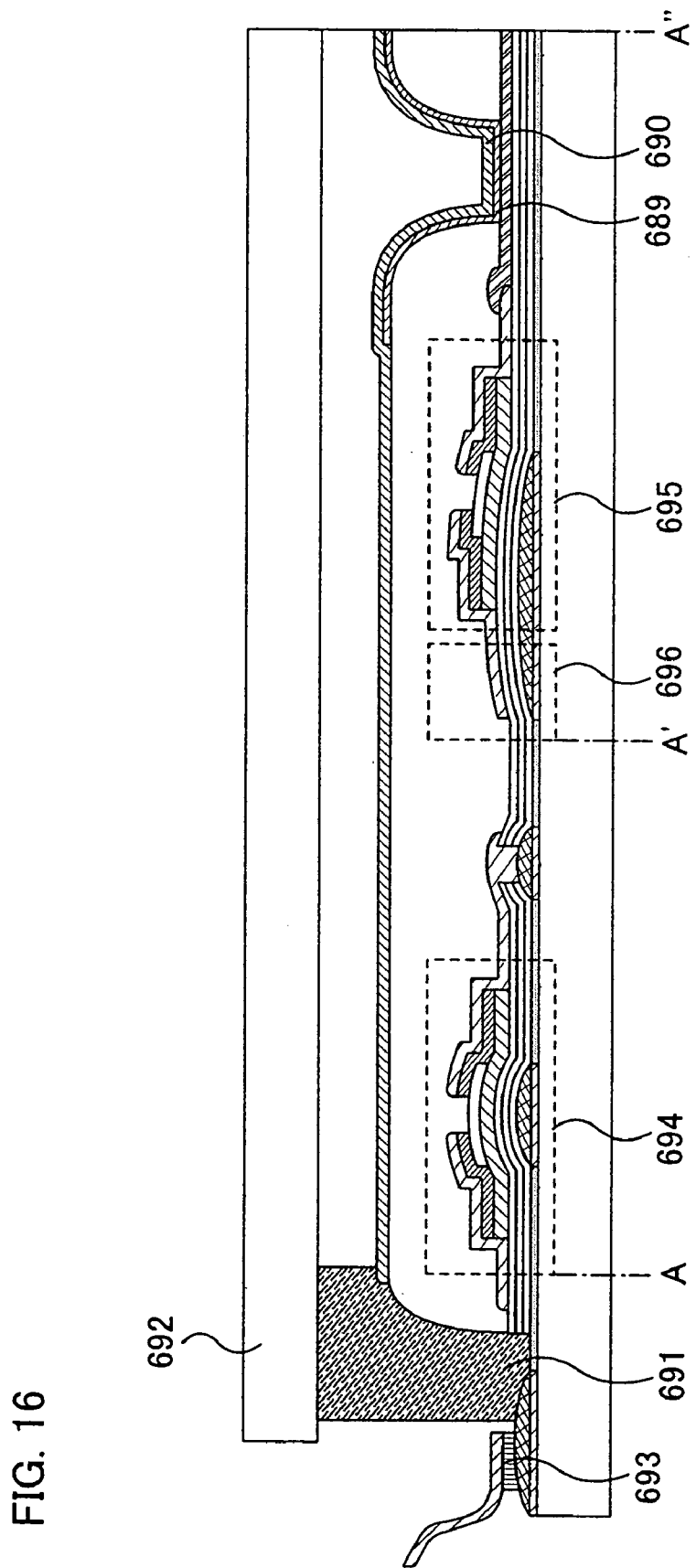
FIG. 16 is a view describing a method for manufacturing a display device of the invention.

An electroluminescent layer 689 is formed to electrically connect with the conductive layer 685, and a conductive layer 690 that serves as a counter electrode is formed on the electroluminescent layer 689 (FIG. 16). The conductive layer 685, the electroluminescent layer 689, and the conductive layer 690 correspond to a light-emitting element. In forming the light-emitting elements, the electroluminescent layer 689 and a plurality of other thin films can be formed continuously by changing a composition discharged from a nozzle or by changing a head filled with a composition. Accordingly, throughput is improved, which is preferable for improving the productivity.

Subsequently, a sealant 691 is formed to seal the substrates 692 and 650. Subsequently, an anisotropic conductive film is provided so that the conductive layer 652 and a connection terminal 693 are electrically connected. The connection terminal 693 transmits a signal and power supply potential from outside.

Figure 20:
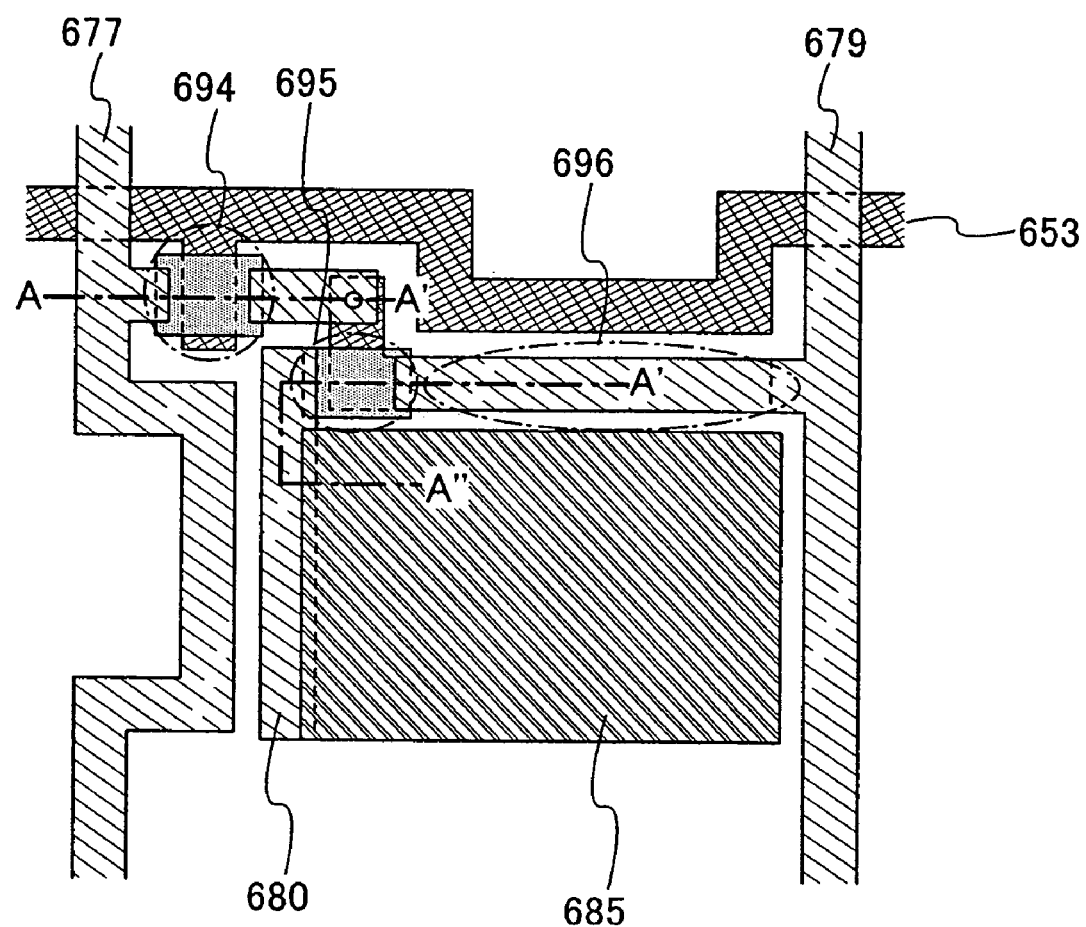
FIG. 20 is a layout view of a pixel circuit.

Through the above steps, a display device including a channel protective type switching TFT 694, a drive TFT 695, and a capacitor element 696 is completed. A top view of this time is as shown in FIG. 20. Further, a cross-sectional view taken along lines A–A' and A–A" in FIG. 20 is shown in FIG. 16.

In the above structure, the conductive layer 685 refers to a cathode and the conductive layer 690 refers to an anode and through the above steps, a reversely laminated element of a cathode/an electroluminescent layer/an anode is completed. In this case, light emitted from a light-emitting element is emitted to a side of the substrate 692. Therefore, a display device of top emission is completed. A shield or a reflector may be provided over the conductive layer 690 so that light can be emitted to a side of the substrate 650. Furthermore, a conductive layer that serves as a cathode and a conductive layer that serves as an anode are each formed of a light-transmitting material or to a thickness thin enough to transmit light to make dual emission.

In addition, the conductive layer corresponding to the cathode preferably uses a material with low work function, for example Ca, Al, CaF, MgAg, or Al Li. An electroluminescent layer may apply any one of a single layer type, a lamination type, or a mixed type without interfaces between layers. Any one of a singlet material, a triplet material, or a combination thereof; an organic material containing low molecular weight material, a high molecular weight material, and middle molecular weight material; an inorganic material typified by molybdenum oxide superior in terms of electron injection; or a composite material of an organic material and an inorganic material may be used. It is preferable to form the conductive layer corresponding to the anode with a transparent conductive material that transmits light or to form it in a thickness thin enough to transmit light, and for example, a transparent conductive material in which zinc oxide (ZnO) and indium oxide are mixed besides ITO and ITOS. In forming an element formed in the order of an anode/an electroluminescent layer/a cathode, namely a normally laminated element, it is preferable to carry out plasma treatment in an oxygen atmosphere or heat treatment in vacuum before forming an anode, thereby reducing drive voltage and extending lifespan. In addition, when bottom emission in which light emitted from a light-emitting element transmits to a side of the substrate 650, the conductive layer 685 serving as a pixel electrode needs to be light transmitting. In this case, ITSO containing silicon oxide and ITO is used for the conductive layer 685, and the insulating layer 662 made of silicon nitride may be formed in the lower layer. Accordingly, light extraction efficiency of light emitted from a light-emitting element is improved since a refractive index of the conductive layer 685 and the insulating layer 662 is close.

An insulating layer in contact with a light-transmitting conductive layer is preferably formed of a layer containing silicon (Si) and nitrogen (N), and specifically formed of a layer containing nitrogen of 10 atomic % or more, preferably 25 atomic % or more, and more specifically formed of a silicon nitride film (SiN). In addition, it is preferable to form a layer containing nitrogen and oxygen (O), which contains much nitrogen than oxygen, and specifically to form a silicon nitride oxide film (SiNO). Then, an insulating layer in contact with a light-transmitting conductive layer is formed by laminating the two thin films of the above structure. With the above structure, current efficiency can be improved, and a bright display can be obtained by improving a luminance even at the same current value. In this step, a resist mask is not used, which is enabled by using a droplet discharge method. Therefore, saving of manufacturing time and reduction of a manufacturing cost are realized due to simplification of the steps. This embodiment can be arbitrarily combined with the above embodiments.

(Embodiment 6).

As an embodiment of the present invention, a method for manufacturing a channel-etch type thin film transistor is described with reference to FIGS. 22A to 22C. Furthermore, a method for manufacturing a display device with the use of the above thin film transistor is described with reference to FIG. 23.

A steps of forming conductive layers 602 to 604 serving as gate electrodes, insulating layers 608 to 610 serving as gate insulating films, and a semiconductor layer 611 serving as an active layer are as described in Embodiment 4 with the use of FIGS. 28A to 28C, of which description is abbreviated here.

Figure 22A:
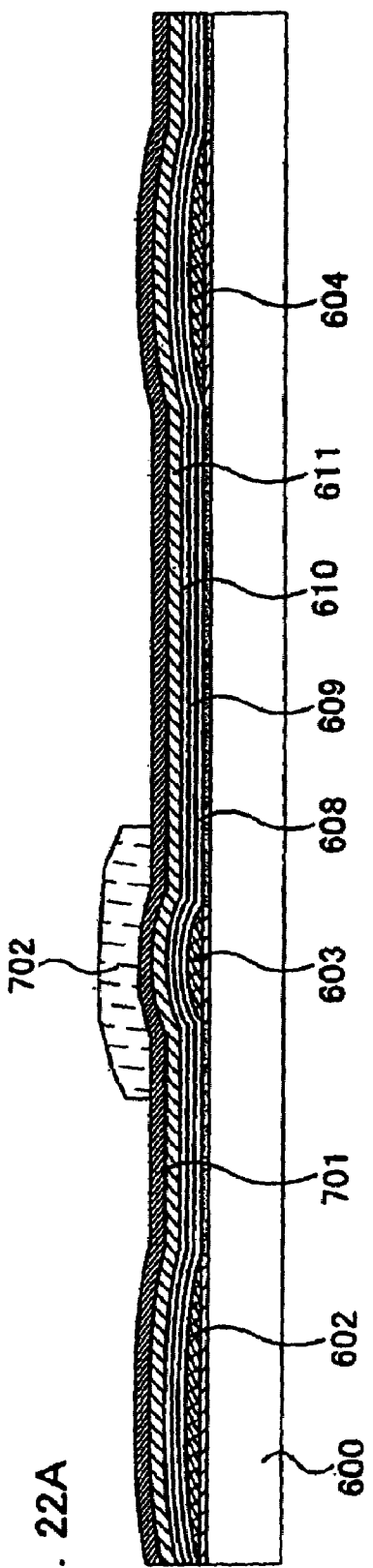
FIGS. 22A to 22C are views describing a method for manufacturing a thin film transistor of the invention.
Figure 22B:
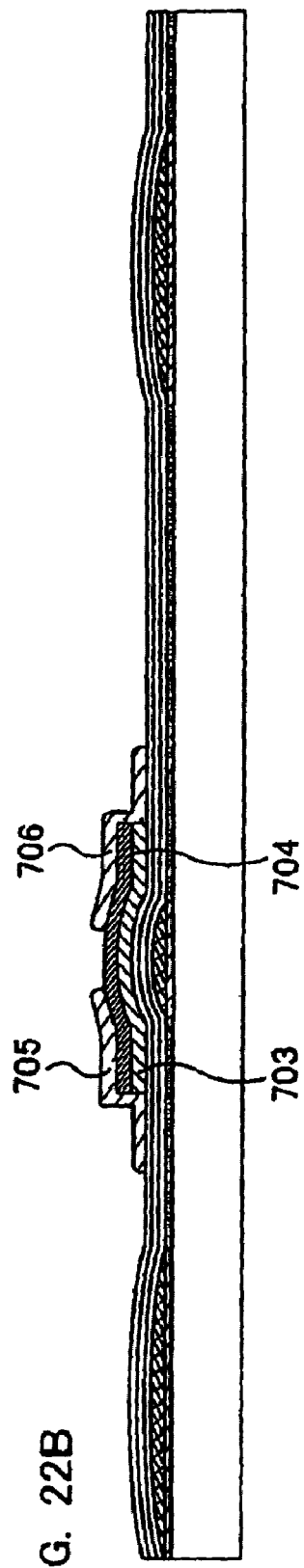
Figure 22C:
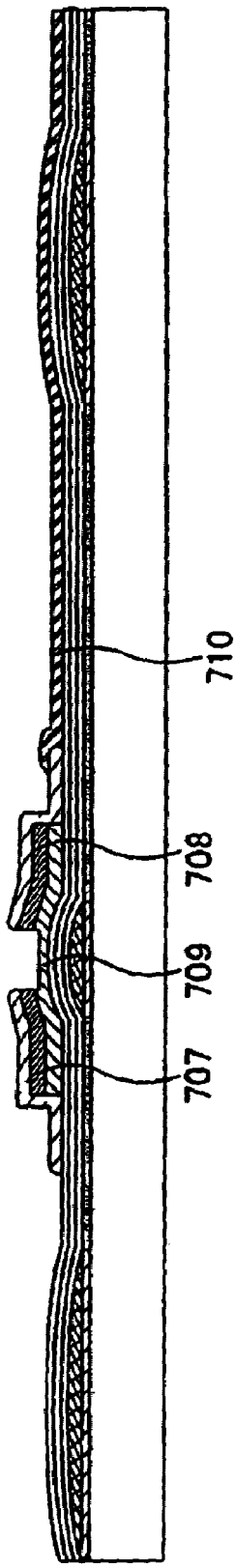

A semiconductor layer 701 which has one-conductivity type is formed on the semiconductor layer 611 (FIG. 22A). Next, an insulating layer 702 serving as a mask is formed in the position overlapping the conductive layer 603 serving as gate electrodes by selectively discharging a composition over the semiconductor layer 701. Subsequently, using the insulating layer 702 as a mask, a semiconductor layer 703 and a semiconductor layer 704 having one-conductivity type are formed by simultaneously etching the semiconductor layer 611 and the semiconductor layer 701 which has one-conductivity type (FIG. 22B). Thereafter, conductive layers 705 and 706 are formed by discharging a composition containing a conductive material over the semiconductor layer 704. Then, using the conductive layers 705 and 706 as masks, semiconductor layers 707, 708 are formed by etching the semiconductor layer 704 which has one-conductivity type. At this time, the semiconductor layer 703 is also etched a little and a semiconductor layer 709 is formed. Subsequently, a conductive layer 710 serving as a pixel electrode is formed by discharging a composition containing a conductive material to be electrically connected with the conductive layer 706 serving as a source or a drain wiring (FIG. 22C).

Figure 23:
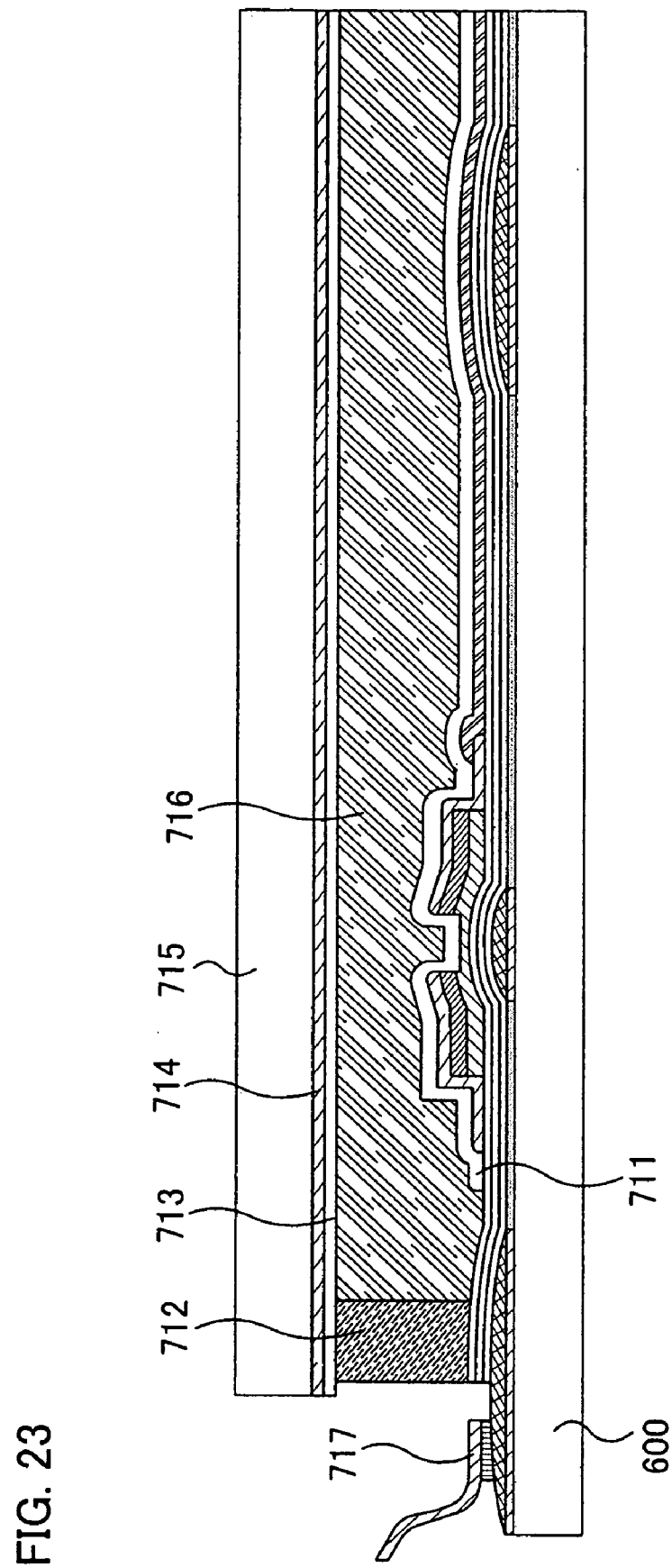
FIG. 23 is a view describing a method for manufacturing a display device of the invention.

Next, an insulating layer 711 serving as an alignment film is formed (FIG. 23). Subsequently, a sealant 712 is formed, and the substrate 600 is attached to a substrate 715 provided with a counter electrode 714 and an alignment film 713 by using the sealant 712. Thereafter, a liquid crystal 716 is injected between the substrate 600 and the substrate 715. Then, when a region in which a connection terminal 717 is attached is etched and exposed under atmospheric pressure or approximately at atmospheric pressure; the connection terminal 717 is attached; thus a display device having a display function is completed.

EXAMPLE

In this example, a method for mounting a driver IC will be described with reference to FIGS. 8A to 8E. The driver IC may be mounted by connection using an anisotropic conductive material, by wire bonding, and the like. An example of the mounting methods is explained with reference to FIGS. 8A to 8E.

Explanation is made on an example of a driver IC 208 mounted on a first substrate 201 by using an anisotropic conductive material. A pixel region 202, a lead wiring 206, and connection wiring and an input-output terminal 207 are formed on the first substrate 201. A second substrate 203 is attached to the first substrate 201 with a sealant 204, and a liquid crystal layer 205 is interposed therebetween.

An FPC 212 is attached to one side of connection wiring and an input-output terminal 207 by using an anisotropic conductive material. The anisotropic conductive material comprises a resin 215 and conductive particles 214 having a surface plated with Au and the like and of which diameter is tens to hundreds of µm. With the conductive particles 214, the connection wiring and an input-output terminal 207 are electrically connected to a wiring 213 formed in the FPC 212. The driver IC 208 is also attached to the first substrate 201 with an anisotropic conductive material. With conductive particles 210 included in a resin 211, input-output terminals 209 provided in the driver IC 208 are electrically connected to either the lead wiring 206 or the connection wiring and an input-output terminal 207.

Figure 8A:
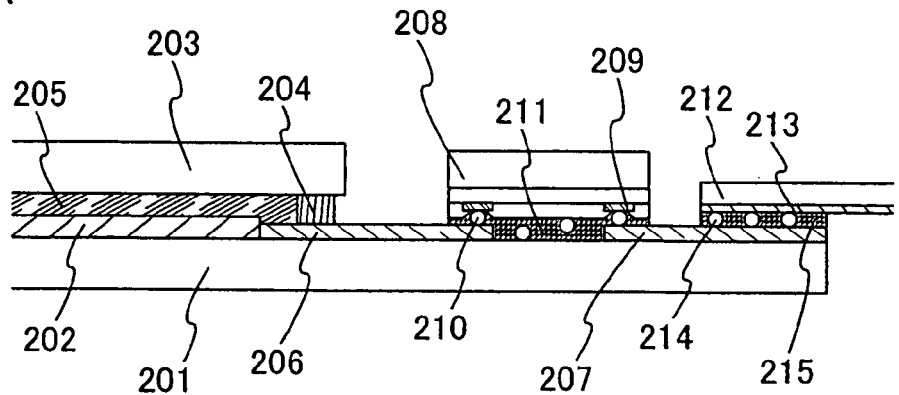
FIGS. 8A to 8E are views describing a connection of a pixel region, a FPC, and a driver IC.
Figure 8B:
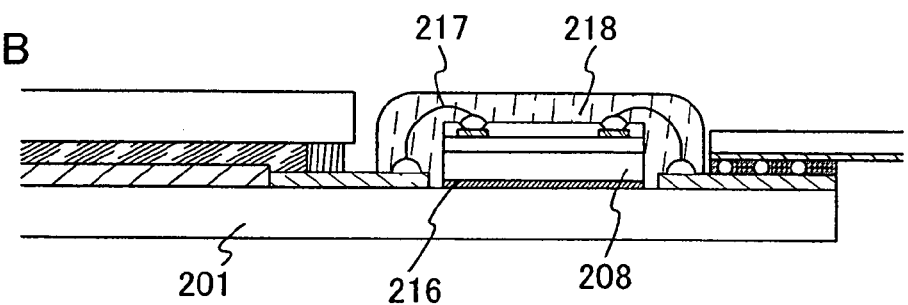
Figure 8C:
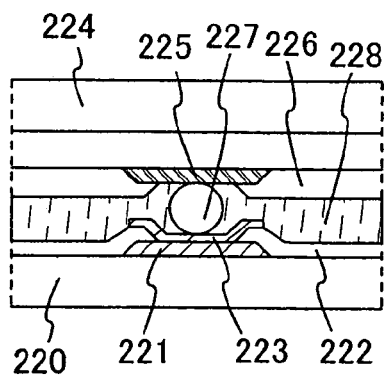

With reference to FIG. 8C, further explanation is made on a mounting method of the driver IC 208 obtained in this manner. A driver IC 224 comprises input-output terminals 225, and a protective insulating layer 226 is formed at the periphery of the input-output terminals 225. Conductive layer 221, a second conductive layer 223, and an insulating layer 222 are formed over a first substrate 220. Here, a lead wiring or a connection wire is formed of the first conductive layer 221 and the second conductive layer 223.

These conductive layers 221 and 223 and the insulating layer 222 which are formed over the first substrate 220 can be formed in the same step as that of forming a pixel TFT in a pixel region. For example, in the case where a pixel TFT is formed in an inverted staggered TFT, the first conductive layer 221 is formed in one layer in which a gate electrode is formed, and formed of a material such as Ta, Cr, Ti, or Al. In general, a gate insulating layer is formed on a gate electrode, and the insulating layer 222 is formed in the same layer as this. The second conductive layer 223 laminated on the first conductive layer 221 is formed of the same transparent conductive film as a pixel electrode, which allows the second conductive layer 223 to be connected well to conductive particles 227. The size and density of the conductive particles 227 included in a resin 228 is optimized, so that the driver IC 224 is electrically connected to the first substrate 220.

Figure 8D:
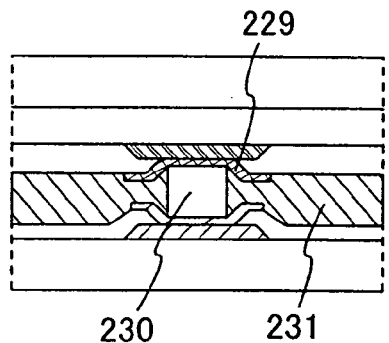

An example of a COG system using a contraction force of a resin is described in FIG. 8D. A barrier layer 229 is formed of a material such as Ta and Ti on the driver IC 224 side, and a bump 230 formed of Au with a thickness of about 20 µm is formed thereon by electroless plating or the like. Then, a photocurable insulating resin 231 is disposed between the driver IC 224 and the first substrate 220, and the electrodes are pressed onto each other by utilizing the contraction force of the resin that is set by photo-curing, thereby making an electrical connection.

Figure 8E:
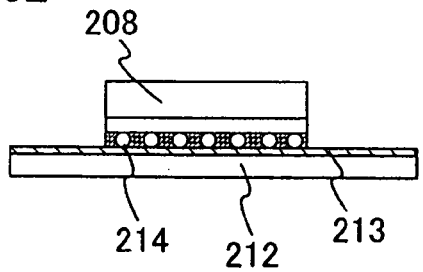

In addition, as shown in FIG. 8E, a driver IC 208 may be provided by interposing a wiring 213 on a FPC 212 and conductive particles 214 therebetween. This structure is extremely useful for applying to an electronic apparatus such as a portable information terminal whose housing is limited in size.

As shown in FIG. 8B, a driver IC 208 is fixed to a first substrate 201 with an adhesive 216, and input-output terminals of the driver IC 208 are connected to either a lead wiring or a connect wiring with an Au wire 217. Then, a sealing resin 218 is used here for sealing. There is no limitation on a mounting method of the driver IC 208, and a known method such as COG, wire bonding, or TAB may be used as well.

The driver IC 208 is formed to have the same thickness as that of the second substrate 203 comprising a counter electrode. Accordingly, they can have almost the same height, which results in a thin display device as a whole. In addition, each substrate is formed of one material; therefore, thermal stress is not generated even when the temperature in the display device is changed, and thus properties of the circuit made up of TFTs are not damaged. Moreover, as shown in this embodiment, a driver circuit is mounted with a driver IC that is longer than an IC chip so that the number of a driver IC to be mounted in a pixel region can be reduced. This example can be arbitrarily combined with the above embodiments.

EXAMPLE 2

Figure 9A:
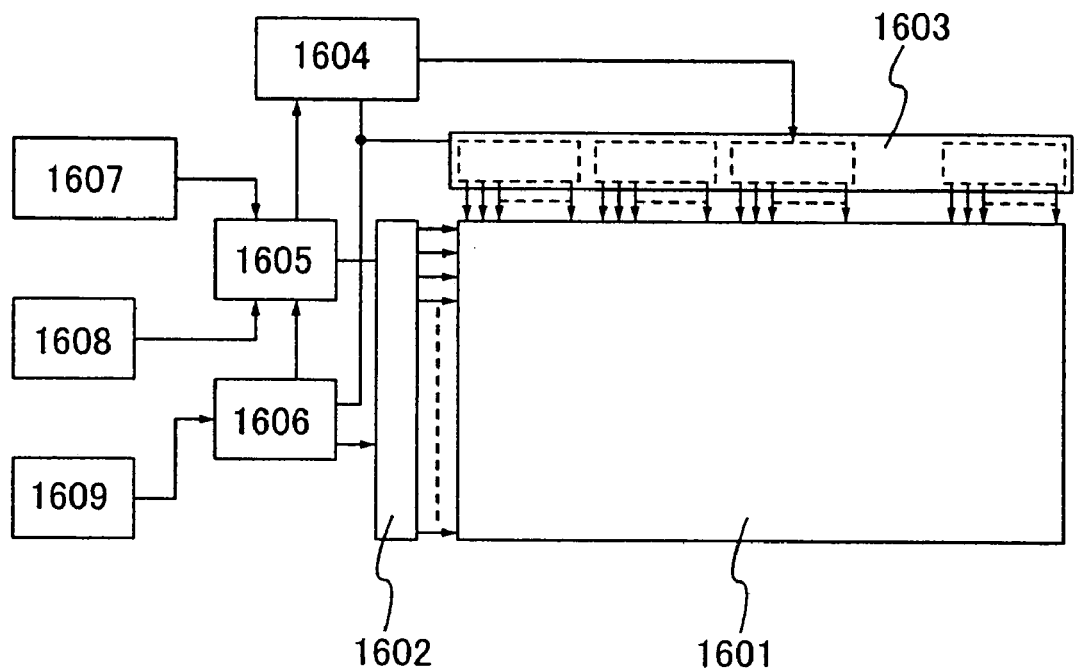
FIGS. 9A and 9B are views describing a structure of a display device of the invention.
Figure 9B:
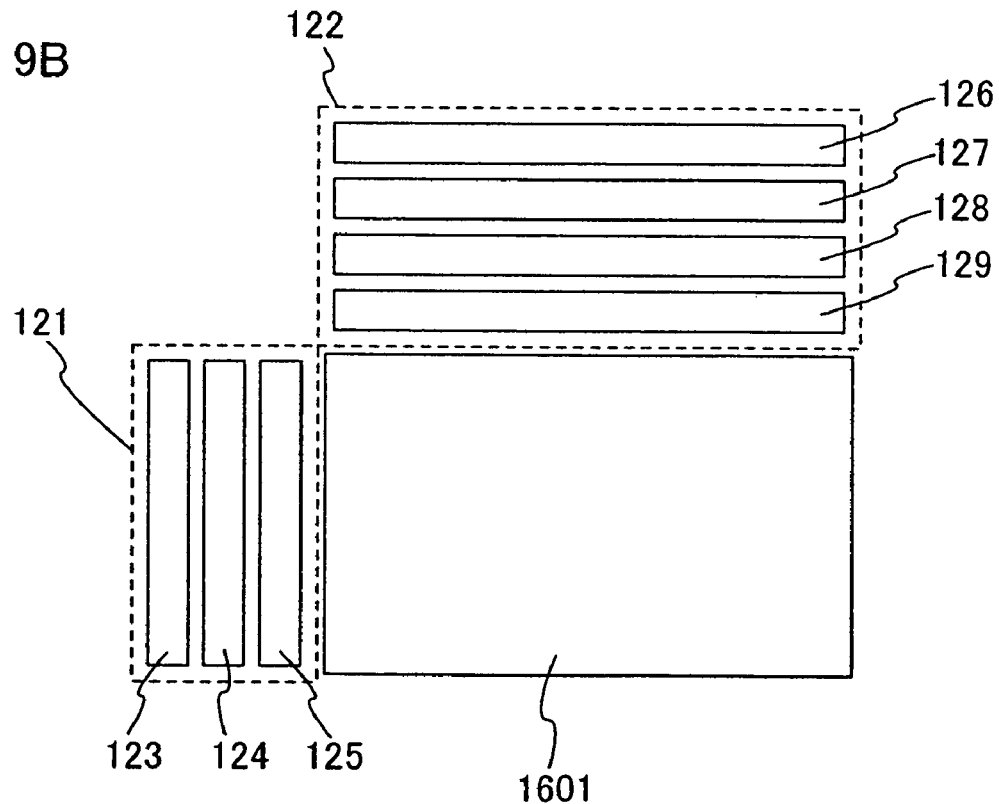

In this example, a configuration of a display device of the present invention is briefly described. As mentioned above, a driver IC is used as a driver circuit of a liquid crystal display device or an EL display device. FIGS. 9A and 9B are block diagrams of such display device. A pixel region 1601 is formed of a plurality of scanning lines and data lines, which may be either in an active matrix type in which TFTs are provided or in a passive matrix type may be adopted. In the periphery of the pixel region 1601, a scanning line driver circuit 1602 and a data line driver circuit 1603 which correspond to driver ICs are disposed.

A clock signal, a start pulse 1607, and a video signal 1608 inputted from outside are inputted to a control circuit 1605 for converting to an input specification of the driver IC, and converted to each timing specification. A power supply 1609 and a is power supply circuit 1606 composed of an operation amplifier are externally provided. For the effective reduction in size of the display device, it is preferable that also the control circuit 1605 and the power supply circuit 1606 are mounted by TAB.

The control circuit 1605 outputs a signal to each of the scanning lines and the data lines. At this time, a digital input signal is divided into m signals in a signal divider circuit 1604 to be inputted to the data lines. The number of divisions m is a natural number of 2 or more, and practically, 2 to 16 divisions are suitable.

Figure 12A:
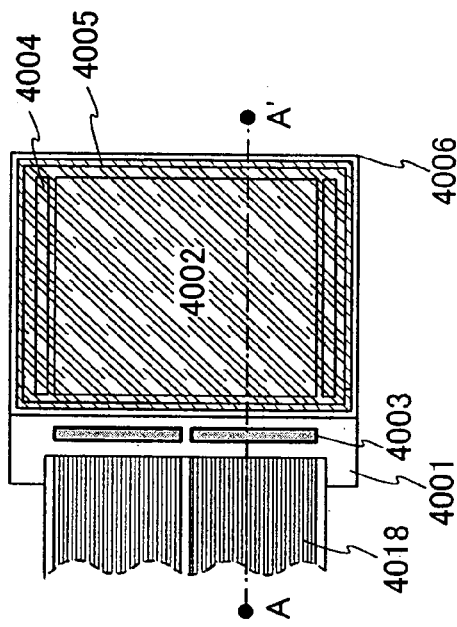
FIGS. 12A and 12B are a top view and a cross-sectional view of a panel that is mode of a display device of the invention.
Figure 12B:
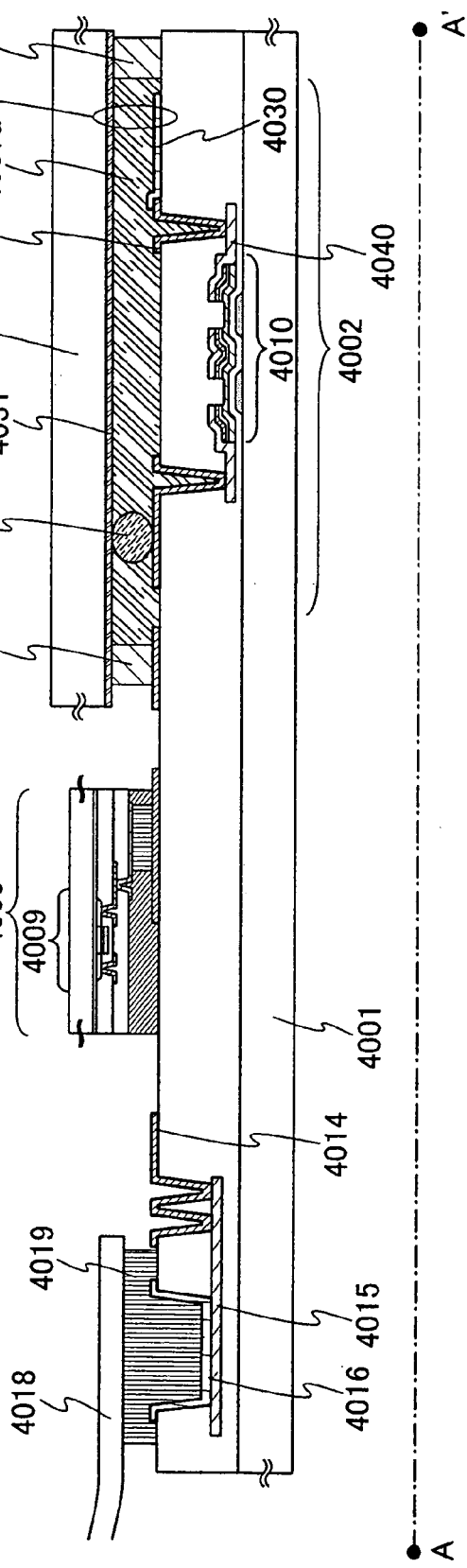

A circuit configuration of the driver IC in the scanning line differs from that in the data line. FIG. 9B shows an example of such configuration. A scanning line driver IC 121 comprises a shift register circuit 123, a level shifting circuit 124, and a buffer circuit 125. On the other hand, a data line driver IC 122 comprises a shift register circuit 126, a latch circuit 127, a level shifting circuit 128, and a D/A converter circuit 129. It is shown in FIGS. 12A and 12B in which a driver IC is used both on a signal line and a scanning line; however, the invention is not limited thereto as mentioned above. As well as the pixel region 1601, the scanning line driver circuit may be built over one substrate. This example can be arbitrarily combined with the above embodiments and example.

EXAMPLE 3

In this example, a configuration of a droplet discharge method is described with reference to FIGS. 10A and 10B. First, a droplet discharge device is described briefly with reference to FIG. 10A. A droplet discharge means equipped with a head in which a plurality of nozzles is arranged in a uniaxial direction (not shown), a controller and a CPU controlling the droplet discharge means (not shown), a stage 503 which fixes a substrate 501 and moves the substrate in a XYθ direction, and the like are given as indispensable components of this device. A fixator (a frame) in which the droplet discharge means is provided has a configuration in which the droplet discharge means shown in FIG. 10B is fixed. The stage 503 has a function to fix the substrate 501 with a vacuum chuck method or the like. Then, a pattern is formed on the substrate 501 by discharging a composition in a direction of the substrate 501 from discharge openings of each nozzle with the droplet discharge means.

The stage 503 and the droplet discharge means are controlled by a CPU through a controller. Imaging means such as a CCD camera (not shown) is also controlled by the CPU. Imaging means detects position of a marker and the detected information is provided to the CPU. In forming a pattern, the droplet discharge means may be moved and the stage 503 may be moved while fixing the droplet discharge means. Note that when the droplet discharge means is moved, it is necessary to take into account acceleration of dropping a composition, a distance between nozzles provided in the droplet discharge means and a substrate to be treated, and the surroundings.

Besides, not shown, in order to improve accuracy of dropping a discharged composition at a desired place, as an accompanying component, a system for moving the droplet discharge means up and down, the control means thereof, or the like may be provided. Accordingly, depending on the properties of the discharged composition, a distance between a head and the substrate 501 can be changed. In addition, a clean unit or the like in which clean air and reducing dust in a work area may be provided. A means for measuring physical properties such as heating means for a substrate, temperature, pressure, or the like may be provided if necessary, which can be controlled collectively with a control means provided outside of a chassis. Furthermore, when the control means is connected to a production control system with a LAN cable, a wireless LAN, an optical fiber, or the like, it is possible to control the steps from outside, which results in improving productivity. In order to fasten drying of a discharged composition, or to remove a solvent component of the composition, the droplet discharge means may be carried out under low pressure by evacuating.

Figure 10A:
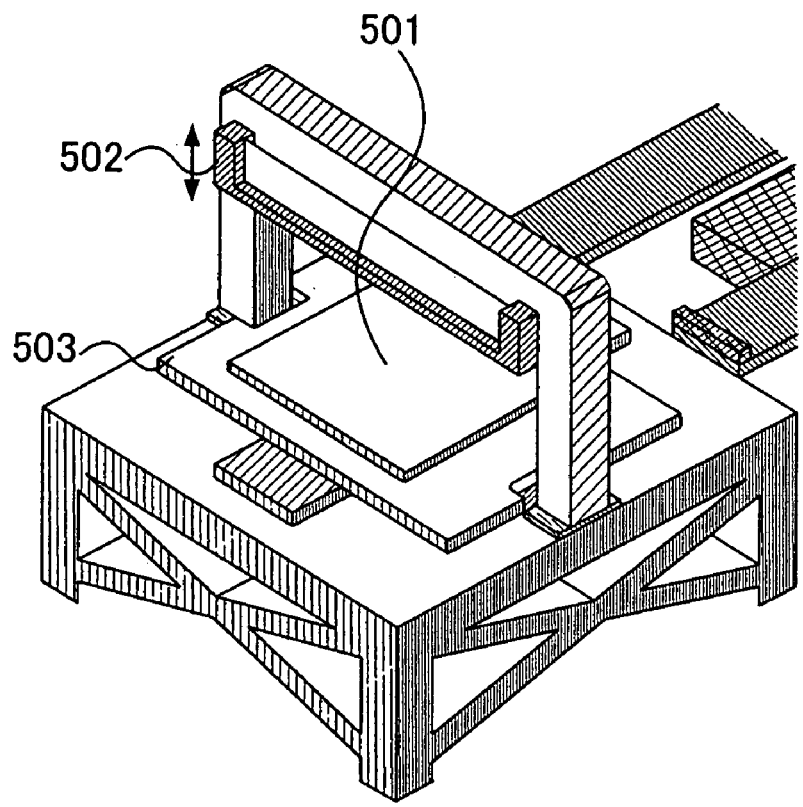
FIGS. 10A and 10B are views showing an example of a droplet discharge device.
Figure 10B:
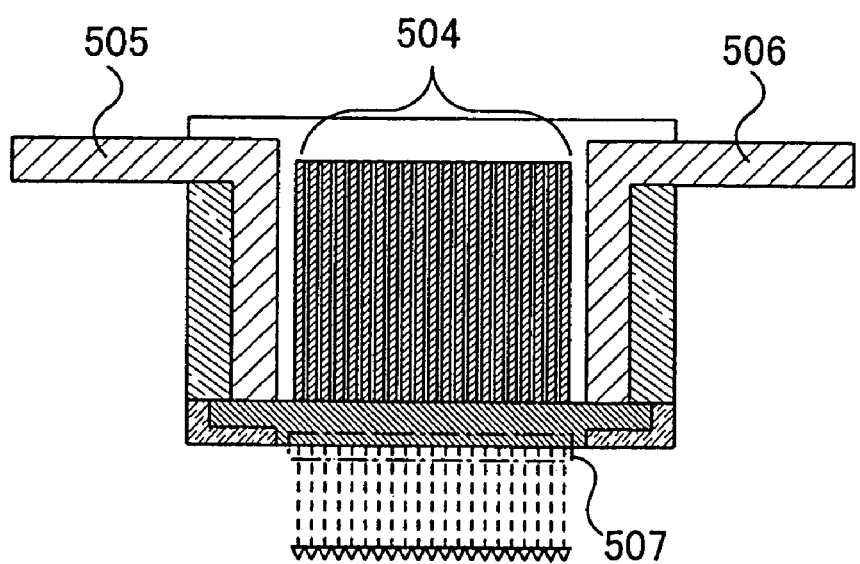

In FIG. 10B, reference numeral 504 denotes a piezoelectric element, fixators (frames) 505 and 506 are used to fix to the fixator (frame) 502 shown in FIG. 10A. Reference numeral 507 denotes a discharge opening. In FIG. 10B, the case of so-called a piezo system with the use of a piezoelectric element is shown; however, a system of pushing out solution using bubbles created by heating may be used depending on some solution material. In this case, a piezoelectric element is replaced with a heating element. In addition, wettability of solution with a liquid chamber channel, a pre-liquid chamber, a fluid resistance portion, a compression chamber, and a solution discharge opening is important. Therefore, a carbon film, a resin film, or the like may be formed in flow path for adjusting wettability with a material. In addition, a wiring, a supply pipe, and the like are provided inside of the fixators (frames) 505 and 506. When the droplet discharge means shown in FIG. 10B is attached to the device shown in FIG. 10A, the wiring is connected to a drive circuit for controlling a piezoelectric element, and the supply pipe is connected to a tank filled with a composition. This example can be arbitrarily combined with the above embodiments and examples.

EXAMPLE 4

A TFT in which a semi-amorphous semiconductor layer is used as a channel region is nominated as an indispensable component of the present invention, and the TFT is provided in each pixel. When such a TFT is included in each pixel, also a driver circuit formed on one substrate is preferably formed of a TFT that uses a semi-amorphous semiconductor layer as a channel region. However, a TFT including a semi-amorphous semiconductor layer can form only an n-type TFT. An example in which a shift register is formed only with an n-type TFT is described in this example.

Figure 11A:
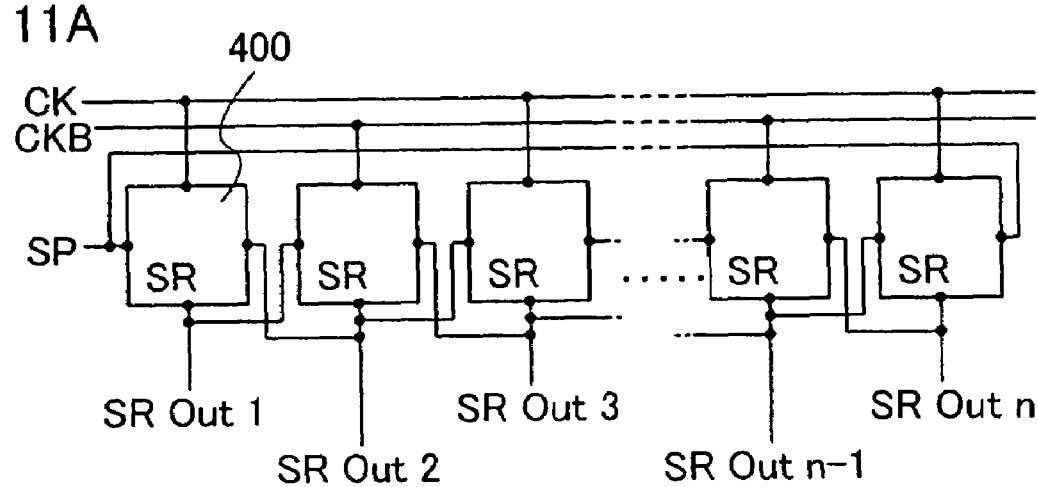
FIGS. 11A and 11B are circuit views of a shifting register composed only of an n-type TFT.
Figure 11B:
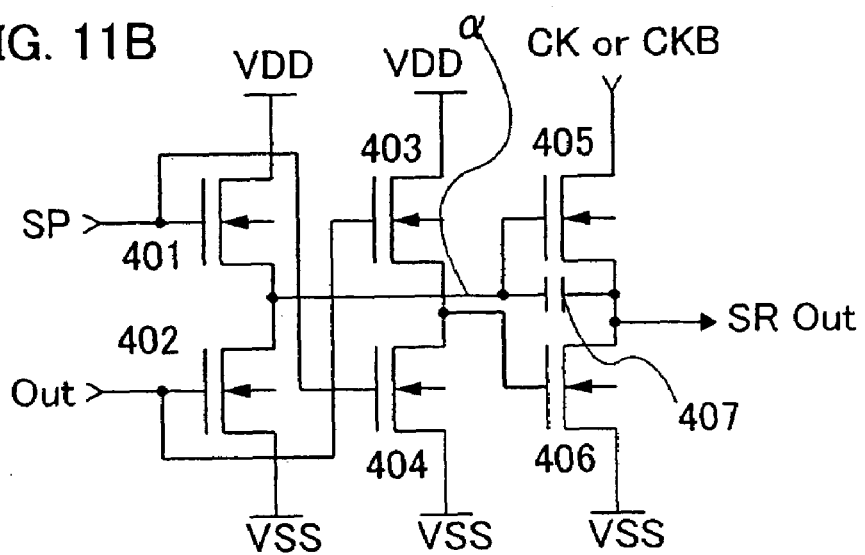

In FIG. 11A, a block shown by reference numeral 400 corresponds to a pulse output circuit that outputs a sampling pulse for one step, and a shift register is composed of the number n of pulse output circuits. FIG. 11B shows a specific configuration of the pulse output circuit 400, which includes n-type TFTs 401 to 406 and a capacitor element 407. It is possible for this pulse output circuit to be composed only of an n-type TFT by applying a bootstrap method. The specific operation is described in Japanese Patent Laid-Open No. 2002-335153.

An example of composing the pulse output circuit only with an n-type TFT is shown in this example; however, the invention is not limited thereto. This example can be arbitrarily combined with the above embodiments and examples.

EXAMPLE 5

In the present invention, a TFT in which a semi-amorphous semiconductor layer is assumed as a channel region and a display device including a plurality of pixels having the TFT, and the structure of the pixels are described with reference to FIGS. 15A to 15F.

Figure 15A:
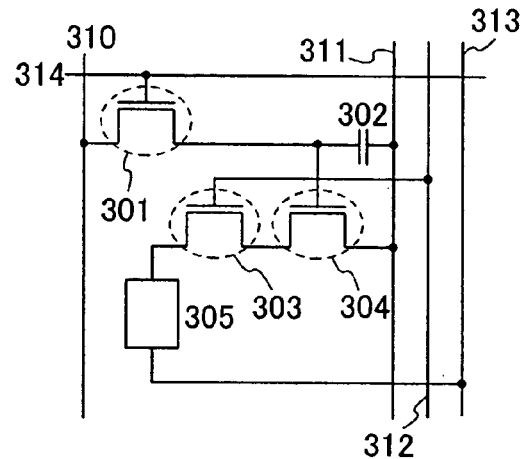
FIGS. 15A to 15F are views showing an example of a pixel circuit of a display device.

In a pixel shown in FIG. 15A, a signal line 310 and power supply lines 311 to 313 are arranged in columns, and a scanning line 314 is arranged in a row. The pixel also includes a switching TFT 301, a driver TFT 303, a current controlling transistor 304, a capacitor element 302, and a light-emitting element 305.

Figure 15B:
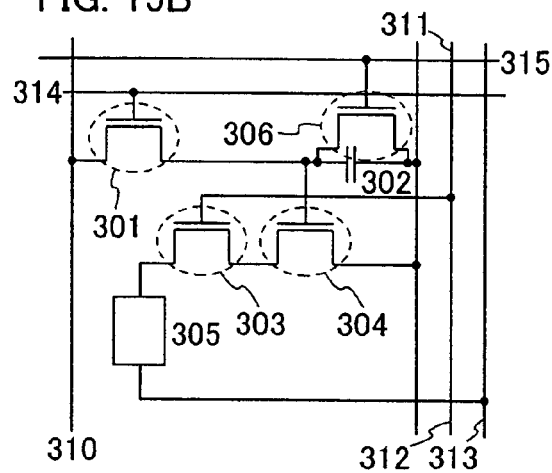
Figure 15C:
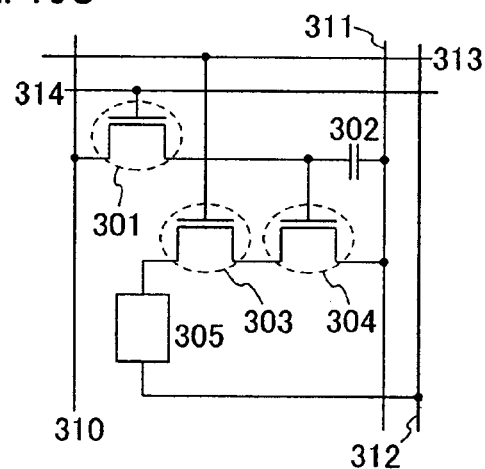
Figure 15D:
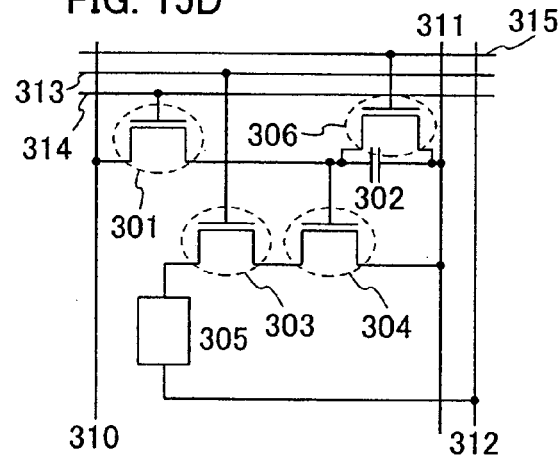

A pixel shown in FIG. 15C has the same configuration as the one shown in FIG. 15A, except that a gate electrode of the driver TFT 303 is connected to the power supply line 313 arranged in a row. Both pixels in FIGS. 15A and 15C show the same equivalent circuit schematic. However, each power supply line is formed of conductors in different layers in between the cases where the power supply line 312 is arranged in a column (FIG. 15A) and where the power supply line 312 is arranged in a row (FIG. 15C). The two pixels are each shown in FIGS. 15A and 15C in order to show that layers for forming a wiring connected to the gate electrode of the driver TFT 303 are different in between FIGS. 15A and 15C.

In both FIGS. 15A and 15C, the driver TFT 303 and the current controlling transistor 304 are connected in series in the pixel, and the ratio of the chanenel length $L_3$/the channel width $W_3$ of the driver TFT 303 to the channel length $L_4$/the channel width $W_4$ of the the current controlling transistor is set as $L_3/W_3:L_4/W_4=5$ to 6000:1. For example, when $L_3$, $W_3$, $L_4$, and $W_4$ are 500 μm, 3 μm, 3 μm, and 100 μm, respectively.

The driver TFT 303 is operated in a saturation region and controls the amount of current flowing in the light-emitting element 305, whereas the current controlling transistor 304 is operated in a linear region and controls a current supplied to the light-emitting element 505. The TFTs 303 and 304 preferably have the same conductivity in view of the fabrication steps. For the driver TFT 303, a depletion type TFT may be used instead of an enhancement type TFT. According to the invention having the above structure, slight variations in $V_{GS}$ of the current controlling transistor 304 does not affect the amount of current flowing in the light-emitting element 305, since the driver TFT 303 is operated in a linear region. That is, the amount of current flowing in the light-emitting element 305 is determined by the driver TFT 303 operated in a saturation region. Accordingly, it is possible to provide a display device in which image quality is improved by improving variations in luminance of the light-emitting element due to variation of the TFT properties.

The switching TFT 301 in FIGS. 15A to 15D controls a video signal input to the pixel. When the switching TFT 301 is turned ON and a video signal is inputted to the pixel, the video signal is held in the capacitor element 302. Although the pixel includes the capacitor element 302 in FIGS. 15A to 15D, the invention is not limited thereto. When a gate capacitance and the like can serve as a capacitor for holding a video signal, the capacitor element 302 is not necessarily provided.

The light-emitting element 305 has a structure in which an electroluminescent layer is interposed between a pair of electrodes. A pixel electrode and a counter electrode (an anode and a cathode) have a potential difference therebetween so that a forward bias voltage is applied. The electroluminescent layer is formed of at least one material selected from various organic materials, inorganic materials, and the like. The luminescence in the electroluminescent layer includes luminescence that is generated when an excited singlet state returns to a ground state (fluorescence) and luminescence that is generated when an exited triplet state returns to a ground state (phosphorescence).

A pixel shown in FIG. 15B has the same configuration as the one shown in FIG. 15A, except that a TFT 306 and a scanning line 315 are added. Similarly, a pixel shown in FIG. 15D has the same configuration as the one shown in FIG. 13C, except that a TFT 306 and a scanning line 315 are added.

The TFT 306 is controlled to be ON/OFF by the added scanning line 315. When the TFT 306 is turned ON, charges held in the capacitor element 302 are discharged, thereby turning the TFT 306 OFF. That is, supply of a current to the light-emitting element 305 can be forcibly stopped by providing the TFT 306. Therefore, a lighting period can start simultaneously with or shortly after a writing period starts before signals are written into all the pixels by adopting the configurations shown in FIGS. 13B and 13D, thus, the duty ratio can be improved.

Figure 15E:
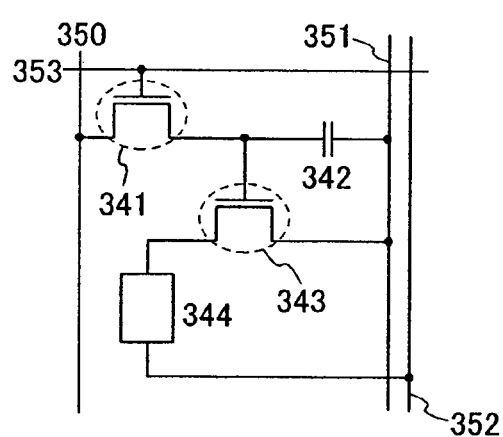
Figure 15F:
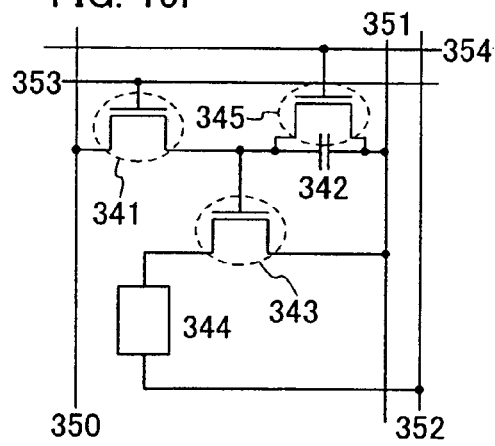

In a pixel shown in FIG. 15E, a signal line 350 and power supply lines 351 and 352 are arranged in columns, and a scanning line 353 is arranged in a row. The pixel further includes a switching TFT 341, a driver TFT 343, a capacitor element 342, and a light-emitting element 344. A pixel shown in FIG. 15F has the same configuration as the one shown in FIG. 15E, except that a TFT 345 and a scanning line 354 are added. It is to be noted that the configuration of FIG. 15F also allows a duty ratio to be improved by providing the TFT 345. This example can be arbitrarily combined with the above embodiments and examples.

EXAMPLE 6

An appearance of a panel corresponding to mode of a display device of the present invention is described in this example with reference to FIGS. 12A and 12B. FIG. 12A shows a top view of the panel in which a semi-amorphous transistor 4010 and a liquid crystal element 4011a formed over a first substrate 4001 are sealed between a second substrate 4006 with a sealant 4005, and FIG. 12B corresponds to a cross-sectional view in A–A' of FIG. 12A.

The sealant 4005 is provided to surround a pixel portion 4002 provided on the first substrate 4001 and a scanning line driver circuit 4004. The second substrate 4006 is provided over the pixel portion 4002 and the scanning line driver circuit 4004. Therefore, the pixel portion 4002 and the scanning line driver circuit 4004 are sealed with a liquid crystal 4007a by the first substrate 4001, the sealant 4005, and the second substrate 4006. In a region other than a region which is surrounded with the sealant 4005 over the first substrate 4001, a signal line driver circuit 4003 formed of a so polycrystalline semiconductor layer is mounted on a substrate provided separately.

An example of attaching a signal line driver circuit having a transistor formed with a polycrystalline semiconductor layer to the first substrate 4001 is described in this example; however, a signal line driver circuit having a transistor formed with a single crystalline semiconductor layer may be formed and attached. A transistor 4009 formed of a polycrystalline semiconductor layer included in the signal line driver circuit 4003 is shown in FIGS. 12A and 12B. In addition, an example of mounting the signal line driver circuit 4003 formed separately to the first substrate 4001 is shown; however, this example is not limited thereto. A scanning line driver circuit may be separately formed and mounted, or only a part of a signal line driver circuit or a part of a scanning line driver circuit may be formed separately and mounted.

There is a plurality of transistors in the pixel portion 4002 and the scanning line driver circuit 4004 provided on the first substrate 4001, and the transistor 4010 included in the pixel portion 4002 is shown in FIG. 12B. The transistor 4010 corresponds to a transistor using a semi-amorphous semiconductor layer. In addition, a pixel electrode 4030 included in the liquid crystal element 4011a is connected with the transistor 4010 through a wiring 4040 and a wiring 4041. A counter electrode 4031 of the liquid crystal element 4011a is formed on the second substrate 4006. An area where the pixel electrode 4030, the counter electrode 4031, and the liquid crystal 4007a are overlapping with each other corresponds to the liquid crystal element 4011a. Reference numeral 4035 denotes a spherical spacer, which is provided for controlling a distance (cell gap) between the pixel electrode 4030 and the counter electrode 4031. A space which can be obtained by patterning an insulating film may be used instead. In addition, each signal and potential given to the signal line driver circuit 4003 formed separately, the scanning line driver circuit 4004, or the pixel portion 4002 are supplied from a connection terminal 4016 through lead wirings 4014 and 4015, which are not shown in a cross-sectional view of FIG. 12B.

In this example, the connection terminal 4016 is formed of the same conductive film as that of the pixel electrode 4030 of the liquid crystal element 4011a. In addition, the lead wiring 4014 is formed of the same conductive film as that of the wiring 4041. The lead wiring 4015 is formed of the same conductive film as that of the wiring 4040. The connection terminal 4016 is electrically connected with a terminal of a FPC 4018 through an anisotropic conductive film 4019.

Although not shown, a liquid crystal display device shown in this example may include an alignment film, a polarizing plate, a color filter, or a shielding film. This example can be arbitrarily combined with the above embodiments and examples.

EXAMPLE 7

Figure 13:
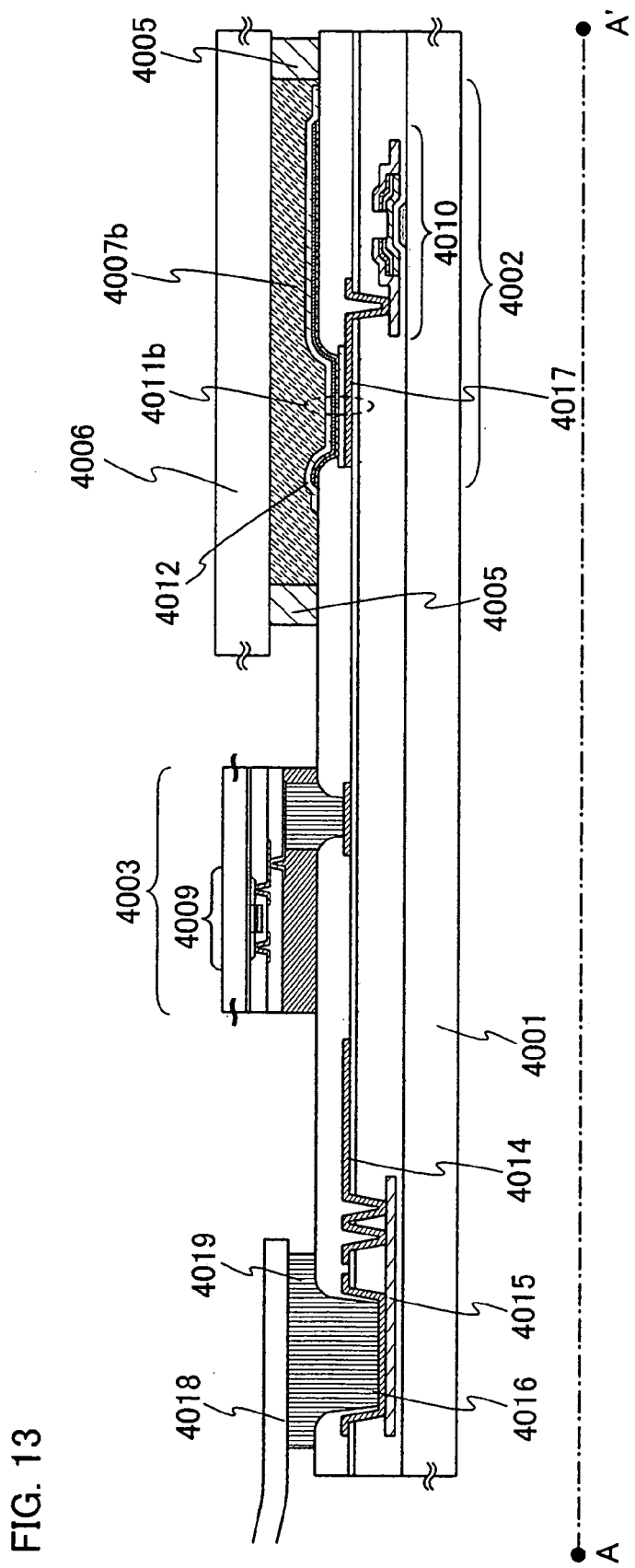
FIG. 13 is a cross-sectional view of a panel that is mode of a display device of the invention.

An appearance of a panel corresponding to mode of a display device of the present invention is described in this example with reference to FIG. 13. FIGS. 12A and 12B show top views of the panel in which a semi-amorphous transistor and a liquid crystal element formed over a first substrate are sealed between a second substrate with a sealant, and FIG. 13 corresponds to a cross-sectional view in A–A' of FIG. 12A.

There is a plurality of transistors in a pixel portion 4002 provided on a first substrate 4001 and a scanning line driver circuit. A transistor 4010 included in the pixel portion 4002 is shown in FIG. 13. The transistor 4010 corresponds to a transistor using a semi-amorphous semiconductor layer.

A pixel electrode of a light-emitting element 4011b is electrically connected with a drain of the transistor 4010 through a wiring 4017. Then, a counter electrode of the light-emitting element 4011b and a transparent conductive film 4012 are electrically connected. In a structure of the light-emitting element 4011b, a structure of the light-emitting element 4011b can be appropriately changed depending on a direction of light emitted from the light-emitting element 4011b, a conductivity type of the transistor 4010, or the like.

In addition, each signal and potential given to a signal line driver circuit 4003 formed separately and the scanning line driver circuit or the pixel portion 4002 are supplied from a connection terminal 4016 through lead wirings 4014 and 4015, which are not shown in a cross-sectional view of FIG. 13.

In this example, the connection terminal 4016 is formed of the same conductive film as that of a pixel electrode of the light-emitting element 4011b. In addition, the lead wiring 4014 is formed of the same conductive film as that of a wiring 4017. The lead wiring 4015 is formed of the same conductive film as that of a gate electrode of the transistor 4010. The connection terminal 4016 is electrically connected with a terminal of a FPC 4018 through an anisotropic conductive film 4019.

As a filler 4007b, besides inert gas such as nitrogen or argon, an ultraviolet curable resin or a heat curing resin can be used, for example PVC (polyvinyl chloride), acrylics, polyimide, an epoxy resin, a silicone resin, PVB (polyvinyl butyral) or EVA (ethylene vinyl acetate) can be used. Nitrogen is used as a filler in this example. In order to expose the filler 4007b to a hygroscopic material (preferably barium oxide) or to a material that can absorb oxygen, a depression is provided at a second substrate 4006 and a hygroscopic material or a material that can absorb oxygen may be provided in the depression. The second substrate 4006 has a configuration in which air or moisture is penetrated and a hygroscopic material or a material that can absorb oxygen is not penetrated when the second substrate 4006 is finely meshed. Deterioration of the light-emitting element 4011b can be suppressed by providing a hygroscopic material or a material that can absorb oxygen. This example can be arbitrarily combined with the above embodiments and examples.

EXAMPLE 8

An electronic device of the present invention includes a video camera, a digital camera, a goggle type display (head mounted display), a navigation system, an audio reproducing device (a car audio, an audio component, and the like), a laptop computer, a game machine, a portable information terminal (a mobile computer, a cellular phone, or the like), a device capable of reproducing a recording medium for an image reproducing device and that can display the image, a television device (referred to just as a television or as a television receiver, or the like. There is no need to provide a step of crystallization; therefore, comparably a large-sized panel can be easily made. Specific examples of these electronic devices are shown in FIGS. 14A to 14C.

Figure 14A:
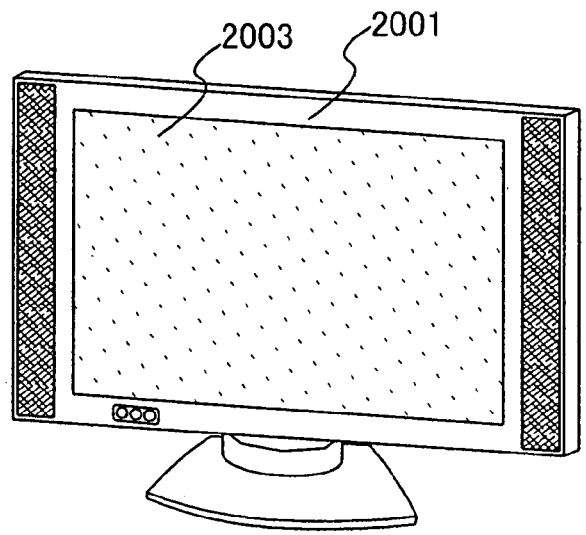
FIGS. 14A to 14C are views showing an electronic device in which the invention is applied.
Figure 14B:
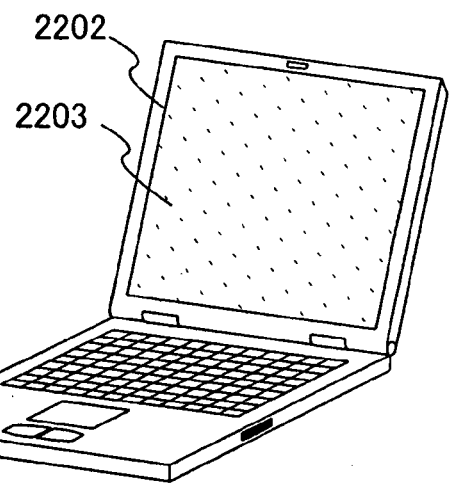
Figure 14C:
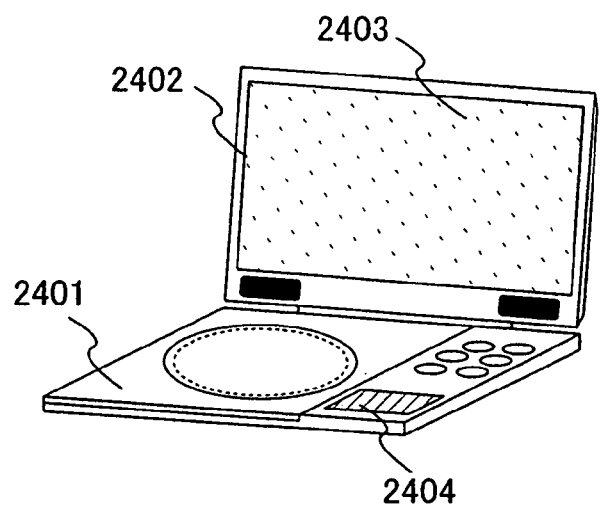

FIG. 14A shows a display device, which includes a chassis 2001, a display portion 2003, and the like. FIG. 14B shows a laptop computer, which includes a chassis 2202, display portion 2203, and the like. FIG. 14C shows a portable image reproducing device, which includes a main body 2401, a chassis 2402, a display portion A 2403, a display portion B 2404, and the like. The display portion A 2403 mainly displays image information whereas the display portion B 2404 mainly displays text information.

The invention can be applied to the display portions 2003, 2203, 2403, and 2404. In addition, the invention is not limited to the above electronic devices, of which applicable range is extremely wide, and can be applied to the electronic devices of every field. This example can be arbitrarily combined with the above embodiments and examples.

EXAMPLE 9

Figure 24:
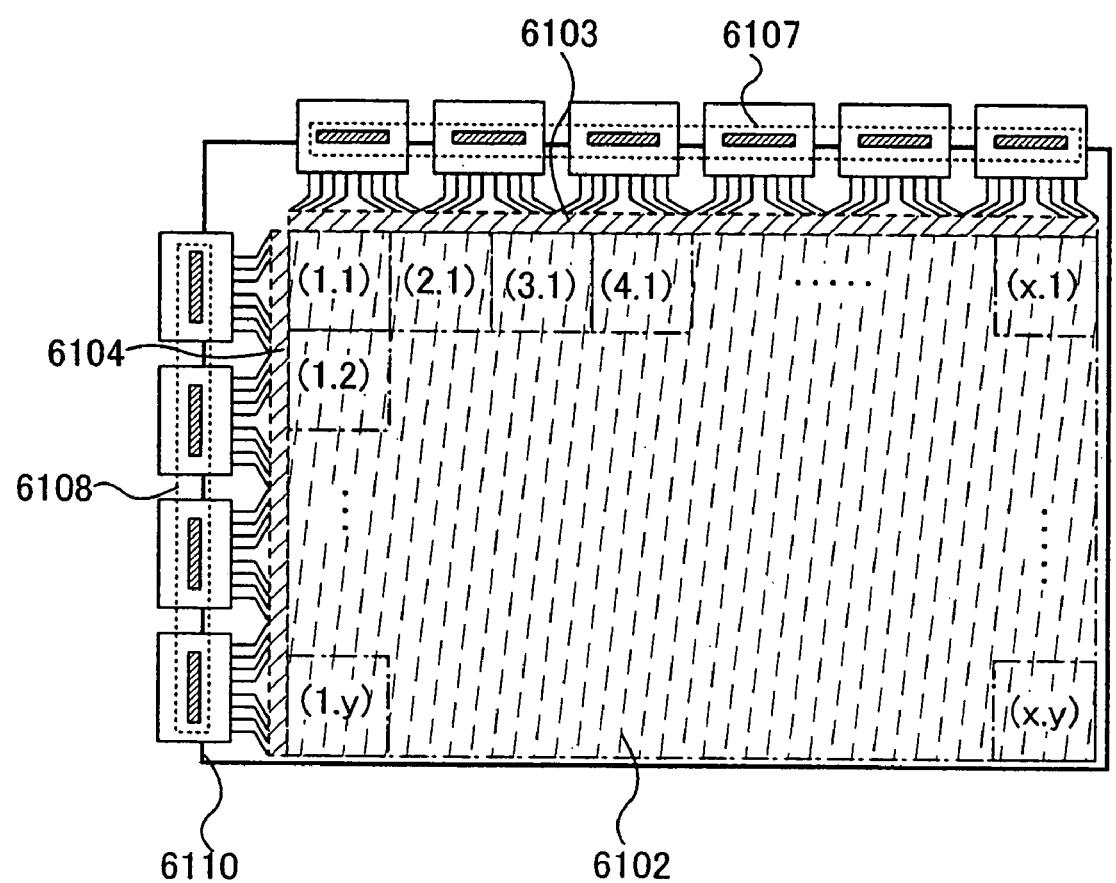
FIG. 24 is a view describing a display device of the invention.

A structure of a display device implementing the present invention is described with reference to FIG. 24. FIG. 24 is a top view schematically describing a top view of the display device, and a pixel portion (display portion) 6102, protective circuits 6103 and 6104 are provided on a substrate 6110, which are connected with a signal line driver IC 6107 and a scanning line driver IC 6108 through a lead wiring. When an amorphous semiconductor layer or a microcrystal semiconductor layer is used as an element composing the pixel portion 6102, as shown, the driver ICs 6107 and 6108 are mounted by a known method such as a COG or a TAB, and these driver ICs may be used for driver circuits. When a microcrystal semiconductor layer is used as an element composing the pixel portion 6102, a scanning line driver circuit may be composed of a microcrystal semiconductor layer and the driver IC 6107 may be mounted on a scanning line. As another structures than the above, a scanning line driver circuit and a signal line driver circuit are partly formed over one substrate and a driver IC may be used in place thereof. That is, there are various structures in mounting a driver IC, and the invention can apply any one of the structures. A lead wiring (not shown) that connects the pixel portion 6102, and the driver ICs 6107 and 6108 can be formed with a droplet discharge method.

Figure 25A:
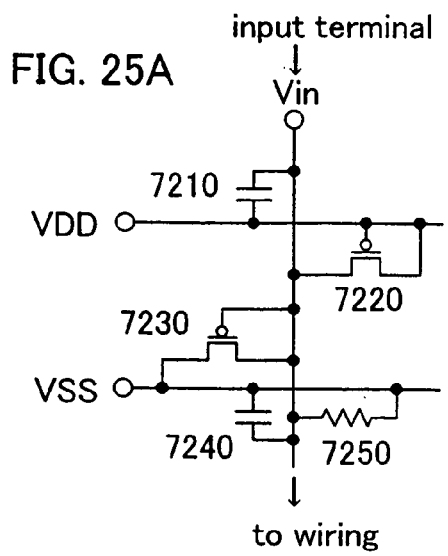
FIGS. 25A to 25E are views describing a protective circuit provided to a display device of the invention.

Next, an example of a protective circuit provided in the display device of the invention is described. The protective circuit is composed of one or more elements selected from a TFT, a diode, a resistor element, and a capacitor element, hereinafter a structure of some protective circuits and the operation are described. First, a structure of an equivalent circuit diagram of a protective circuit corresponding to one input terminal of a protective circuit disposed between an external circuit and an internal circuit is described with reference to FIGS. 25A to 25E. A protective circuit shown in FIG. 25A comprises a p-type TFT 7220, a p-type TFT 7230, a capacitor element 7210, a capacitor element 7240, and a resistor element 7250. The resistor element 7250 is resistance with two terminals, having an input voltage Vin (hereinafter, referred to as Vin) in one terminal and a low-side voltage VSS (hereinafter, referred to as VSS) in the other terminal. The resistor element 7250 is provided to set potential of a wiring at VSS when an input terminal does not have Vin, and the resistance is set at a higher value than wiring resistance of the wiring.

When a Vin is higher than a high-side voltage VDD (hereinafter, referred to as VDD), the p-type TFT 7220 is turned ON and the p-type TFT 7230 is turned OFF in relation to the voltage between the gate and the source. Accordingly, the VDD is given to a wiring through the p-type TFT 7220. Therefore, voltage given to the wiring does not exceed VDD even when a Vin exceeds a VDD due to noise or the like. On the other hand, when Vin is lower than VSS, the p-type TFT 7220 is turned OFF and the p-type TFT 7230 is turned ON in relation to the voltage between the gate and the source. Accordingly, a VSS is given to a wiring. Therefore, voltage given to a wiring does not exceed a VDD even when a Vin is lower than a VDD due to noise or the like. Furthermore, a sudden change due to voltage of an input terminal can be reduced to some extent.

In the disposition of the protective circuit with the above structure, voltage of a wiring is kept in a range between a VSS and a VDD, which is protected from the application of extremely low or high voltage without the range. Furthermore, a protective circuit is provided to an input terminal to which a signal is inputted so that voltage of all wiring that is provided with a signal can be kept at a constant (here, refers to a VSS) voltage value when a signal is not inputted. Therefore, electrostatic discharge damage due to voltage difference between wirings can be prevented. In addition, when a signal is inputted, a signal given to a wiring is not drawn to a VSS since resistance of the resistor element 7250 is high enough.

Figure 25B:
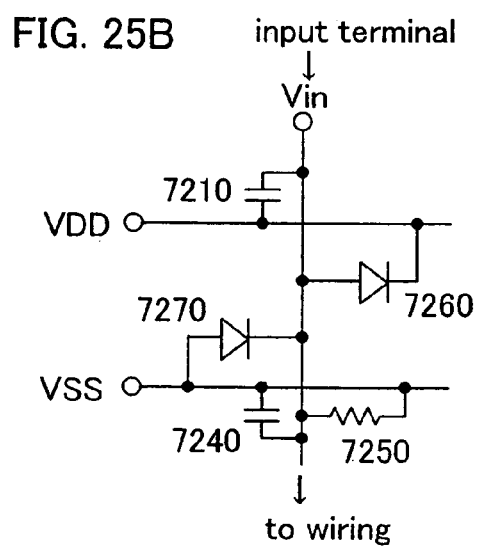
Figure 25C:
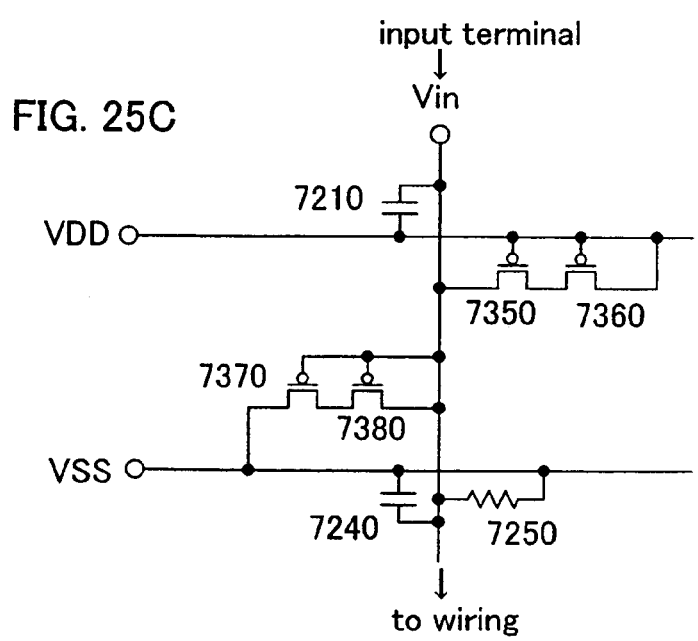
Figure 25D:
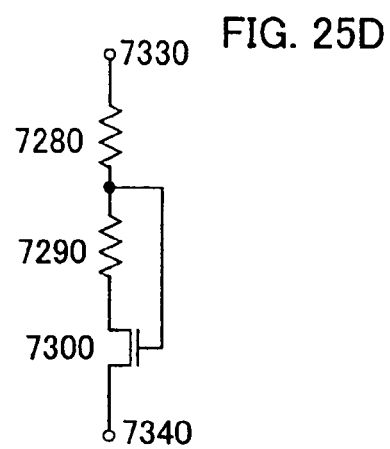
Figure 25E:
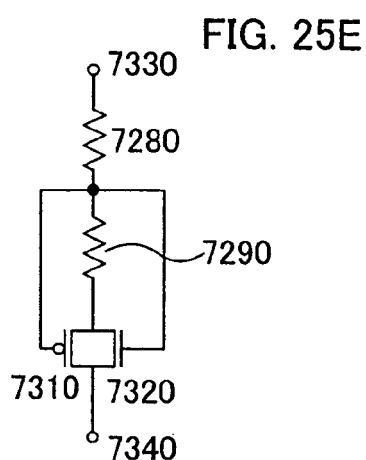

A protective circuit shown in FIG. 25B is an equivalent circuit diagram in which the p-type TFT 7220 and the p-type TFT 7230 are replaced by diodes 7260 and 7270 having rectification. A protective circuit shown in FIG. 25C is an equivalent circuit diagram in which the p-type TFT 7220 and the p-type TFT 7230 are replaced by a TFT 7350, a TFT 7360, a TFT 7370, and a TFT 7380. As another structures than the above, a protective circuit shown in FIG. 25D comprises a resistor element 7280, a resistor element 7290, and a n-type TFT 7300. A protective circuit shown in FIG. 25E comprises resistor elements 7280, 7290, and a p-type TFT 7310 and an n-type TFT 7320. In both structures of FIGS. 25D and 25E, a wiring or the like is connected to a terminal 7330. When potential of this wiring or the like is changed suddenly, the n-type TFT 7300 or the p-type TFT 7310 and the n-type TFT 7320 is turned ON so that current is flown in a direction from the terminals 7330 to 7340. Accordingly, sudden change of potential connected to the terminal 7330 is alleviated so that damage or destruction of an element can be prevented. The element composing the above protective circuit is preferably formed with an amorphous semiconductor layer which fully in withstand pressure. This example can be arbitrarily combined with the above embodiments and examples.

What is claimed is:

1. A method for manufacturing a semiconductor device comprising:
    forming a gate electrode with a droplet discharge method on a substrate having an insulating surface;
    laminating a gate insulating layer, a first semiconductor layer, and a second semiconductor layer containing one-conductivity type impurity over the gate electrode;
    forming a first conductive layer serving as a mask with the droplet discharge method in a position overlapping the gate electrode;
    etching the first semiconductor layer and the second semiconductor layer containing one-conductivity type impurity by using the first conductive layer;
    forming a second conductive layer serving as a source wiring or a drain wiring with the droplet discharge method over the first conductive layer; and
    etching the first conductive layer and the second semiconductor layer containing one-conductivity type impurity by using the second conductive layer as mask.

2. A method for manufacturing a semiconductor device according to claim 1, wherein the gate electrode is formed by a droplet discharge method using a material containing silver, gold, or copper.

3. A method for manufacturing a semiconductor device according to claim 1, wherein the gate insulating layer is formed by sequentially laminating a silicon nitride film and a silicon oxide film.

4. A method for manufacturing a semiconductor device according to claim 1, wherein the gate insulating layer is formed by sequentially laminating a first silicon nitride film, a silicon oxide film, and a second silicon nitride layer.

5. A method for manufacturing a semiconductor device according to claim 1, wherein the first semiconductor layer is formed by plasma CVD using gas diluted silicide gas with a rare gas element.

6. A method for manufacturing a semiconductor device according to claim 1, wherein the first semiconductor layer is formed with plasma CVD by using gas mixed one or both of carbide gas and germanium gas into silicide gas.

7. A method for manufacturing a semiconductor device according to claim 1, wherein the first semiconductor layer is formed so that an oxygen concentration is $5 \times 10^{19}$ atoms/cm$^3$ or less, preferably $1 \times 10^{19}$ atoms/cm$^3$ or less.

8. A method for manufacturing a semiconductor device according to claim 1, wherein the semiconductor device is incorporated into an electronic device selected from the group consisting of a display device, a computer, and a potable image reproduction device.

9. A method for manufacturing a semiconductor device comprising:
    forming a gate electrode with a droplet discharge method on a substrate having an insulating surface;
    laminating a gate insulating layer and a first semiconductor layer over the gate electrode;
    forming a first mask with the droplet discharge method in a position overlapping the gate electrode;
    forming a second semiconductor layer by etching the first semiconductor layer by using the first mask;
    forming an insulating layer over the second semiconductor layer;
    forming a second mask with the droplet discharge method over the insulating layer;
    forming a channel protective layer by etching the insulating layer by using the second mask;
    forming a third semiconductor layer containing one-conductivity type impurity on the second semiconductor layer;
    forming a conductive layer serving as a source wiring or a drain wiring with the droplet discharge method over the third semiconductor layer containing one-conductivity type impurity; and
    etching the third semiconductor layer containing one-conductivity type impurity by using the conductive layer as a mask.

10. A method for manufacturing a semiconductor device according to claim 9, wherein the gate electrode is formed by a droplet discharge method using a material containing silver, gold, or copper.

11. A method for manufacturing a semiconductor device according to claim 9, wherein the gate insulating layer is formed by sequentially laminating a silicon nitride film and a silicon oxide film.

12. A method for manufacturing a semiconductor device according to claim 9, wherein the gate insulating layer is formed by sequentially laminating a first silicon nitride film, a silicon oxide film, and a second silicon nitride layer.

13. A method for manufacturing a semiconductor device according to claim 9, wherein the first semiconductor layer is formed by plasma CVD using gas diluted silicide gas with a rare gas element.

14. A method for manufacturing a semiconductor device according to claim 9, wherein the first semiconductor layer is formed with plasma CVD by using gas mixed one or both of carbide gas and germanium gas into silicide gas.

15. A method for manufacturing a semiconductor device according to claim 9, wherein the first semiconductor layer is formed so that an oxygen concentration is $5 \times 10^{19}$ atoms/$cm^3$ or less, preferably $1 \times 10^{19}$ atoms/$cm^3$ or less.

16. A method for manufacturing a semiconductor device according to claim 9, wherein the semiconductor device is incorporated into an electronic device selected from the group consisting of a display device, a computer, and a potable image reproduction device.

17. A method for manufacturing a semiconductor device comprising:
    forming a gate electrode with a droplet discharge method on a substrate having an insulating surface;
    laminating a gate insulating layer, a first semiconductor layer, and a second semiconductor layer containing one-conductivity type impurity over the gate electrode;
    forming a mask with the droplet discharge method in a position overlapping the gate electrode;
    forming a third semiconductor layer and a fourth semiconductor layer containing one-conductivity type impurity by etching the first semiconductor layer and the second semiconductor layer containing one-conductivity type impurity by using the mask;
    forming a conductive layer serving as a source wiring or a drain wiring with the droplet discharge method over the fourth semiconductor layer containing one-conductivity type impurity; and
    etching the fourth semiconductor layer containing one-conductivity type impurity by using the conductive layer as a mask.

18. A method for manufacturing a semiconductor device according to claim 17, wherein the gate electrode is formed by a droplet discharge method using a material containing silver, gold, or copper.

19. A method for manufacturing a semiconductor device according to claim 17, wherein the gate insulating layer is formed by sequentially laminating a silicon nitride film and a silicon oxide film.

20. A method for manufacturing a semiconductor device according to claim 17, wherein the gate insulating layer is formed by sequentially laminating a first silicon nitride film, a silicon oxide film, and a second silicon nitride layer.

21. A method for manufacturing a semiconductor device according to claim 17, wherein the first semiconductor layer is formed by plasma CVD using gas diluted silicide gas with a rare gas element.

22. A method for manufacturing a semiconductor device according to claim 17, wherein the first semiconductor layer is formed with plasma CVD by using gas mixed one or both of carbide gas and germanium gas into silicide gas.

23. A method for manufacturing a semiconductor device according to claim 17, wherein the first semiconductor layer is formed so that an oxygen concentration is $5 \times 10^{19}$ atoms/$cm^3$ or less, preferably $1 \times 10^{19}$ atoms/$cm^3$ or less.

24. A method for manufacturing a semiconductor device according to claim 17, wherein the semiconductor device is incorporated into an electronic device sselected from the group consisting of a display device, a computer, and a potable image reproduction device.

25. A method for manufacturing a semiconductor device comprising:
    forming a gate electrode with a droplet discharge method on a substrate having an insulating surface;
    laminating a gate insulating layer, a first semiconductor layer, and an insulating layer;
    forming a first mask with the droplet discharge method in a position overlapping with the gate electrode;
    forming a channel protective layer by etching the insulating layer with the first mask;
    forming a second semiconductor layer containing one-conductivity type impurity over the first semiconductor layer;
    forming a second mask with the droplet discharge method in a position overlapping with the channel protective layer;
    forming a third semiconductor layer containing one-conductivity type impurity by etching the second semiconductor layer containing one-conductivity type impurity by using the second mask;
    forming a conductive layer serving as a source wiring or a drain wiring with the droplet discharge method over the third semiconductor layer containing one-conductivity type impurity; and
    etching the third semiconductor layer containing one-conductivity type impurity by using the conductive layer as a mask.

26. A method for manufacturing a semiconductor device according to claim 25, wherein the gate electrode is formed by a droplet discharge method using a material containing silver, gold, or copper.

27. A method for manufacturing a semiconductor device according to claim 25, wherein the gate insulating layer is formed by sequentially laminating a silicon nitride film and a silicon oxide film.

28. A method for manufacturing a semiconductor device according to claim 25, wherein the gate insulating layer is formed by sequentially laminating a first silicon nitride film, a silicon oxide film, and a second silicon nitride layer.

29. A method for manufacturing a semiconductor device according to claim 25, wherein the first semiconductor layer is formed by plasma CVD using gas diluted silicide gas with a rare gas element.

30. A method for manufacturing a semiconductor device according to claim 25, wherein the first semiconductor layer is formed with plasma CVD by using gas mixed one or both of carbide gas and germanium gas into silicide gas.

31. A method for manufacturing a semiconductor device according to claim 25, wherein the first semiconductor layer is formed so that an oxygen concentration is $5 \times 10^{19}$ atoms/$cm^3$ or less, preferably $1 \times 10^{19}$ atoms/$cm^3$ or less.

32. A method for manufacturing a semiconductor device according to claim 25, wherein the semiconductor device is incorporated into an electronic device selected from the group consisting of a display device, a computer, and a potable image reproduction device.

* * * * *